US011751378B2

(12) United States Patent
Choi et al.

(10) Patent No.: US 11,751,378 B2
(45) Date of Patent: Sep. 5, 2023

(54) SEMICONDUCTOR MEMORY DEVICE

(71) Applicant: Samsung Electronics Co., Ltd., Suwon-si (KR)

(72) Inventors: Hyungeun Choi, Suwon-si (KR); Kiseok Lee, Hwaseong-si (KR); Seungjae Jung, Suwon-si (KR); Joongchan Shin, Seoul (KR); Taehyun An, Seoul (KR); Moonyoung Jeong, Suwon-si (KR); Sangyeon Han, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 21 days.

(21) Appl. No.: 17/369,320

(22) Filed: Jul. 7, 2021

(65) Prior Publication Data
US 2022/0173106 A1 Jun. 2, 2022

(30) Foreign Application Priority Data
Dec. 2, 2020 (KR) ........................ 10-2020-0166970

(51) Int. Cl.
*H10B 12/00* (2023.01)
*H01L 29/08* (2006.01)
(52) U.S. Cl.
CPC ......... *H10B 12/30* (2023.02); *H01L 29/0847* (2013.01); *H10B 12/03* (2023.02); *H10B 12/05* (2023.02)
(58) Field of Classification Search
None
See application file for complete search history.

(56) References Cited

U.S. PATENT DOCUMENTS 6,198,114 B1 * 3/2001 Blanchard ......... H01L 29/66651
257/E21.426
6,746,911 B2 6/2004 Han
(Continued)

FOREIGN PATENT DOCUMENTS

| KR | 10-2019-0038223 A | 4/2019 |
| TW | 200847425 A | 12/2008 |
| TW | 201926571 A | 7/2019 |

OTHER PUBLICATIONS

TW Office Action for corresponding Taiwanese Patent Application No. 110136900 dated Oct. 4, 2022.

*Primary Examiner* — Nicholas J Tobergte
*Assistant Examiner* — Kevin Quinto
(74) *Attorney, Agent, or Firm* — Harness, Dickey & Pierce, P.L.C.

(57) ABSTRACT

A semiconductor memory device includes: a bit line extending on a substrate in a vertical direction; a transistor body part including a first source-drain region, a monocrystalline channel layer, and a second source-drain region that are sequentially arranged in a first horizontal direction and connected to the bit line; gate electrode layers extending in a second horizontal direction that is orthogonal to the first horizontal direction, with a gate dielectric layer between the gate electrode layers and the monocrystalline channel layer, and covering upper and lower surfaces of the monocrystalline channel layer; and a cell capacitor including a lower electrode layer, a capacitor dielectric layer, and an upper electrode layer at a side of the transistor body that is opposite to the bit line in the first horizontal direction and is connected to the second source-drain region.

20 Claims, 47 Drawing Sheets

(56) References Cited

U.S. PATENT DOCUMENTS

| | | | |
|---|---|---|---|
| 9,406,652 B2 | 8/2016 | Ahn et al. | |
| 9,514,792 B2 | 12/2016 | Kajigaya | |
| 9,754,667 B2 | 9/2017 | Alsmeier | |
| 10,468,414 B2 | 11/2019 | Kim et al. | |
| 10,692,869 B2 | 6/2020 | Takemura et al. | |
| 11,094,699 B1* | 8/2021 | Brewer | H01L 27/10873 |
| 2016/0087006 A1 | 3/2016 | Park | |
| 2017/0053906 A1 | 2/2017 | Or-Bach et al. | |
| 2018/0254341 A1 | 9/2018 | Suk et al. | |
| 2018/0350983 A1 | 12/2018 | Chung et al. | |
| 2020/0365605 A1 | 11/2020 | Kim et al. | |
| 2021/0159229 A1* | 5/2021 | Gomes | H01L 29/66439 |

* cited by examiner

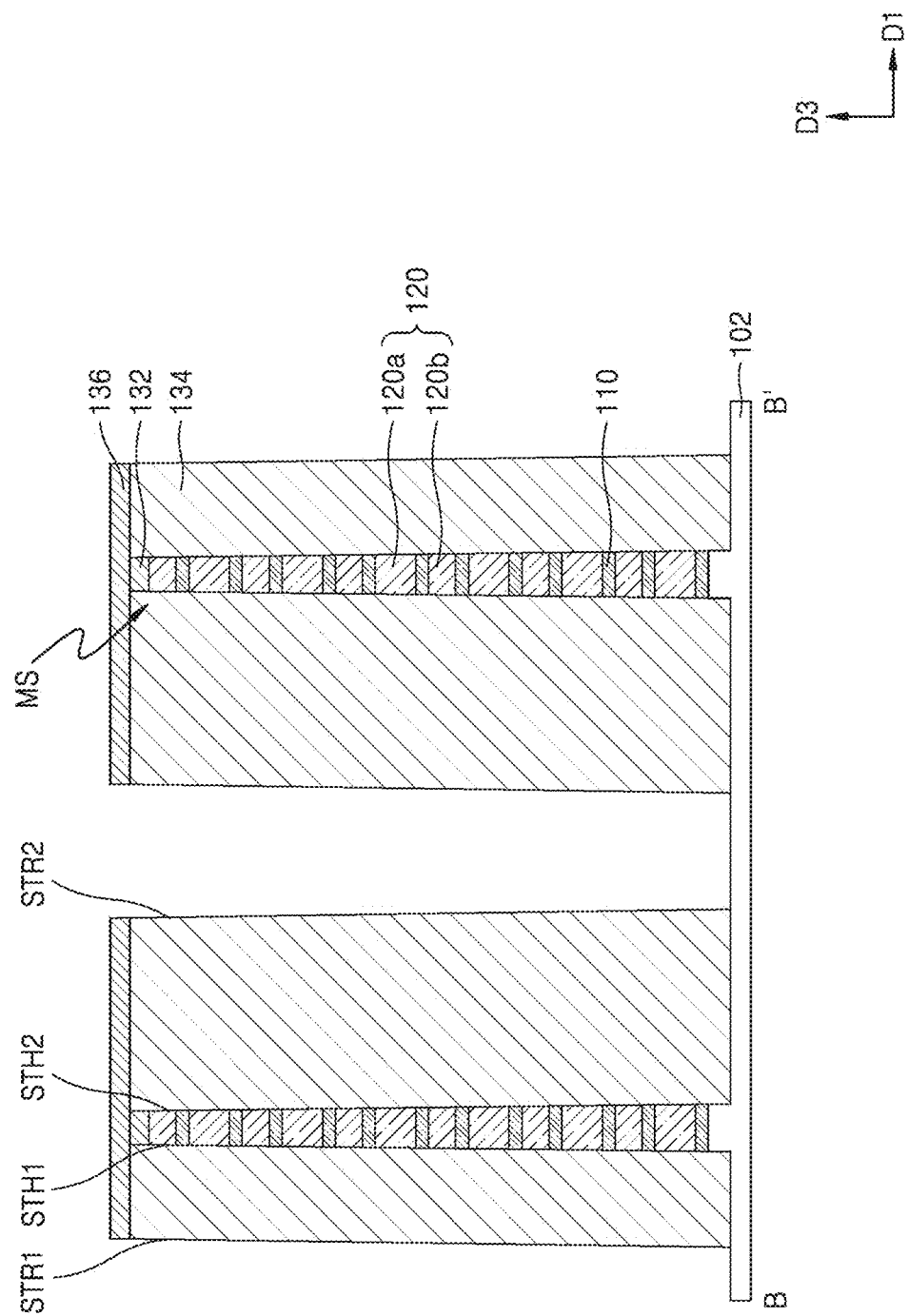

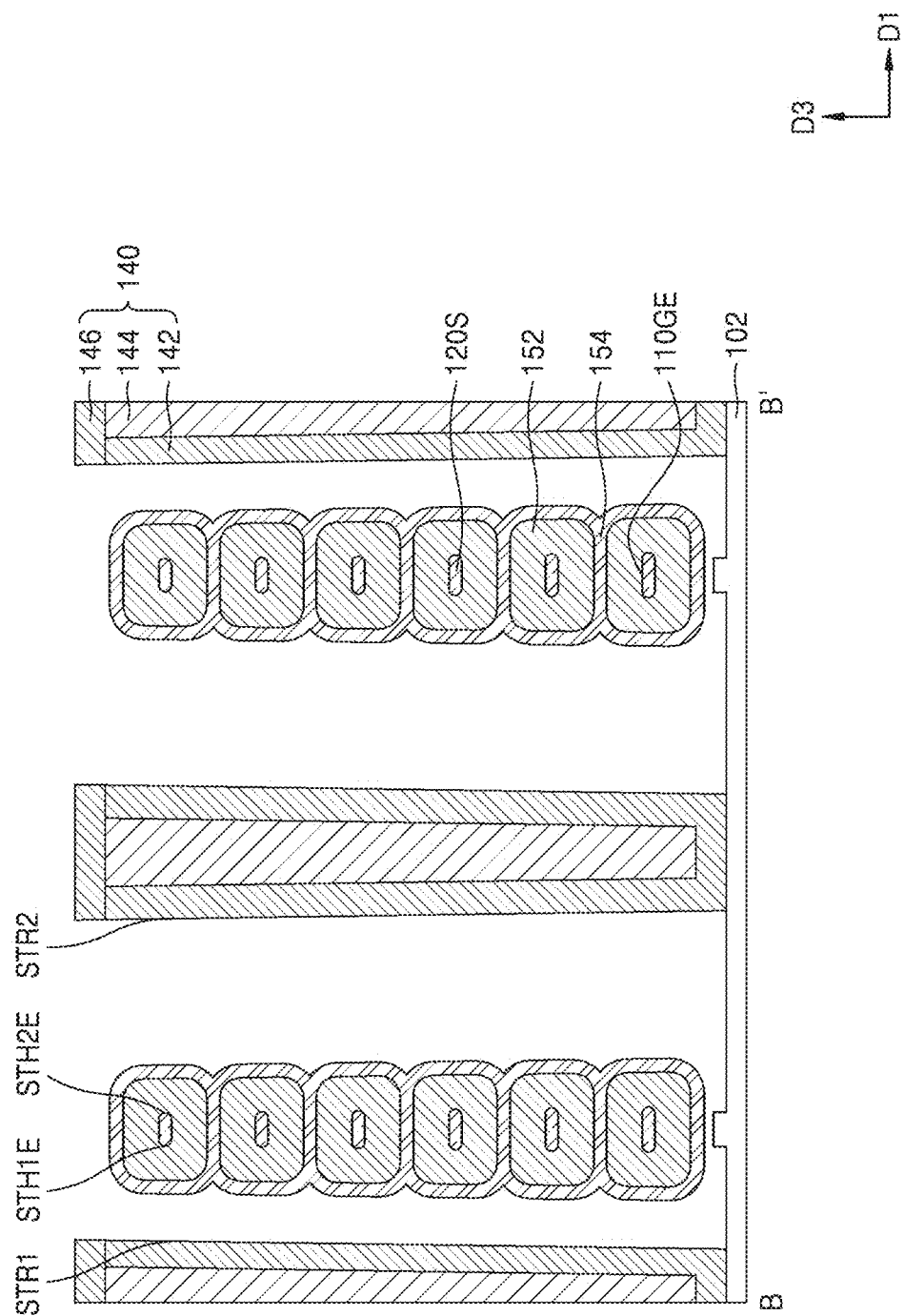

SEMICONDUCTOR MEMORY DEVICE

CROSS-REFERENCE TO RELATED APPLICATION

This application is based on and claims priority under 35 U.S.C. § 119 to Korean Patent Application No. 10-2020-0166970, filed on Dec. 2, 2020, in the Korean Intellectual Property Office, the disclosure of which is incorporated by reference herein in its entirety.

BACKGROUND

Inventive concepts relate to a semiconductor memory device, and particularly, to a three-dimensional semiconductor memory device.

The demand/desire for the miniaturization, multi-function, and/or high-performance of electronic products causes the demand for high-capacity semiconductor memory devices. To provide the high-capacity semiconductor memory devices, an increased degree of integration is demanded/desired. Because a degree of integration of existing two-dimensional semiconductor memory devices may mainly be determined by an area occupied by a unit memory cell, the degree of integration of two-dimensional semiconductor memory devices has been increasing, but is still limited. Accordingly, a three-dimensional semiconductor memory device has been proposed to increase a memory capacity by stacking a plurality of memory cells on a substrate in a vertical direction.

SUMMARY

Inventive concepts provide a three-dimensional semiconductor memory device having an improved degree of integration.

To this end, inventive concepts provide following semiconductor memory devices.

According to some example embodiments of inventive concepts, there is provided a semiconductor memory device including a bit line on a substrate, the bit line extending in a vertical direction, a transistor body comprising a first source-drain region, a monocrystalline channel layer, and a second source-drain region, the first source-drain region, the monocrystalline channel layer, and the second source-drain region sequentially arranged in a first horizontal direction, the transistor body connected to the bit line, gate electrode layers extending in a second horizontal direction orthogonal to the first horizontal direction; with a gate dielectric layer between the gate electrode layers and a portion of the transistor body, the gate dielectric layer covering upper surfaces and lower surfaces of the monocrystalline channel layer, and a cell capacitor at a side of the transistor body that is opposite to the bit line in the first horizontal direction, the cell capacitor connected to the second source-drain region, the cell capacitor comprising a lower electrode layer, a capacitor dielectric layer, and upper electrode layers.

According to some example embodiments of inventive concepts, there is provided a semiconductor memory device including a plurality of transistor bodies apart from each other on a substrate in a vertical direction, the plurality of transistor bodies extending in parallel to each other in a first horizontal direction, the plurality of transistor bodies comprising a first source-drain region, a monocrystalline channel layer, and a second source-drain region that are sequentially arranged in the first horizontal direction, the plurality of transistor bodies having an extension of a planar shape convexly protruding in a second horizontal direction orthogonal to the first horizontal direction, a plurality of bit lines apart from each other on the substrate in the second horizontal direction, the plurality of bit lines extending in parallel to each other in the vertical direction, the plurality of bit lines connected to the first source-drain regions of the plurality of transistor bodies, a plurality of gate electrode layers apart from each other in the vertical direction, extending in parallel to each other in the second horizontal direction, a gate dielectric layer between the plurality of gate electrode layers and the monocrystalline channel layers, the gate dielectric layer covering at least upper and lower surfaces of the monocrystalline channel layers of the plurality of transistor bodies, and a plurality of cell capacitors connected to the second source-drain regions of the plurality of transistor bodies and comprising a lower electrode layer, a capacitor dielectric layer, and an upper electrode layer.

According to some example embodiments of inventive concepts, there is provided a semiconductor memory device including a plurality of transistor bodies on a substrate apart from each other in a vertical direction, extending parallel to each other in a first horizontal direction, comprising a first source-drain region, a monocrystalline channel layer including monocrystalline silicon (Si), and a second source-drain region, the first source-drain region, the monocrystalline channel layer, and the second source-drain region sequentially arranged in the first horizontal direction, the plurality of transistor bodies having an extension part which has a planar shape convexly protruding in a second horizontal direction that is orthogonal to the first horizontal direction, a portion of the extension part includes a portion of the monocrystalline channel layer, a plurality of bit lines apart from each other on the substrate in the second horizontal direction, extending in parallel to each other in the vertical direction, and connected to the first source-drain regions of the plurality of transistor bodies, a plurality of gate electrode layers apart from each other in the vertical direction, extending in parallel to each other in the second horizontal direction, a gate dielectric layer between the plurality of gate electrode layers and the monocrystalline channel layers, the gate dielectric layer respectively covering at least upper and lower surfaces of the monocrystalline channel layers, and a plurality of cell capacitors connected to the second source-drain regions of the plurality of transistor bodies, and comprising a plurality of lower electrode layers having a hollow cylindrical shape in the first horizontal direction with a closed part facing the second source-drain region and an open part facing a direction that is opposite to the second source-drain region, upper electrode layers covering the plurality of lower electrode layers, and capacitor dielectric layers between the plurality of lower electrode layers and the upper electrode layers.

BRIEF DESCRIPTION OF THE DRAWINGS

Embodiments of inventive concepts will be more clearly understood from the following detailed description taken in conjunction with the accompanying drawings in which.

DETAILED DESCRIPTION OF SOME EXAMPLE EMBODIMENTS

Figure 6A:
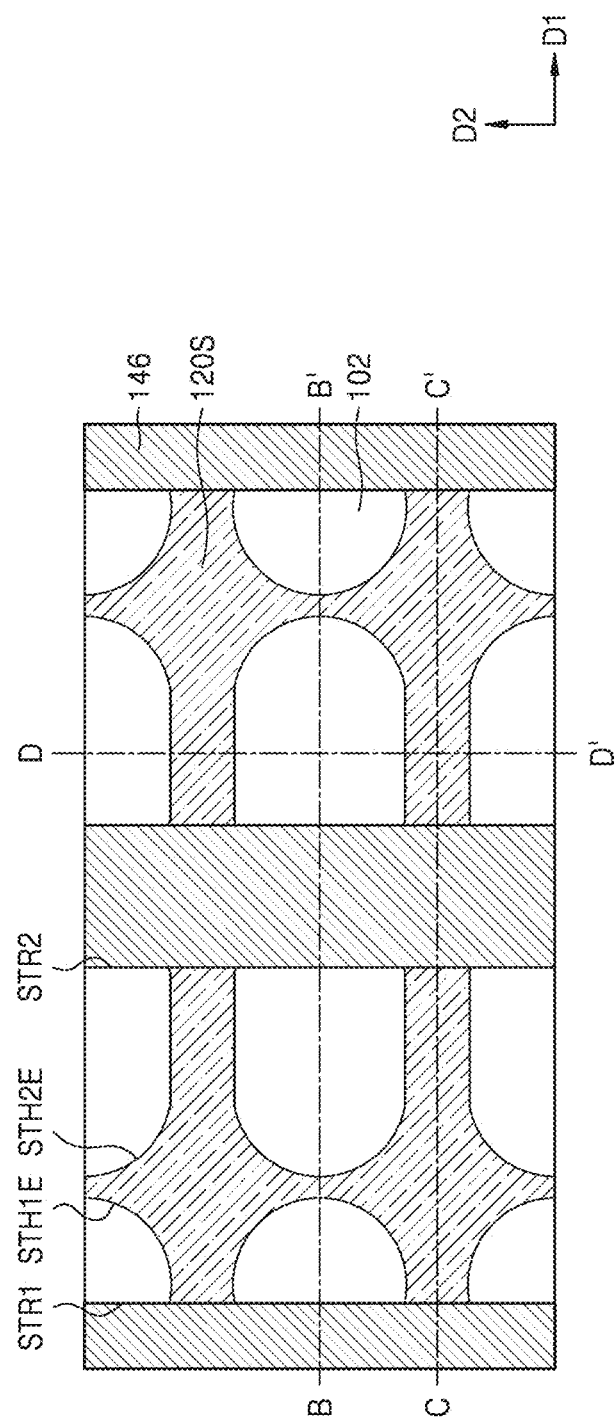
Figure 6B:
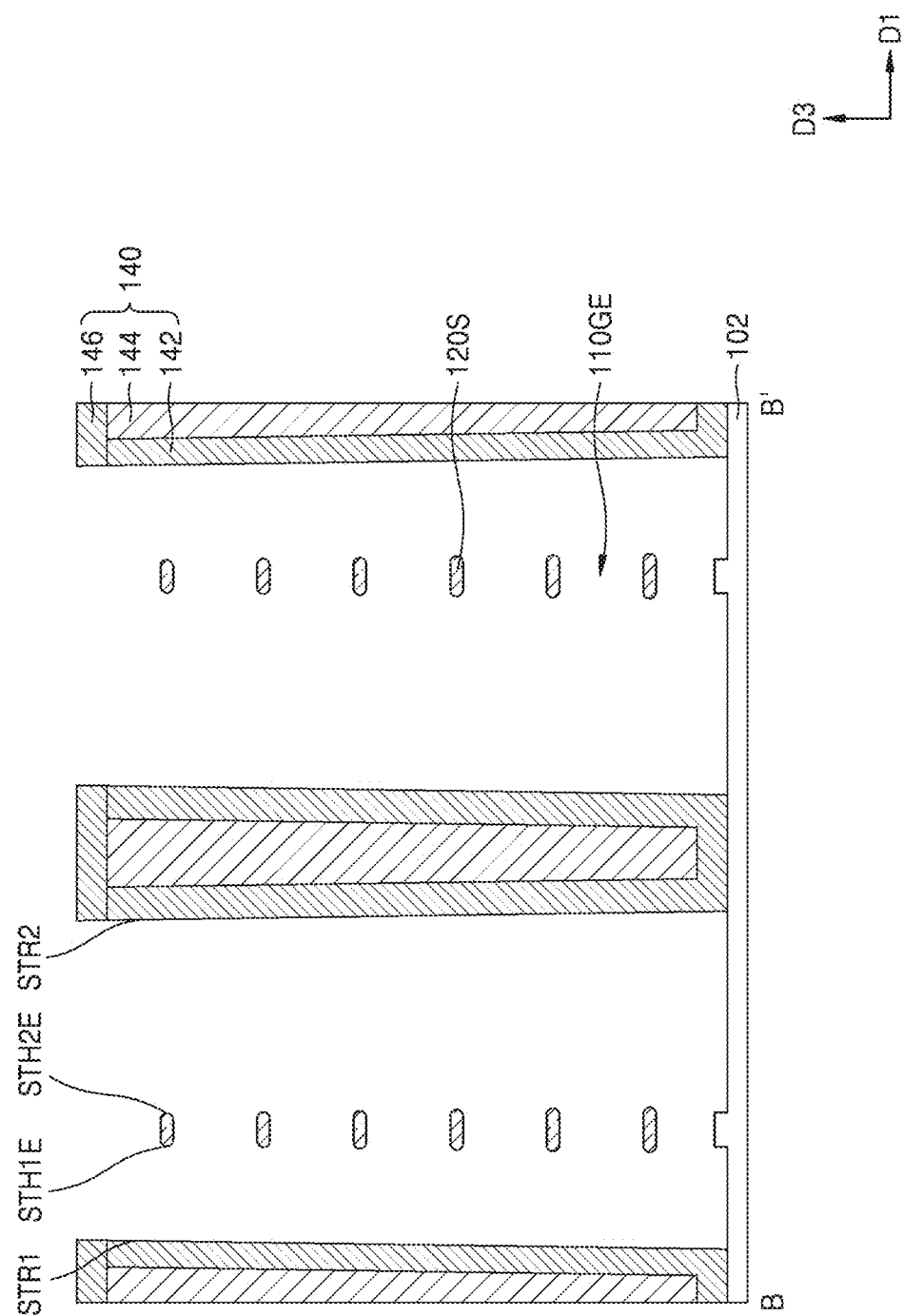
Figure 6C:
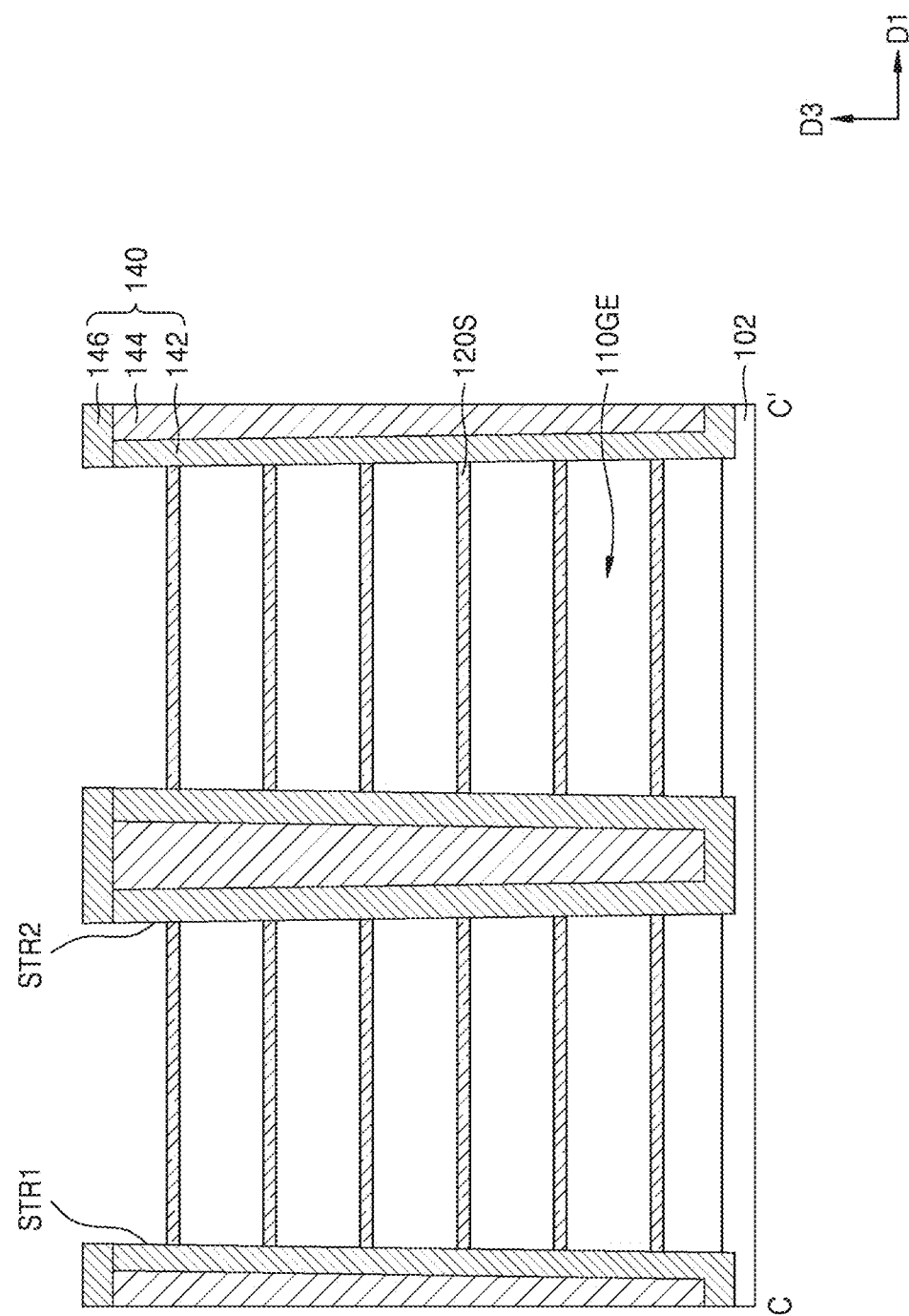
Figure 6D:
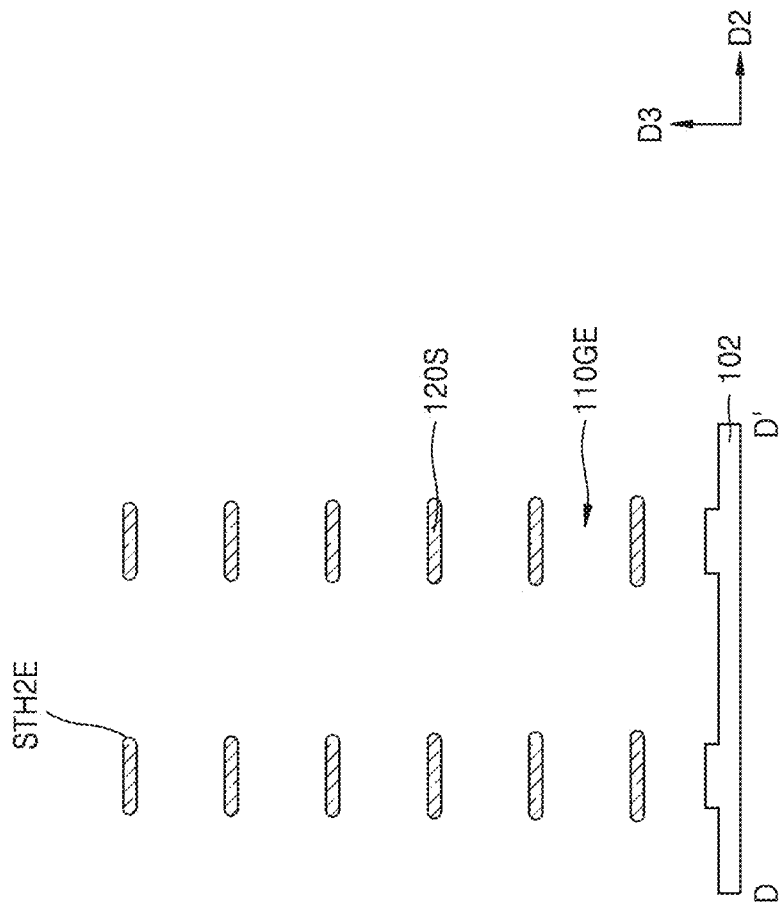
Figure 7B:
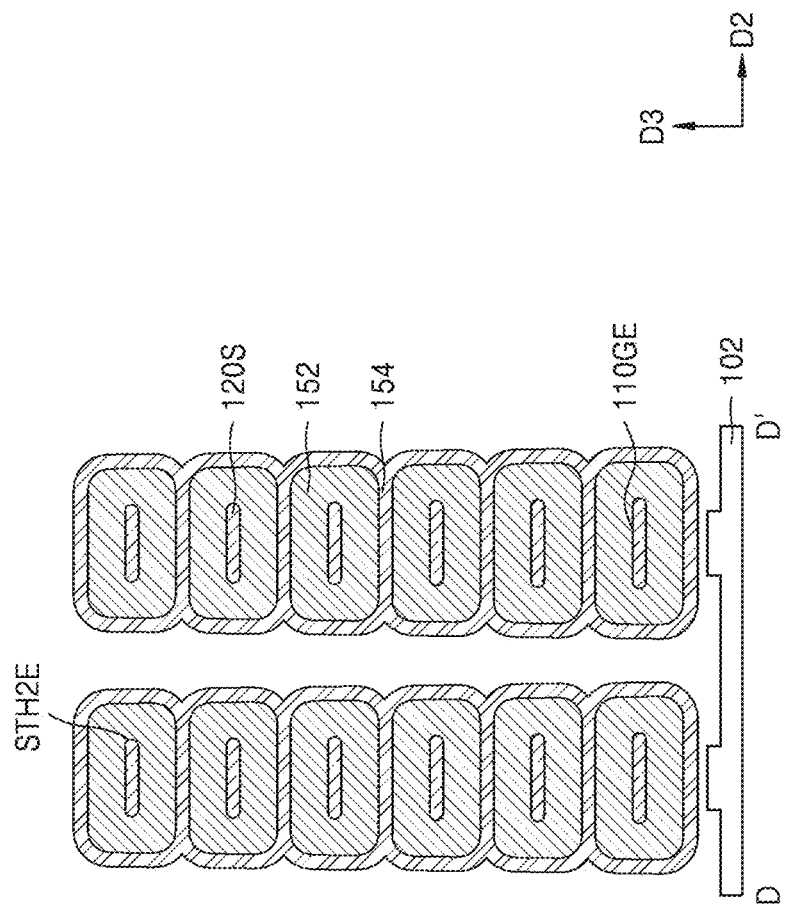
Figure 8A:
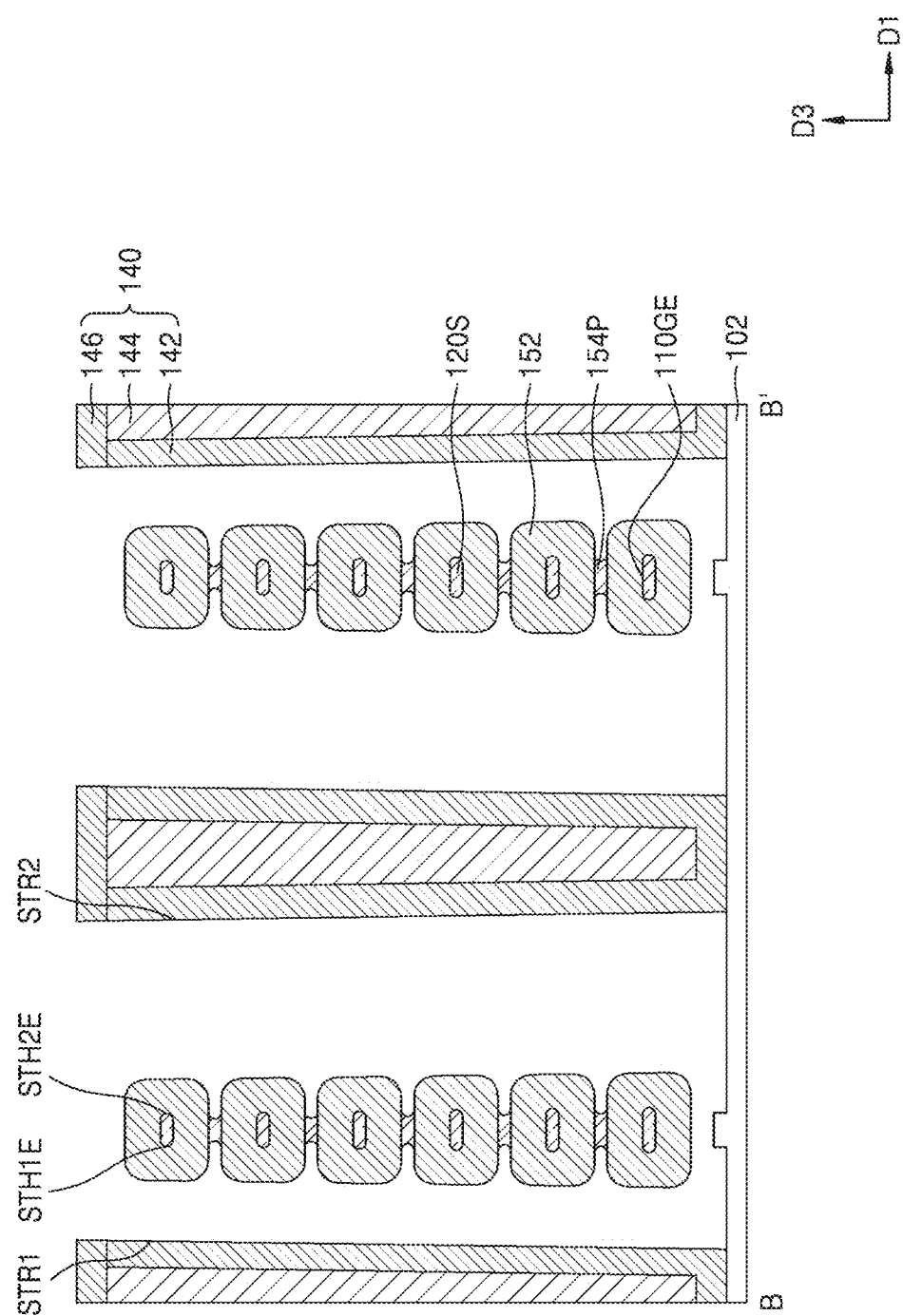
Figure 8B:
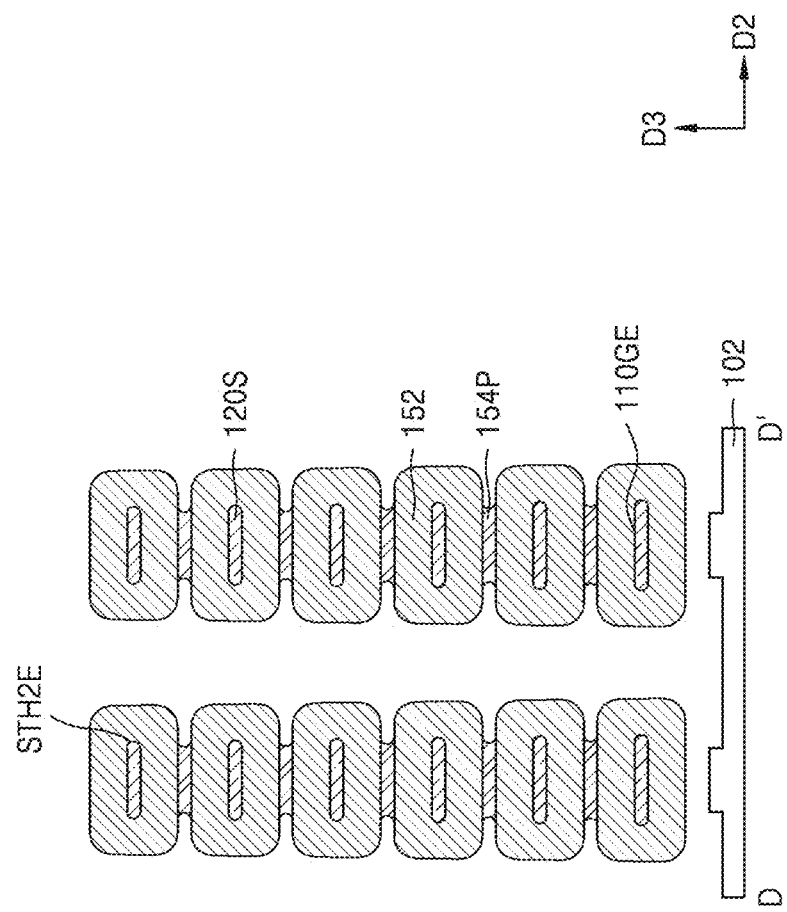
Figure 9A:
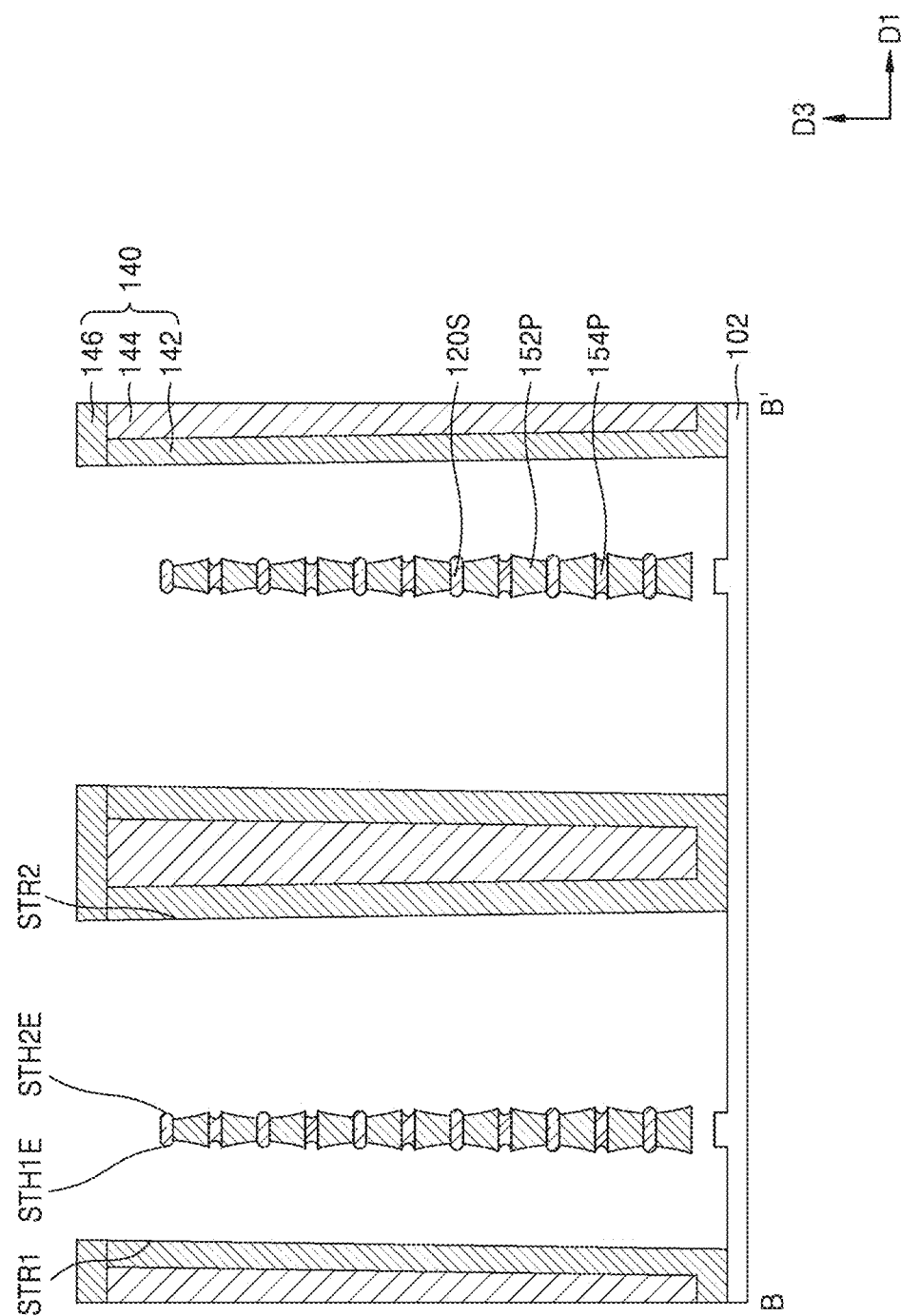
Figure 9B:
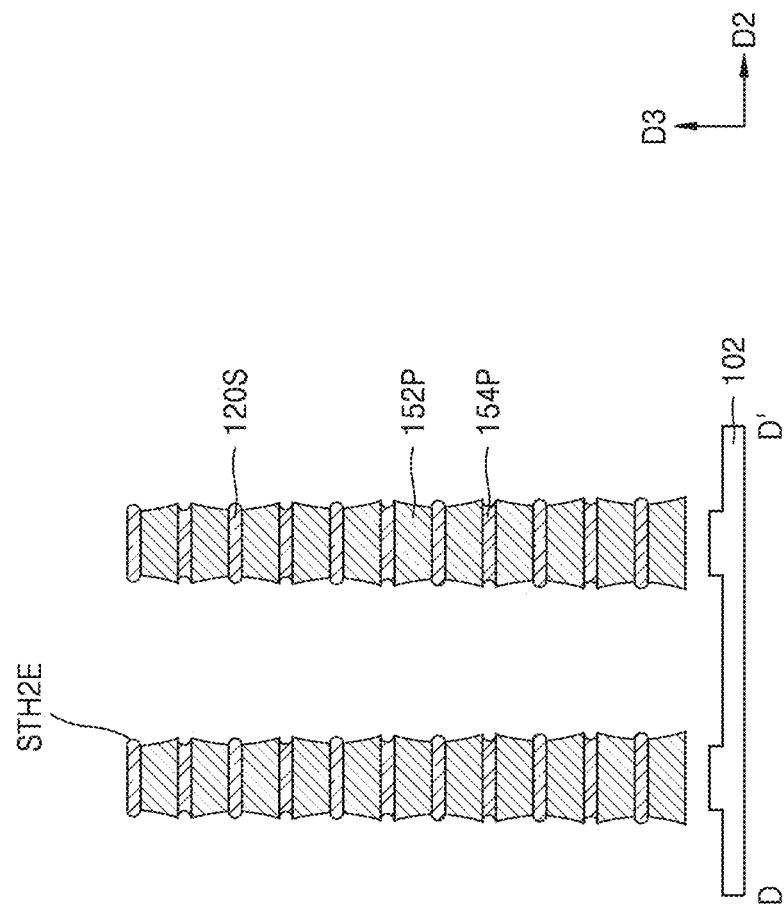
Figure 10A:
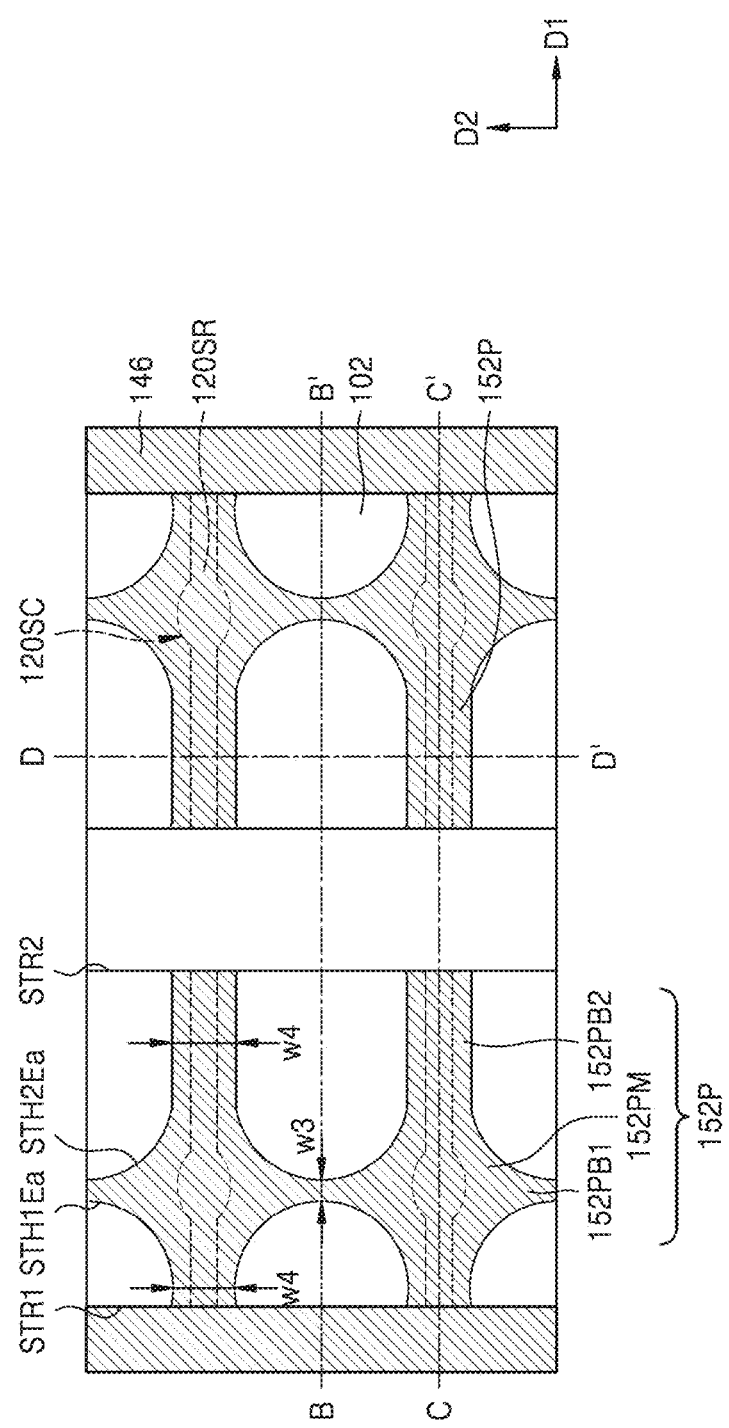
Figure 10B:
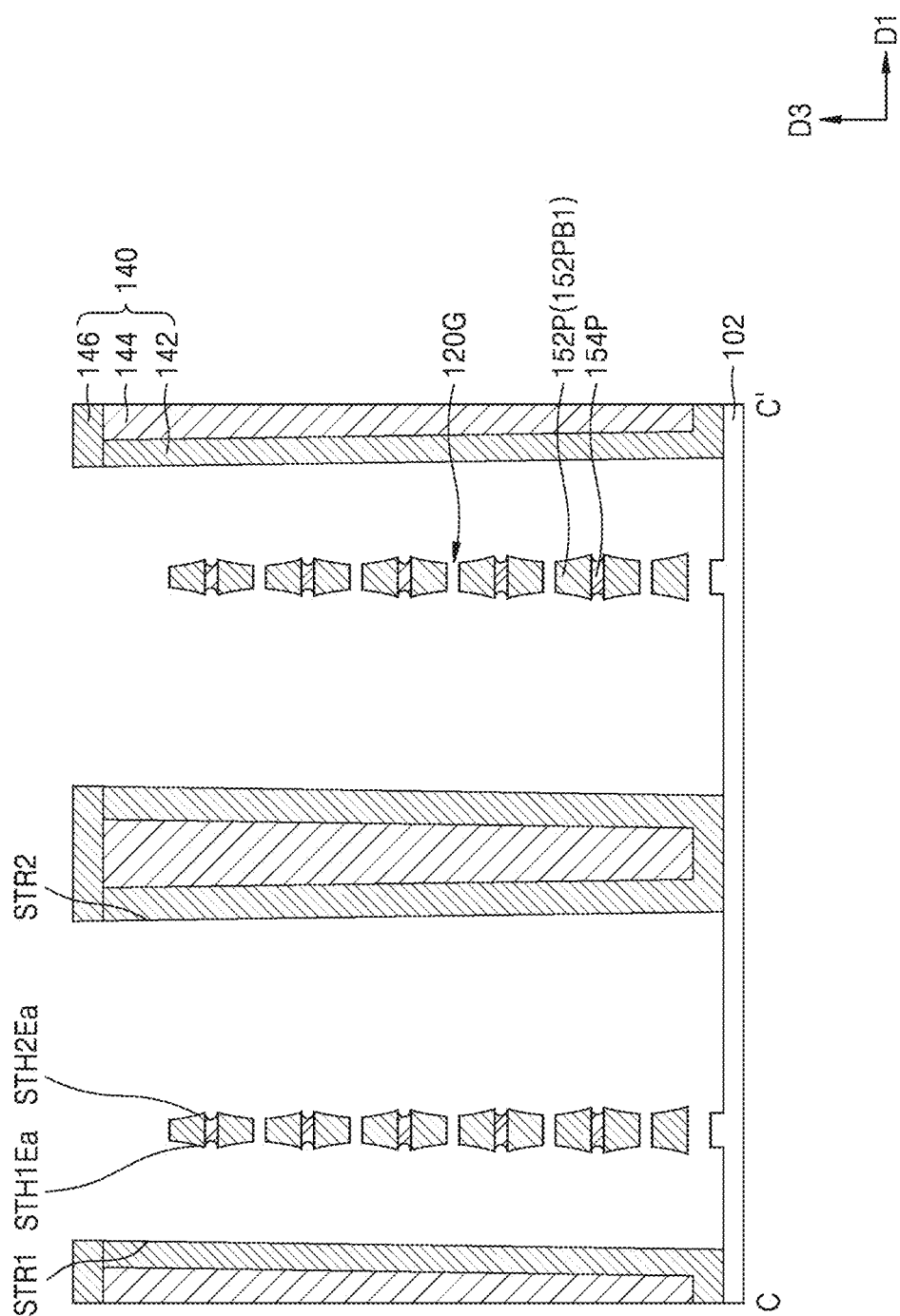
Figure 10C:
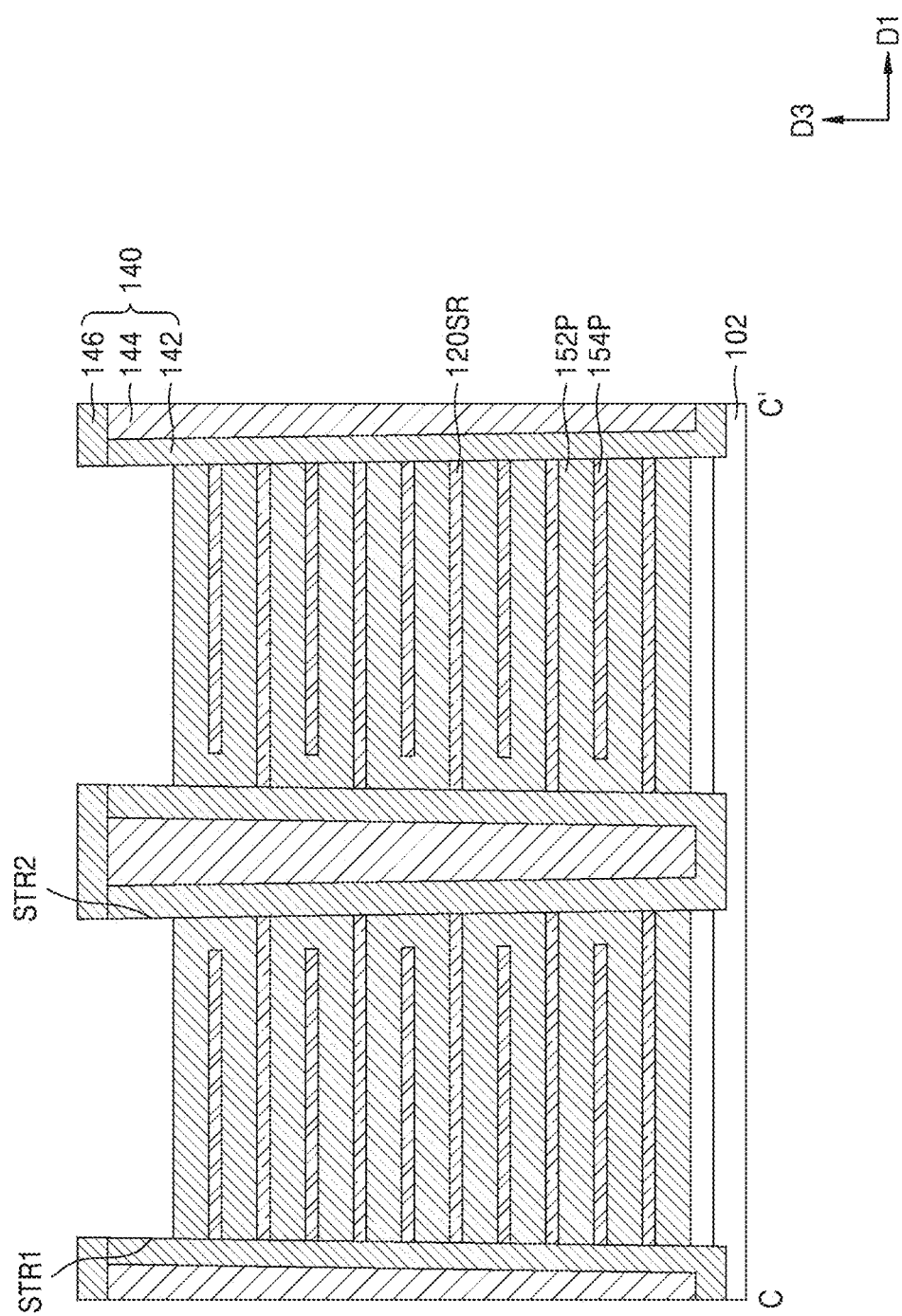
Figure 10D:
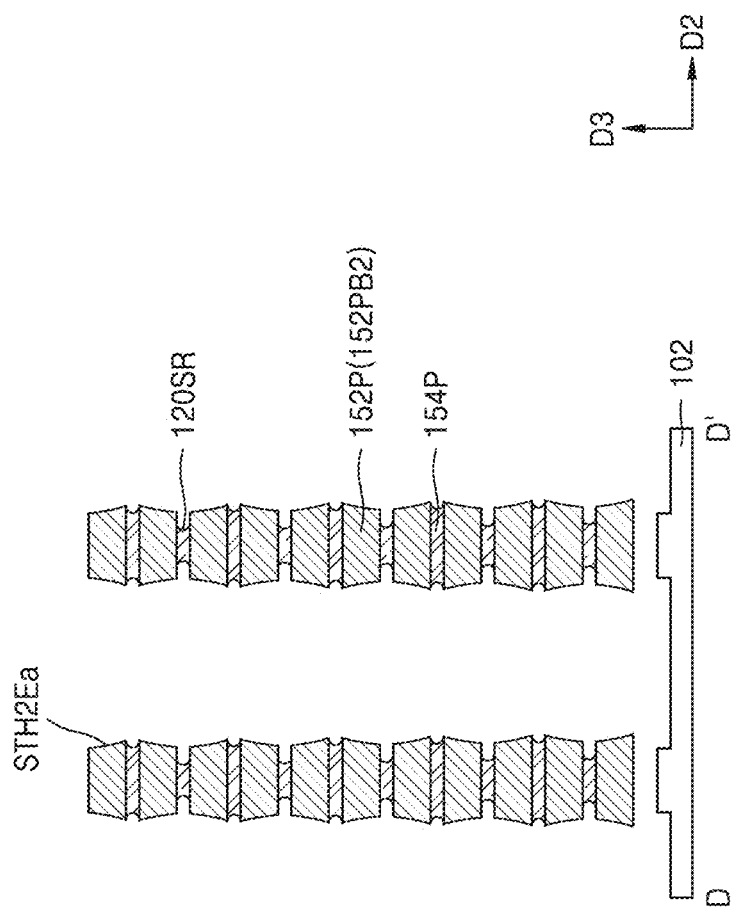

FIGS. 1A to 15B are schematic diagrams in a process order of a method of manufacturing/fabricating a semiconductor memory device, according to some example embodiments of inventive concepts. For example, FIGS. 1A, 2A, 3A, 4A, 5A, 6A, 10A, 11A, 12A, 13A, 14A, and 15A are top views, FIGS. 1B, 2B, 3B, 4B, 5B, 6B, and 10B are cross-sectional views taken along line B-B' of FIGS. 1A, 2A, 3A, 4A, 5A, 6A, and 10A, respectively, FIGS. 7A, 8A, and 9A are cross-sectional views taken along a part corresponding to line B-B' of FIG. 6A, FIGS. 3C, 4C, 5C, 6C, 10C, 11B, 12B, 13B, 14B, and 15B are cross-sectional views taken along line C-C' of FIGS. 3A, 4A, 5A, 6A, 10A, 11A, 12A, 13A, 14A, and 15A, respectively, FIGS. 6D and 10D are cross-sectional views taken along line D-D' of FIGS. 6A and 10A, respectively, and FIGS. 7B, 8B, and 9B are cross-sectional views taken along a part corresponding to line D-D' of FIG. 6A.

Figure 1A:
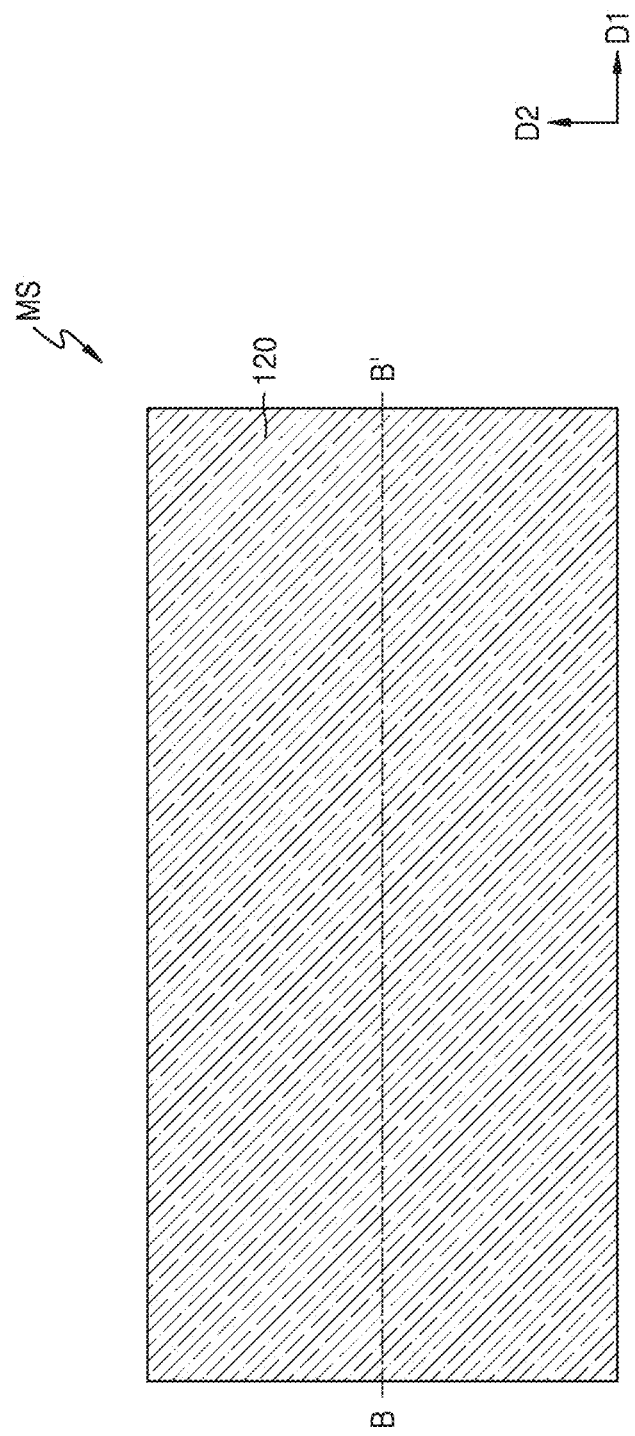
FIGS. 1A to 15B are schematic diagrams in a process order of a method of manufacturing a semiconductor memory device, according to some example embodiments of inventive concepts.
Figure 1B:
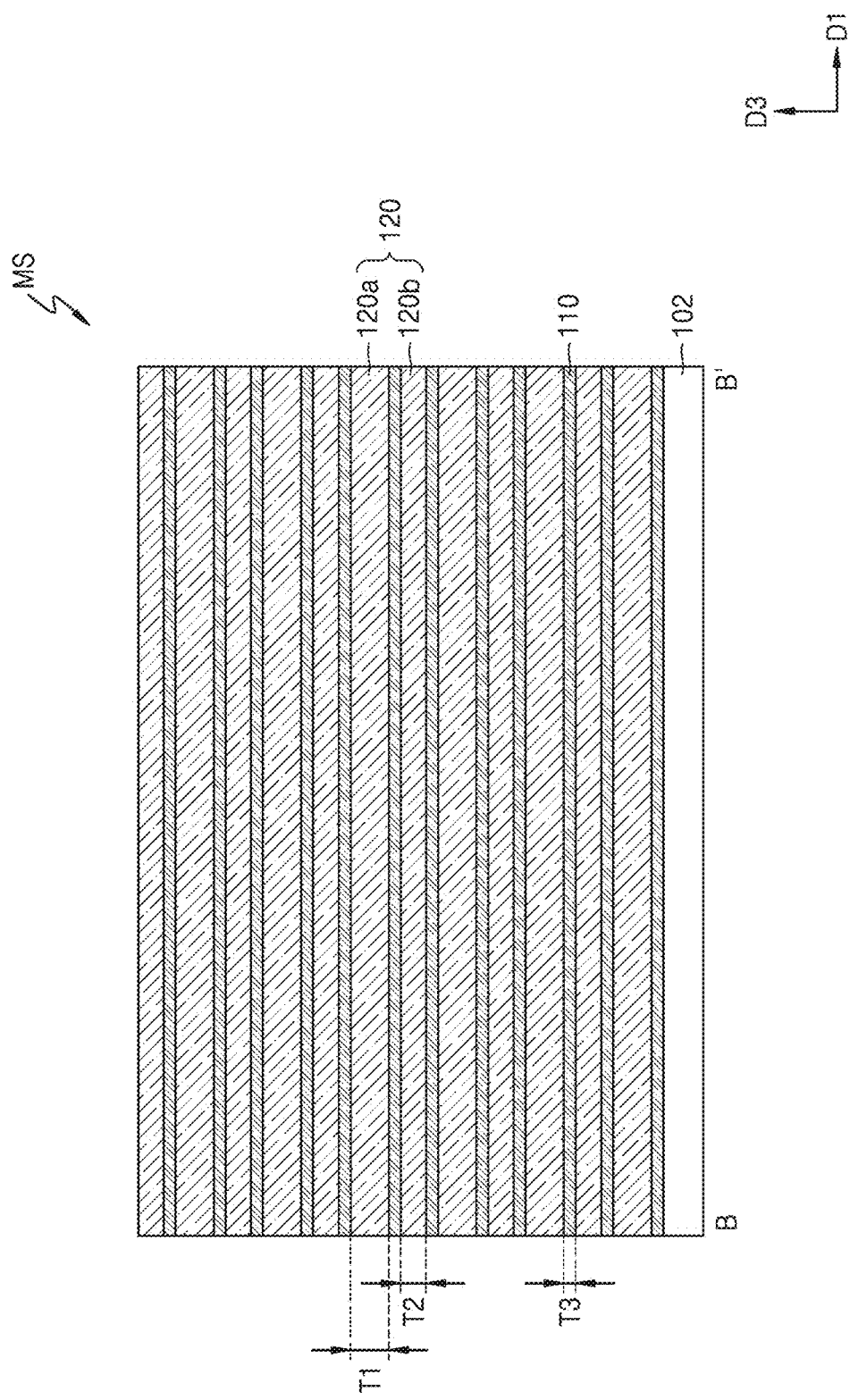

Referring to FIGS. 1A and 1B, a multi-layer structure MS in which a plurality of sacrificial/parasitic layers 110 and a plurality of monocrystalline semiconductor layers 120 are alternately stacked on a substrate 102 is formed.

The substrate 102 may include a single crystalline/monocrystalline semiconductor material. For example, the substrate 102 may include a semiconductor material such as silicon (Si) or germanium (Ge). Alternatively or additionally, the substrate 102 may include a III-V semiconductor material in single crystalline phase. Alternatively or additionally, for example, the substrate 102 may include a silicon-on-insulator (SOI) substrate or a germanium-on-insulator (GeOI) substrate.

Each of the plurality of sacrificial layers 110 and the plurality of monocrystalline semiconductor layers 120 may include a monocrystalline semiconductor material. The parasitic layer 110 may include a semiconductor material having a selective etching rate with respect to, e.g. may etch slower than or faster than, the monocrystalline semiconductor layer 120. In some example embodiments, the parasitic layer 110 may have a selective etching rate with respect to the substrate 102. In some example embodiments, the monocrystalline semiconductor layer 120 may include a material having the same or similar etching characteristic as or to that of the substrate 102, and/or include or be of the same material as the substrate 102.

In some example embodiments, each of the plurality of sacrificial layers 110 may include SiGe, and each of the plurality of monocrystalline semiconductor layers 120 may include Si. For example, each of the plurality of sacrificial layers 110 may include monocrystalline/single crystal SiGe, and each of the plurality of monocrystalline semiconductor layers 120 may include monocrystalline Si. In some example embodiments, each of the plurality of monocrystalline semiconductor layers 120 may include a monocrystalline two-dimensional (2D) material semiconductor and/or a monocrystalline oxide semiconductor material. For example, the 2D material semiconductor may include molybdenum disulfide ($MoS_2$), tungsten diselenide ($WSe_2$), graphene, carbon nanotube, or a combination thereof. For example, the oxide semiconductor material may include indium gallium zinc oxide ($In_xGa_yZn_zO$), indium gallium silicon oxide ($In_xGa_ySi_zO$), indium tin zinc oxide ($In_xSn_yZn_zO$), indium zinc oxide ($In_xZn_yO$), zinc oxide ($Zn_xO$), zinc tin oxide ($Zn_xSn_yO$), zinc oxynitride ($Zn_xO_yN$), zirconium zinc tin oxide ($Zr_xZn_ySn_zO$), tin oxide ($Sn_xO$), hafnium indium zinc oxide ($Hf_xIn_yZn_zO$), gallium zinc tin oxide ($Ga_xZn_ySn_zO$), aluminum zinc tin oxide ($Al_xZn_ySn_zO$), ytterbium gallium zinc oxide ($Yb_xGa_yZn_zO$), indium gallium oxide ($In_xGa_yO$), or any combination thereof. For example, each of the plurality of monocrystalline semiconductor layers 120 may include a single layer or a multi-layer of the oxide semiconductor material. In some example embodiments, each of the plurality of monocrystalline semiconductor layers 120 may include a material having band gap energy greater than that of Si. For example, each of the plurality of monocrystalline semiconductor layers 120 may include a material having band gap energy of around 1.5 eV to around 5.6 eV. For example, each of the plurality of monocrystalline semiconductor layers 120 may include a material which may have the best channel performance when having band gap energy of around 2.0 eV to around 4.0 eV.

The plurality of sacrificial layers 110 and the plurality of monocrystalline semiconductor layers 120 may be formed by at least one of a chemical vapor deposition (CVD), plasma enhanced CVD (PECVD), or atomic layer deposition (ALD). In some example embodiments, each of the plurality of sacrificial layers 110 and the plurality of monocrystalline semiconductor layers 120 may be formed in a monocrystalline state by using, as a seed layer, a layer in contact with the same, from the bottom, and/or formed in a monocrystalline state by annealing.

In some example embodiments, the plurality of monocrystalline semiconductor layers 120 may include a plurality of first semiconductor layers 120a and a plurality of second semiconductor layers 120b having different thicknesses. The plurality of first semiconductor layers 120a and the plurality of second semiconductor layers 120b may be alternately arranged in a vertical direction (e.g. in a D3 direction). For example, the first semiconductor layer 120a and the second semiconductor layer 120b may be alternately on each of the plurality of sacrificial layers 110 spaced apart from each other in the vertical direction (the D3 direction).

Each of the plurality of sacrificial layers 110 and the plurality of monocrystalline semiconductor layers 120 may have a thickness of tens of nanometers (nm). The first semiconductor layer 120a, the second semiconductor layer 120b, and the parasitic layer 110 may have a first thickness T1, a second thickness T2, and a third thickness T3, respectively. The first thickness T1 may be greater than the second thickness T2. In some example embodiments, the first thickness T1 may be greater than the second thickness T2 by 10 nm or more. In some example embodiments, the third thickness T3 may be less than each of the first thickness T1 and the second thickness T2.

In some example embodiments, each of the plurality of monocrystalline semiconductor layers 120 may be formed to have an almost same thickness.

Figure 2A:
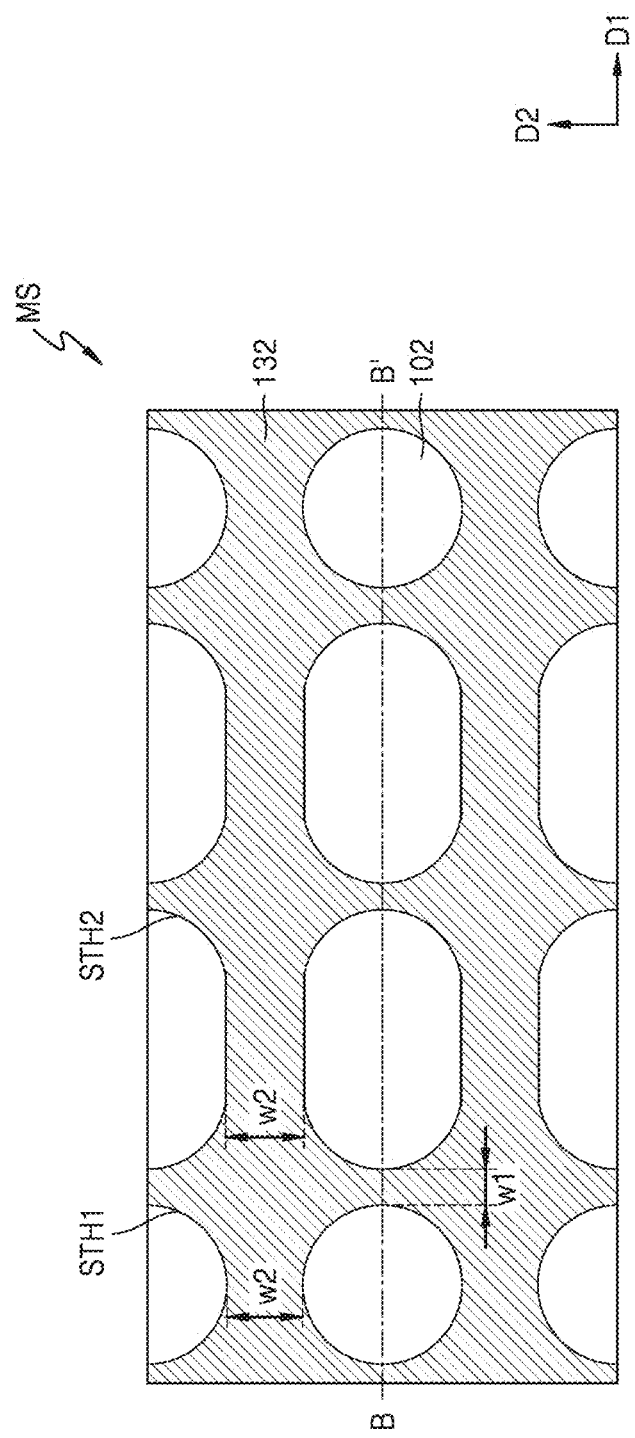
Figure 2B:
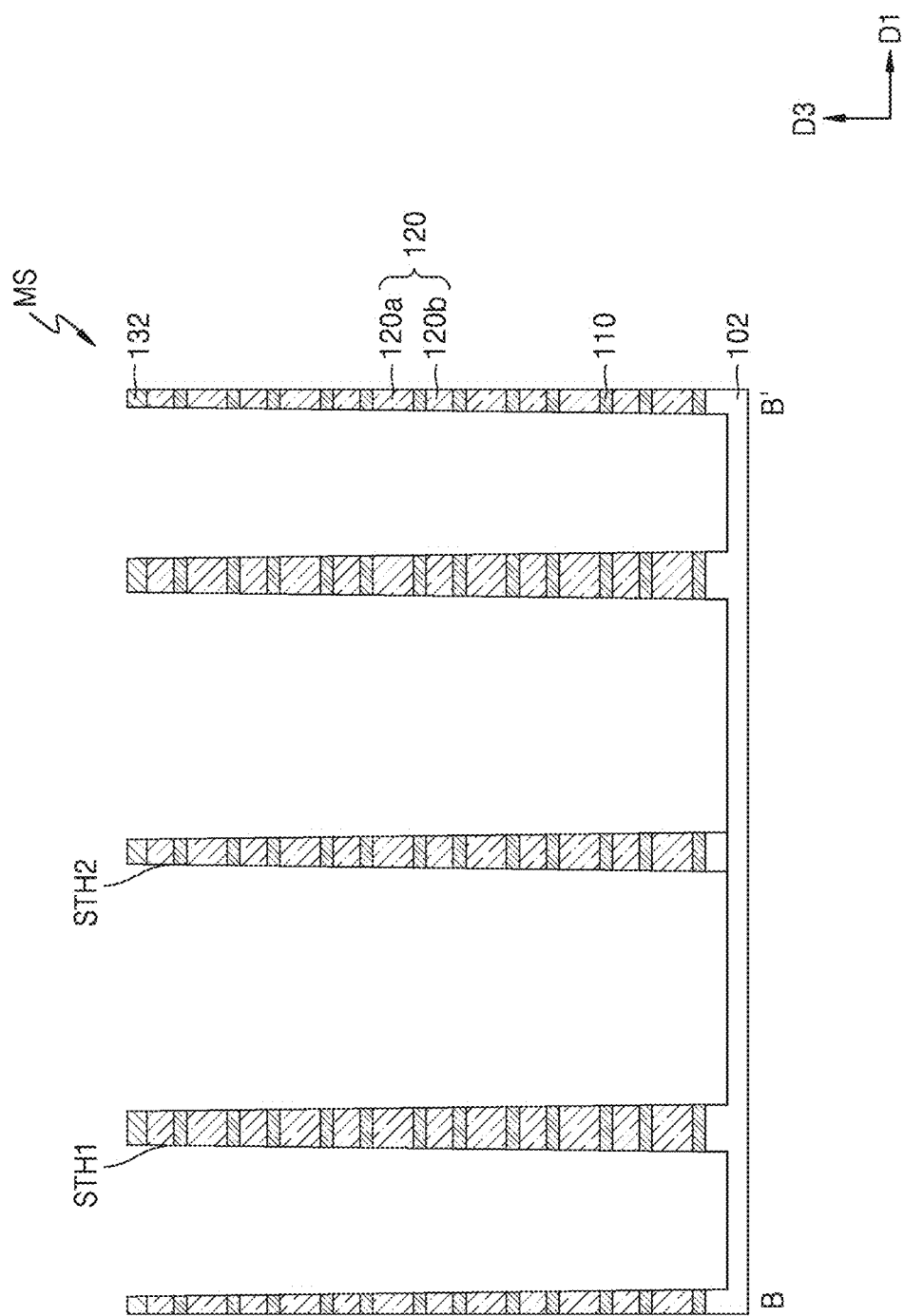

Referring to FIGS. 2A and 2B, a first mask layer 132 may be formed on the multi-layer structure MS, and then a plurality of first stacked through holes STH1 and a plurality of second stacked through holes STH2, which expose the substrate 102 through the multi-layer structure MS, are formed by using the first mask layer 132 as an etching mask. The first mask layer 132 may have a plurality of openings corresponding to the plurality of first stacked through holes STH1 and the plurality of second stacked through holes STH2. In some example embodiments, the first mask layer 132 may include a hard mask material such as silicon nitride. In some example embodiments, each of the plurality of first stacked through holes STH1 and the plurality of second stacked through holes STH2 may have a tapered shape having a horizontal width gradually decreasing toward the substrate 102.

The plurality of second stacked through holes STH2 may have an oval planar shape having a long axis in a first horizontal direction (a D1 direction) and a short axis in a second horizontal direction (a D2 direction), or may have a rectangular planar shape having a long axis in the first horizontal direction (the D1 direction) and a short axis in the second horizontal direction (the D2 direction) and having round corners.

In some example embodiments, the plurality of first stacked through holes STH1 may have a planar shape of a circle, an oval, a square with round corners, or a rectangular with round corners. In some example embodiments, a width of the plurality of first stacked through holes STH1 in the first horizontal direction (the D1 direction) may be less than a width of the plurality of second stacked through holes STH2 in the first horizontal direction (the D1 direction), and a width of the plurality of first stacked through holes STH1 in the second horizontal direction (the D2 direction) may be substantially the same as a width of the plurality of second stacked through holes STH2 in the second horizontal direction (the D2 direction).

The first stacked through hole STH1 and the second stacked through hole STH2 may be spaced apart from each other in the first horizontal direction (the D1 direction). In some example embodiments, one of the plurality of first stacked through holes STH1 and another one of the plurality of second stacked through holes STH2 may be respectively apart at both sides of one of the plurality of second stacked through holes STH2 in the first horizontal direction (the D1 direction).

The plurality of first stacked through holes STH1 may be arranged on a line by being apart from each other in the second horizontal direction (the D2 direction) that is orthogonal to the first horizontal direction (e.g., the D1 direction), and the plurality of second stacked through holes STH2 may be arranged on a line by being apart from each other in the second horizontal direction (e.g., the D2 direction).

One of both ends in the first horizontal direction (the D1 direction) of each of the plurality of first stacked through holes STH1 arranged on a line by being apart from each other in the second horizontal direction (the D2 direction) may face each of the plurality of second stacked through holes STH2, and the other end thereof may face a side that is opposite to each of the plurality of second stacked through holes STH2.

A first width W1 that is a small width, e.g. a minimum width between a first stacked through hole STH1 and a second stacked through hole STH2 adjacent to each other in the first horizontal direction (the D1 direction) may be less than a second width W2 that is a small width, e.g. a minimum width between two first stacked through holes STH1 adjacent to each other in the second horizontal direction (the D2 direction) or a small/minimum width between two second stacked through holes STH2 adjacent to each other in the second horizontal direction (the D2 direction).

With reference to a virtual line extending in the second horizontal direction (the D2 direction) along between two second stacked through holes STH2 adjacent to each other in the first horizontal direction (the D1 direction), the plurality of first stacked through holes STH1 and the plurality of second stacked through holes STH2 may be mirror-symmetrical. For example, one first stacked through hole STH1, one second stacked through hole STH2, another second stacked through hole STH2, and another first stacked through hole STH1 may be apart from each other in the first horizontal direction (the D1 direction).

Figure 3A:
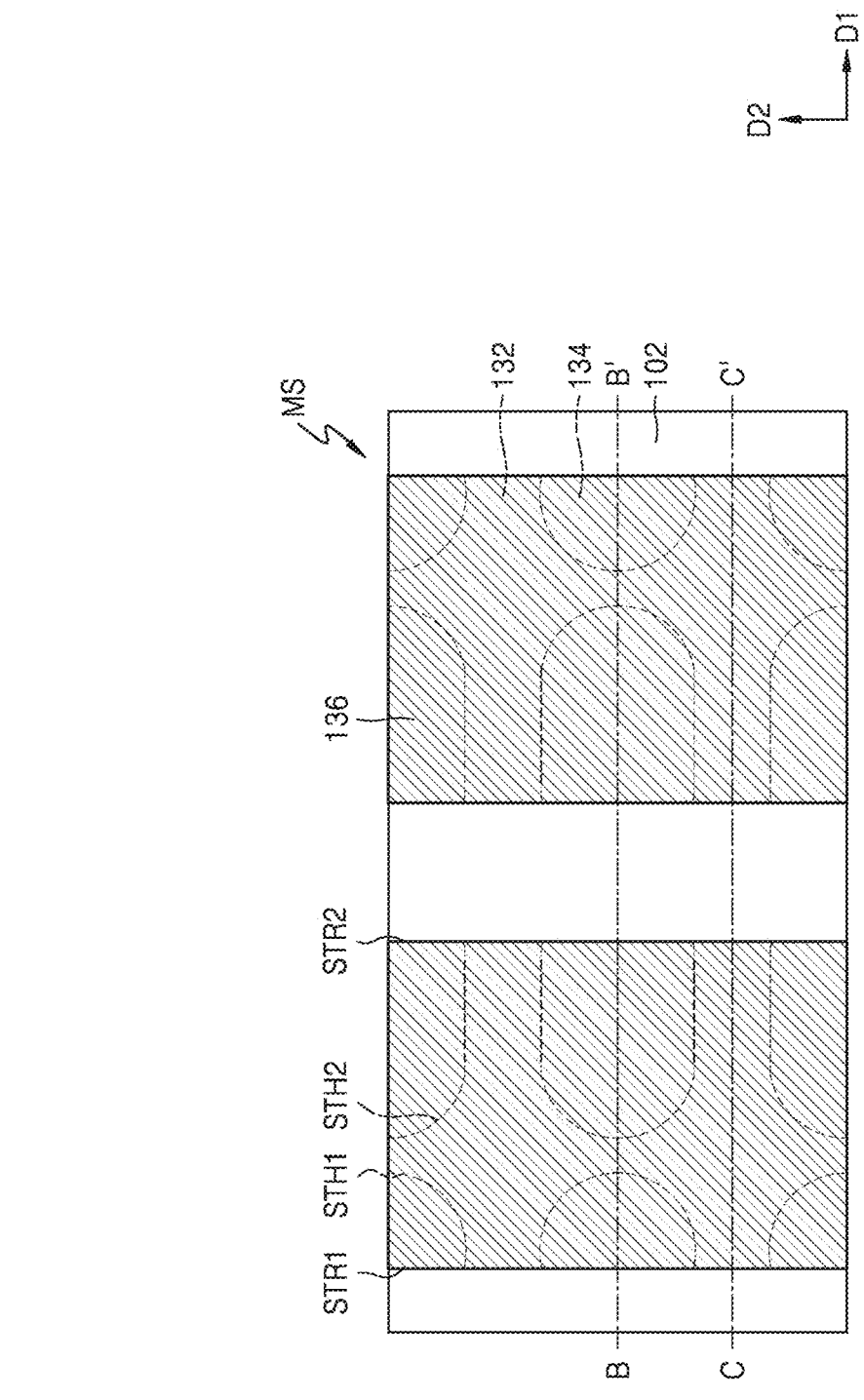
Figure 3C:
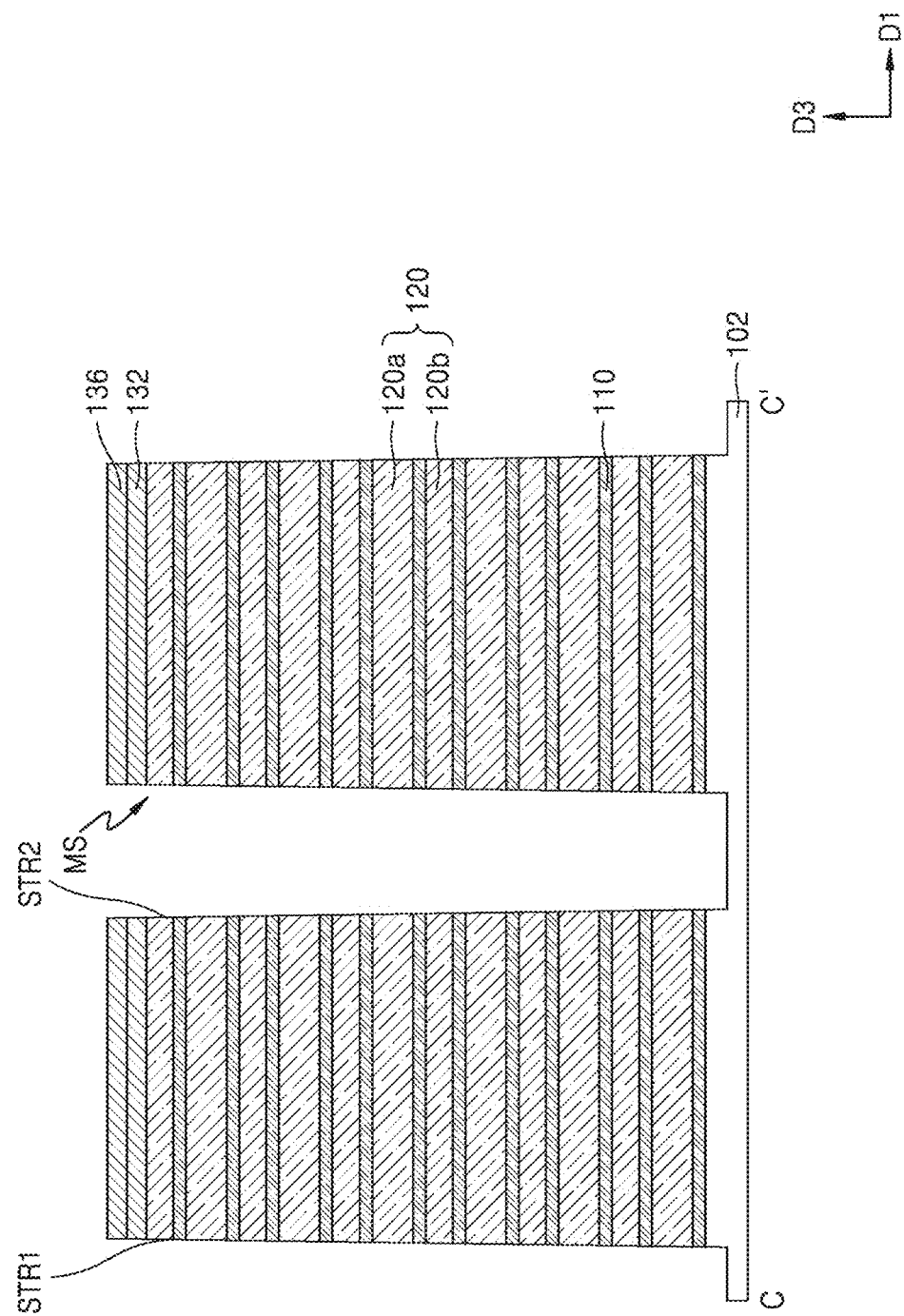

Referring now to FIGS. 3A to 3C, a first buried insulating layer 134 filling the plurality of first stacked through holes STH1 and the plurality of second stacked through holes STH2 is formed. In some example embodiments, the first buried insulating layer 134 may include any one of or at least one of a silicon oxide, a silicon oxynitride layer, a carbon-contained silicon oxide layer, a carbon-contained silicon nitride layer, and a carbon-contained silicon oxynitride layer.

A second masker layer 136 covering the multi-layer structure MS and the first buried insulating layer 134 may be formed, and then a first recess STR1 and a second recess STR2, which expose the substrate 102 through the multi-layer structure MS and the first buried insulating layer 134, may be formed by using the second masker layer 136 as an etching mask. The second masker layer 136 may have a plurality of openings corresponding to the first recess STR1 and the second recess STR2. In some example embodiments, the second masker layer 136 may include a silicon nitride.

Each of the first recess STR1 and the second recess STR2 may have a shape extending in the second horizontal direction (the D2 direction). In some example embodiments, each of the first recess STR1 and the second recess STR2 may have a tapered shape having a horizontal width gradually decreasing toward the substrate 102.

The first recess STR1 may extend in the second horizontal direction (e.g., the D2 direction) over the other ends of both the ends of a plurality of first stacked through holes STH1 in the first horizontal direction (the D1 direction), the other ends being opposite to a plurality of second stacked through holes STH2. A portion of the first buried insulating layer 134 filling the plurality of first stacked through holes STH1 may be exposed on an inner side surface of the first recess STR1.

The second recess STR2 may extend in the second horizontal direction (the D2 direction) over facing ends of two second stacked through holes STH2 adjacent to each other in the first horizontal direction (the D1 direction). A portion of the first buried insulating layer 134 filling the plurality of second stacked through holes STH2 may be exposed on an inner side surface of the second recess STR2.

Figure 4A:
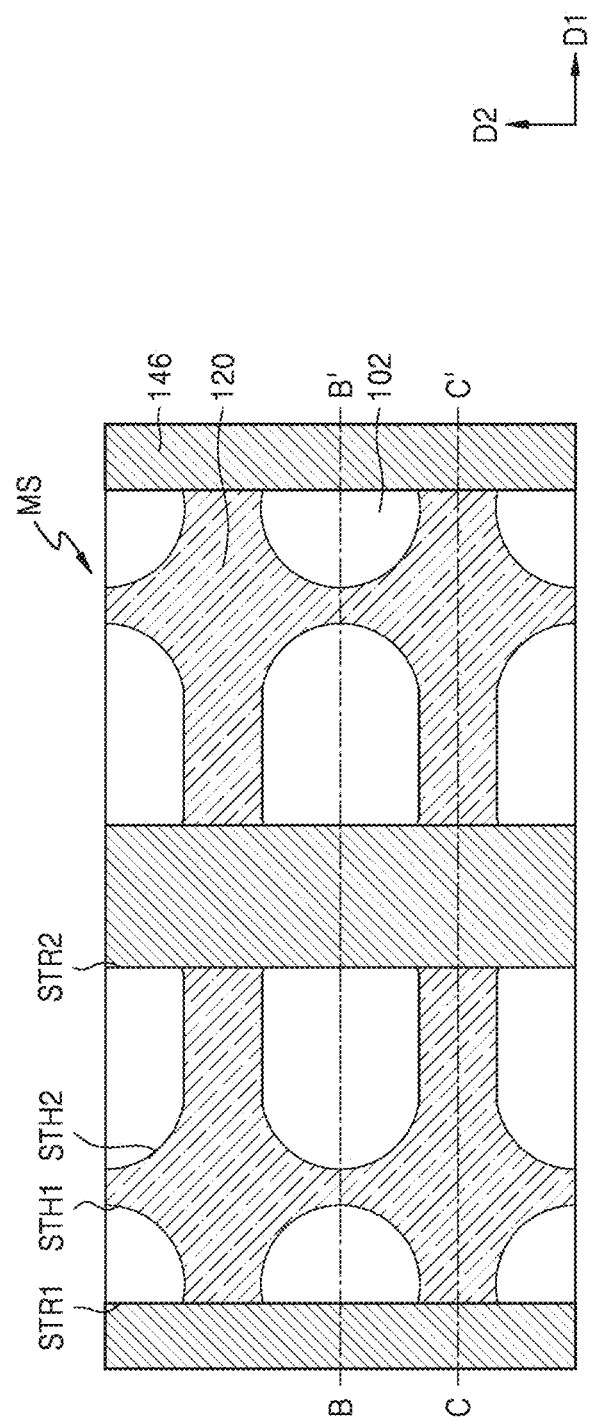
Figure 4B:
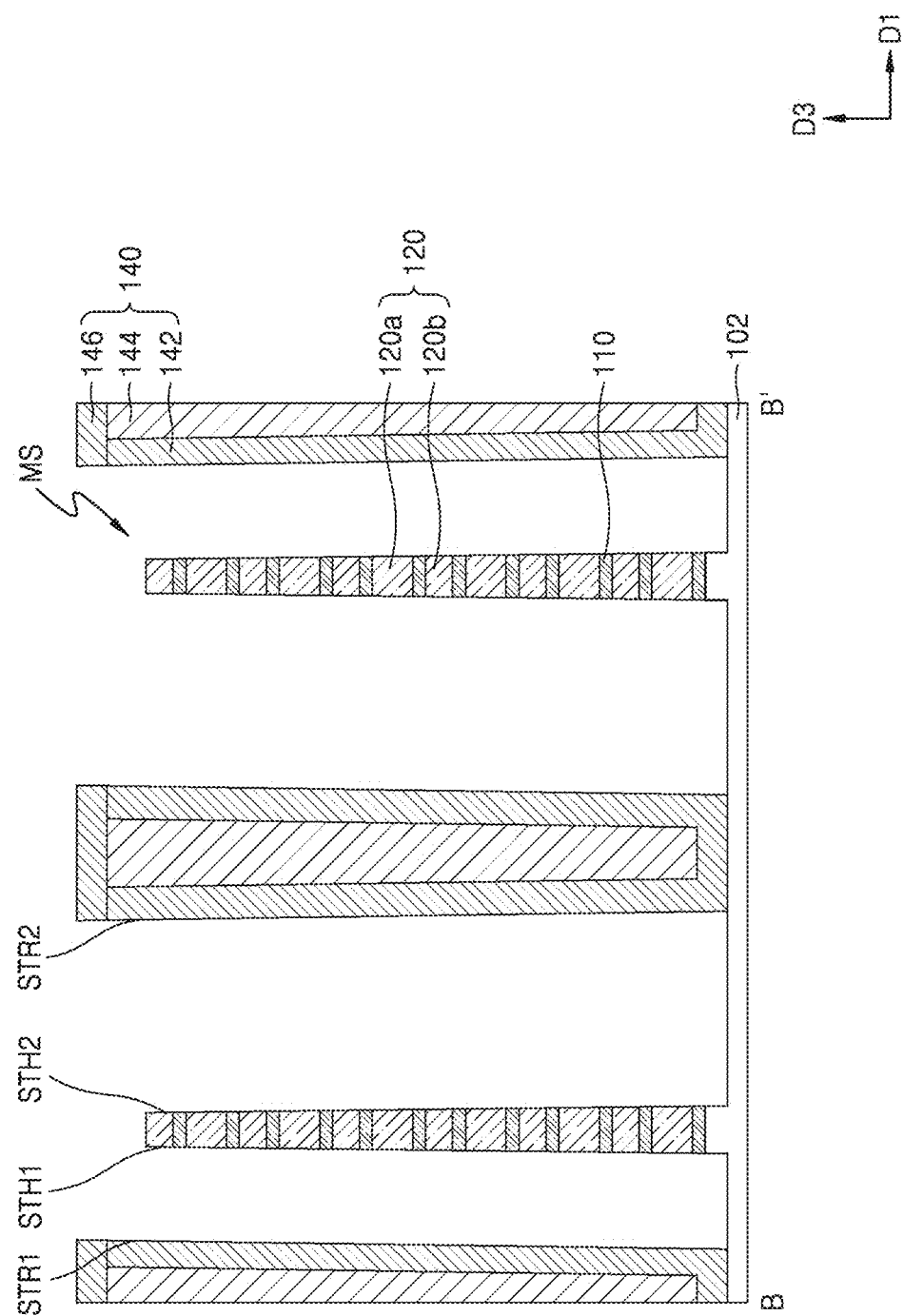
Figure 4C:
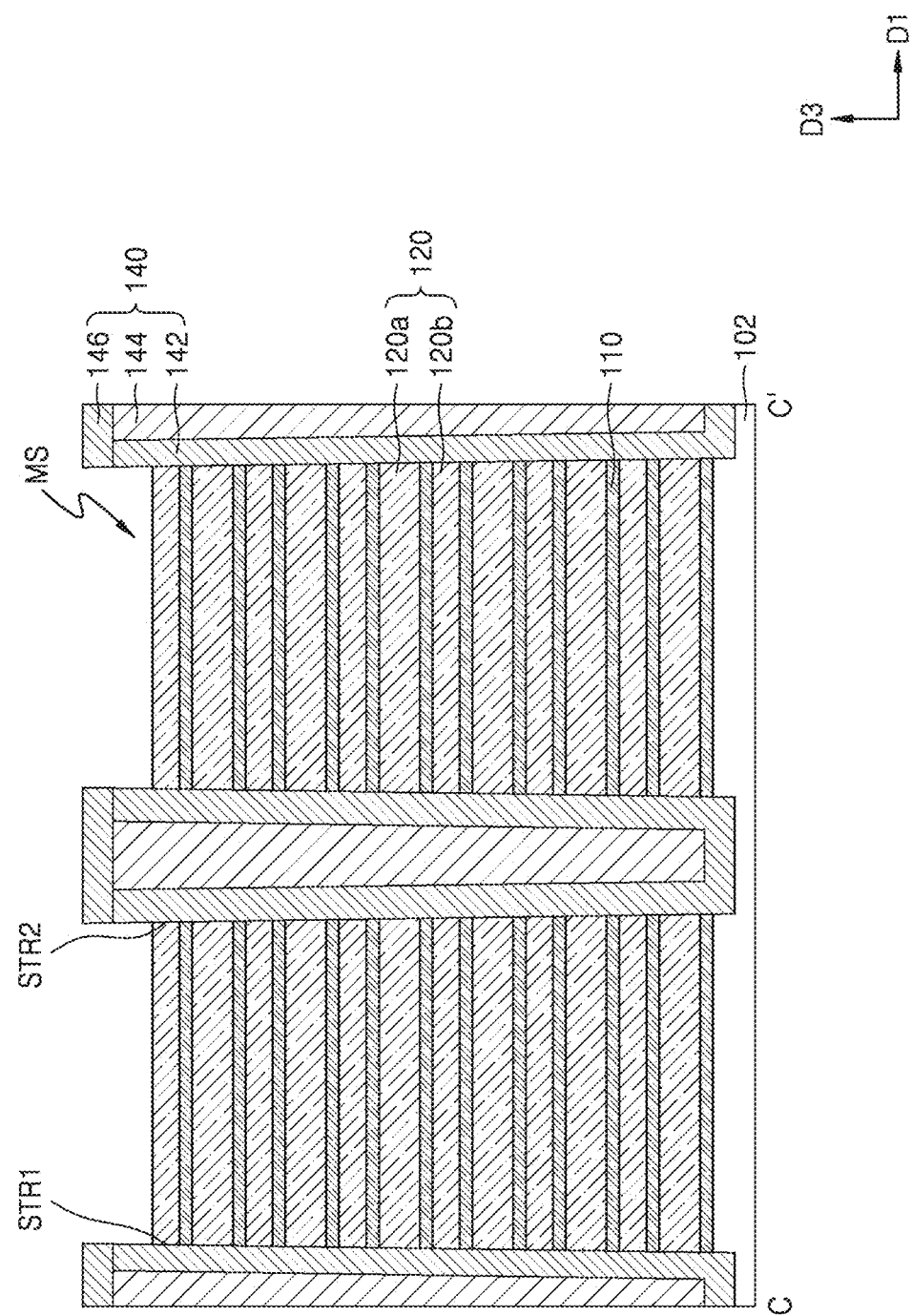

Referring to FIGS. 4A to 4C, a buried structure 140 filling the first recess STR1 is formed, then the second masker layer 136 is removed, and the first buried insulating layer 134 filling the plurality of first stacked through holes STH1 and the plurality of second stacked through holes STH2 is removed.

In some example embodiments, the buried structure 140 may include a liner layer 142, a buried layer 144, and a capping layer 146. The liner layer 142 may conformally cover a bottom surface and a side surface of the first recess STR1. The buried layer 144 may cover the liner layer 142 and fill the first recess STR1. The capping layer 146 may cover a top surface of the liner layer 142 and a top surface of the buried layer 144. In some example embodiments, the liner layer 142 and the capping layer 146 may include a silicon nitride. In some example embodiments, the buried layer 144 may include any one of or at least one of a silicon oxide, a silicon oxynitride layer, a carbon-contained silicon oxide layer, a carbon-contained silicon nitride layer, and a carbon-contained silicon oxynitride layer.

Figure 5A:
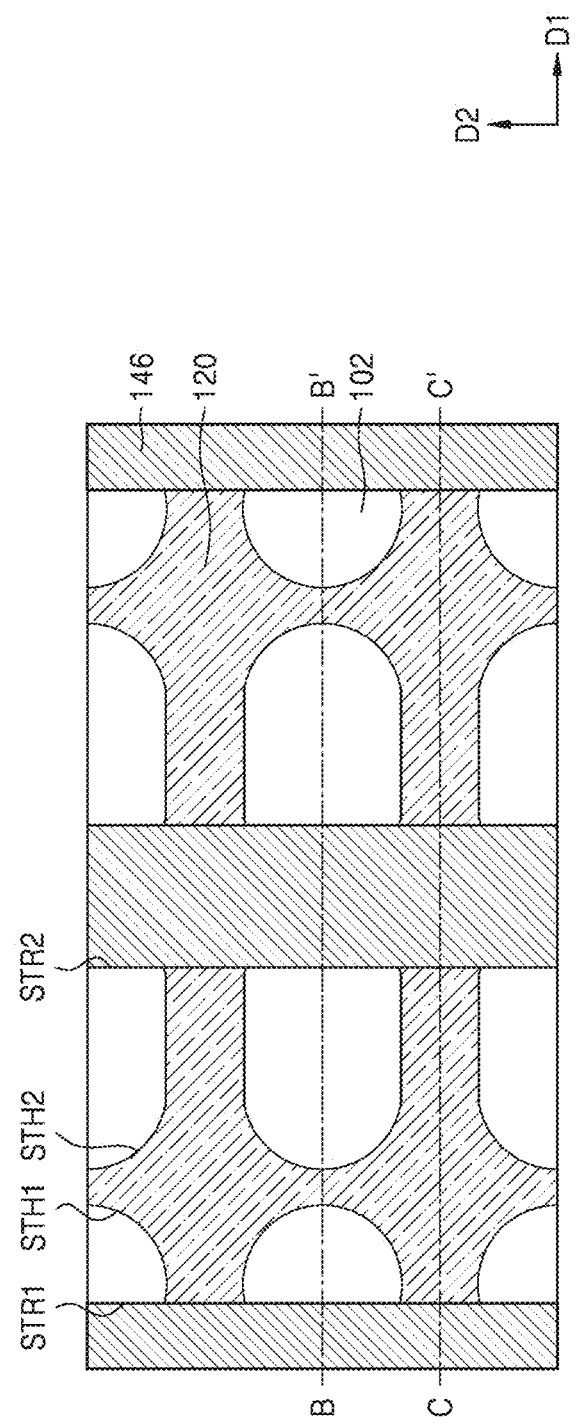
Figure 5B:
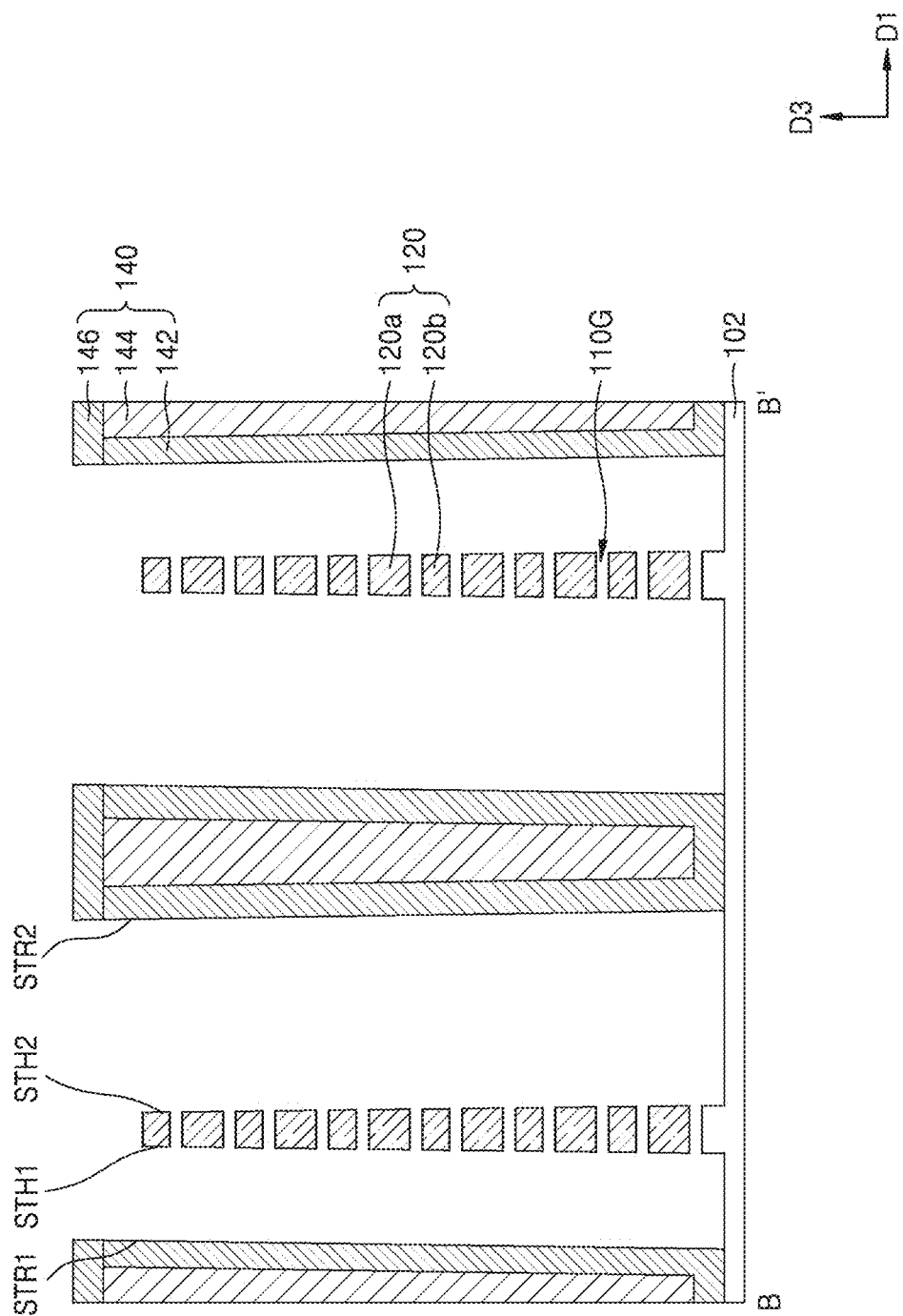
Figure 5C:
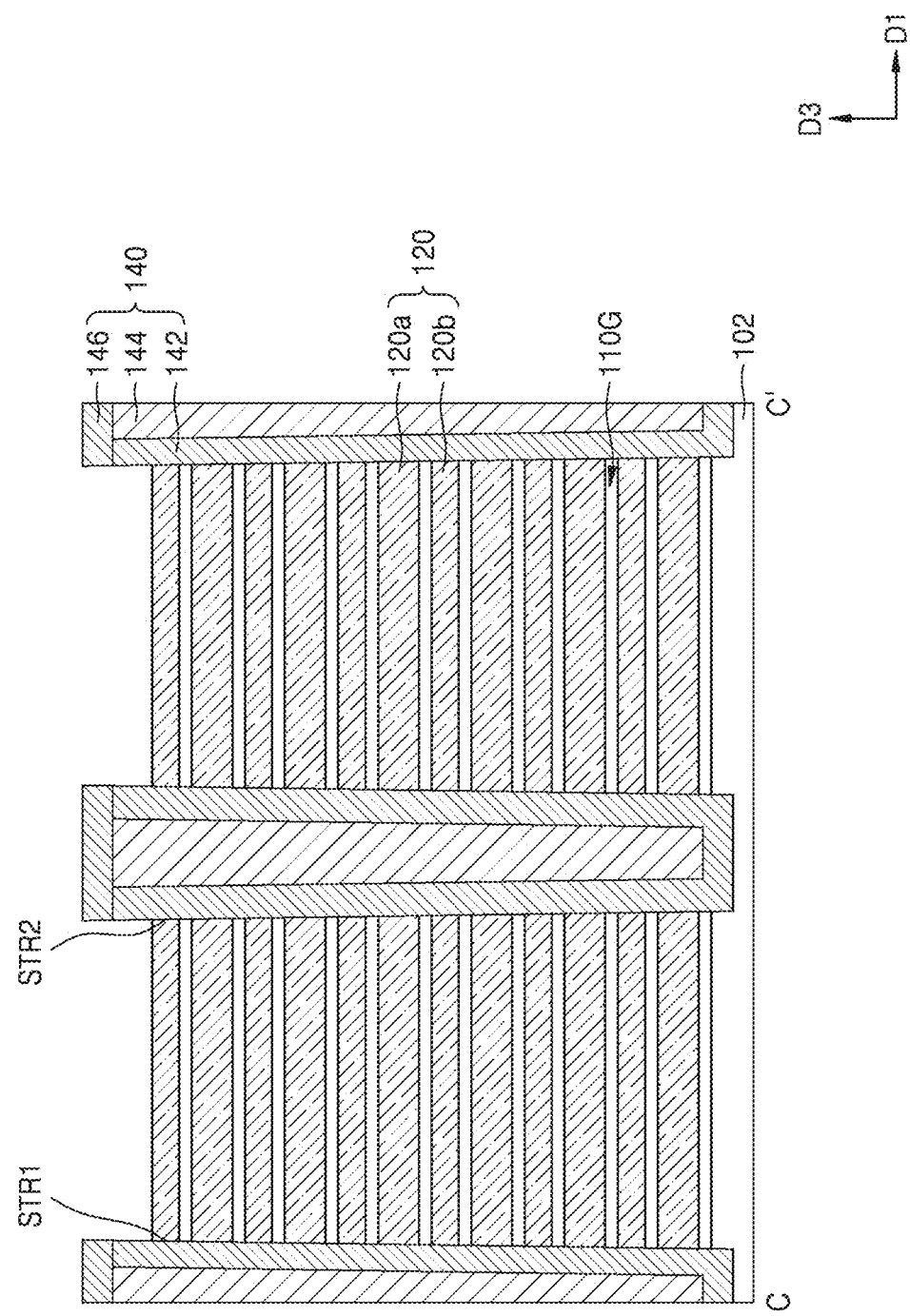

Referring to FIGS. 5A to 5C, a plurality of first gaps 110G may be formed between the plurality of monocrystalline semiconductor layers 120 by removing the plurality of sacrificial layers 110 through the plurality of first stacked through holes STH1 and the plurality of second stacked through holes STH2. The plurality of first gaps 110G may be formed by removing the plurality of sacrificial layers 110 by isotropic etching having a selective etching rate with respect to the substrate 102, the plurality of monocrystalline semiconductor layers 120, the liner layer 142, and the capping layer 146.

Referring to FIGS. 6A to 6D, a plurality of monocrystalline slits 120S may be formed by removing a portion of the plurality of monocrystalline semiconductor layers 120, which is exposed through the plurality of first stacked through holes STH1, the plurality of second stacked through holes STH2, and the plurality of first gaps 110G shown in FIGS. 5A to 5C. In some example embodiments, each of the plurality of monocrystalline slits 120S may have a thickness of around 5 nm to around 15 nm. For example, each of the plurality of monocrystalline slits 120S may have a thickness of around 10 nm. A horizontal width of each of the plurality of monocrystalline slits 120S may be less than a horizontal width of the plurality of monocrystalline semiconductor layers 120.

The plurality of monocrystalline slits 120S may be formed by removing a portion of the plurality of monocrystalline semiconductor layers 120 by isotropic etching, e.g. by wet etching, having a selective etching rate with respect to the liner layer 142 and the capping layer 146. In some example embodiments, in a process of forming the plurality of monocrystalline slits 120S, a portion of the substrate 102 exposed on bottom surfaces of the plurality of first stacked through holes STH1 and the plurality of second stacked through holes STH2 may also be removed.

In some example embodiments, when the plurality of monocrystalline semiconductor layers 120 include the plurality of first semiconductor layers 120a and the plurality of second semiconductor layers 120b having different/variable thicknesses, the plurality of second semiconductor layers 120b having a relatively less thickness may be clearly removed, and only a portion of the plurality of first semiconductor layers 120a may remain as the plurality of monocrystalline slits 120S. In some example embodiments, when each of the plurality of monocrystalline semiconductor layers 120 has an almost same thickness, a portion of the plurality of monocrystalline semiconductor layers 120 may remain as the plurality of monocrystalline slits 120S.

The plurality of first stacked through holes STH1 and the plurality of second stacked through holes STH2 shown in FIGS. 5A to 5C may be or correspond to a plurality of first stacked through holes STH1E and a plurality of second stacked through holes STH2E shown in FIGS. 6A to 6D, which extend in a horizontal direction, by removing a portion of the plurality of monocrystalline semiconductor layers 120, and the plurality of first gaps 110G may be a plurality of first extended gaps 110GE extending in the vertical direction (e.g., the D3 direction) by removing a portion of the plurality of monocrystalline semiconductor layers 120.

Referring to FIGS. 7A and 7B, a plurality of support insulating layers 152 covering the surfaces of the plurality of monocrystalline slits 120S and a separation insulating layer 154 covering the surfaces of the plurality of support insulating layers 152 may be formed. The separation insulating layer 154 may be integrally formed while covering the surfaces of the plurality of support insulating layers 152.

Each of the plurality of support insulating layers 152 may be formed to have a thickness so that portions of the plurality of support insulating layers 152 respectively covering the plurality of monocrystalline slits 120S are apart from each other without coming in contact with each other in the vertical direction (e.g., the D3 direction). The separation insulating layer 154 may be formed to have a thickness so that the separation insulating layer 154 covers the surface of each support insulating layer 152 and fills between portions of two support insulating layers 152 adjacent to and apart from each other in the vertical direction (the D3 direction). The thickness of each support insulating layer 152 and the thickness of the separation insulating layer 154 may be determined by considering a vertical height of each first extended gap 110GE.

In some example embodiments, although not shown, the support insulating layer 152 and the separation insulating layer 154 may also be formed on an exposed surface of the substrate 102, or on each of the exposed surface of the substrate 102 and an exposed surface of the buried structure 140. A portion of the separation insulating layer 154 formed on the exposed surface of the substrate 102 and/or the exposed surface of the buried structure 140 may be clearly, e.g. completely and/or cleanly, removed in a process of forming a separation insulating pattern 154P to be described with reference to FIGS. 8A and 8B, and a portion of the support insulating layer 152 formed on the exposed surface of the substrate 102 and/or the exposed surface of the buried structure 140 may be clearly removed in a process of forming a support pattern 152P to be described with reference to FIGS. 9A and 9B.

Referring to FIGS. 8A to 8B, a portion of the separation insulating layer 154 is removed to form a plurality of separation insulating patterns 154P that are portions of the separation insulating layer 154, aligned on a line in the vertical direction (the D3 direction), and arranged between portions of the plurality of support insulating layers 152. Each separation insulating pattern 154P may be formed so that a width thereof in the first horizontal direction (the D1 direction) is less than a width of each support insulating layer 152.

The plurality of separation insulating patterns 154P may be formed by adjusting a removed amount of the separation insulating layer 154 so that portions of the separation insulating patterns 154P covering side surfaces of the plurality of support insulating layers 152 are clearly (e.g. completely and/or cleanly) removed, and portions of the separation insulating layer 154 filling between portions of two support insulating layers 152 adjacent to each other in the vertical direction (the D3 direction) are not clearly removed.

Referring to FIGS. 9A to 9B, a plurality of support patterns 152P that are portions of the plurality of support insulating layers 152 are formed between the plurality of separation insulating patterns 154P and the plurality of monocrystalline slits 120S by removing a portion of the plurality of support insulating layers 152.

The plurality of support patterns 152P may be formed by removing a remaining portion, except for the portions of the plurality of support insulating layers 152 between the plurality of separation insulating patterns 154P and the plurality of monocrystalline slits 120S.

Referring to FIGS. 10A to 10D, a plurality of monocrystalline bars 120SR, each being arranged between portions of two support patterns 152P adjacent to each other between two separation insulating patterns 154P in the vertical direction (e.g. the D3 direction), are formed by removing a portion of the plurality of monocrystalline slits 120S. The plurality of monocrystalline bars 120SR may have a bar shape extending in the first horizontal direction (e.g. the D1 direction) and having an almost same thickness in the vertical direction (e.g. the D3 direction).

The plurality of first stacked through holes STH1E and the plurality of second stacked through holes STH2E limited by the plurality of monocrystalline slits 120S shown in FIGS. 9A and 9B may become or may correspond to a plurality of first stacked through holes STH1Ea and a plurality of second stacked through holes STH2Ea shown in FIGS. 10A to 10D, which are limited by the plurality of support patterns 152P and have a slightly modified shape.

In the middle of two first stacked through holes STH1Ea adjacent to each other in the second horizontal direction (e.g. the D2 direction) and two second stacked through holes STH2Ea adjacent to the two first stacked through holes STH1Ea in the first horizontal direction (e.g. the D1 direction) and adjacent to each other in the second horizontal direction (e.g. the D2 direction), each support pattern 152P may have a main support part 152PM having a relatively large width in each of the first horizontal direction (the D1 direction) and the second horizontal direction (e.g. the D2 direction).

In the same vertical level/at the same plane, a plurality of support patterns 152P may have a plurality of main support parts 152PM, and a plurality of first support extension parts 152PB1 and a plurality of second support extension parts 152PB2 connecting between the plurality of main support parts 152PM. Each of the plurality of first support extension parts 152PB1 may be between a first stacked through hole STH1Ea and a second stacked through hole STH2Ea adjacent to each other in the first horizontal direction (the D1 direction). Each of the plurality of second support extension parts 152PB2 may be between two first stacked through holes STH1Ea adjacent to each other in the second horizontal direction (the D2 direction) and/or two second stacked through holes STH2Ea adjacent to each other in the second horizontal direction (the D2 direction). A third width W3 that is a minimum width of each of the plurality of first support extension parts 152PB1 in the first horizontal direction (the D1 direction) may be less than a fourth width W4 that is a minimum width of each of the plurality of second support extension parts 152PB2 in the second horizontal direction (the D2 direction). The third width W3 may be less than the first width W1 shown in FIG. 2A, and the fourth width W4 may be less than the second width W2 shown in FIG. 2A.

Each of the plurality of monocrystalline bars 120SR may have an extension part 120SC having a relatively large width in the second horizontal direction (e.g. the D2 direction) between two main support parts 152PM adjacent to each other between two separation insulating patterns 154P in the vertical direction (e.g. the D3 direction). A remaining portion of each of the plurality of monocrystalline bars 120SR except for the extension part 120SC may have an almost same width in the second horizontal direction (the D2 direction). A second gap 120G that is a space from which a portion of each of the plurality of monocrystalline slits 120S is removed may be formed between two support patterns 152P adjacent to each other between two separation insulating patterns 154P in the vertical direction (the D3 direction).

Between first support extension parts 152PB1 in two support patterns 152P adjacent to each other between two separation insulating patterns 154P in the vertical direction (the D3 direction), each of the plurality of monocrystalline bars 120SR may not be arranged, and only the second gap 120G may be formed. Between second support extension parts 152PB2 in two support patterns 152P adjacent to each other between two separation insulating patterns 154P in the vertical direction (the D3 direction), both the monocrystalline bar 120SR and the second gap 120G may be formed. Between the second support extension parts 152PB2 in two support patterns 152P adjacent to each other between two separation insulating patterns 154P in the vertical direction (the D3 direction), the second gap 120G may be at both sides of the monocrystalline bar 120SR in the second horizontal direction (the D2 direction) and extend in the first horizontal direction (the D1 direction).

Figure 11A:
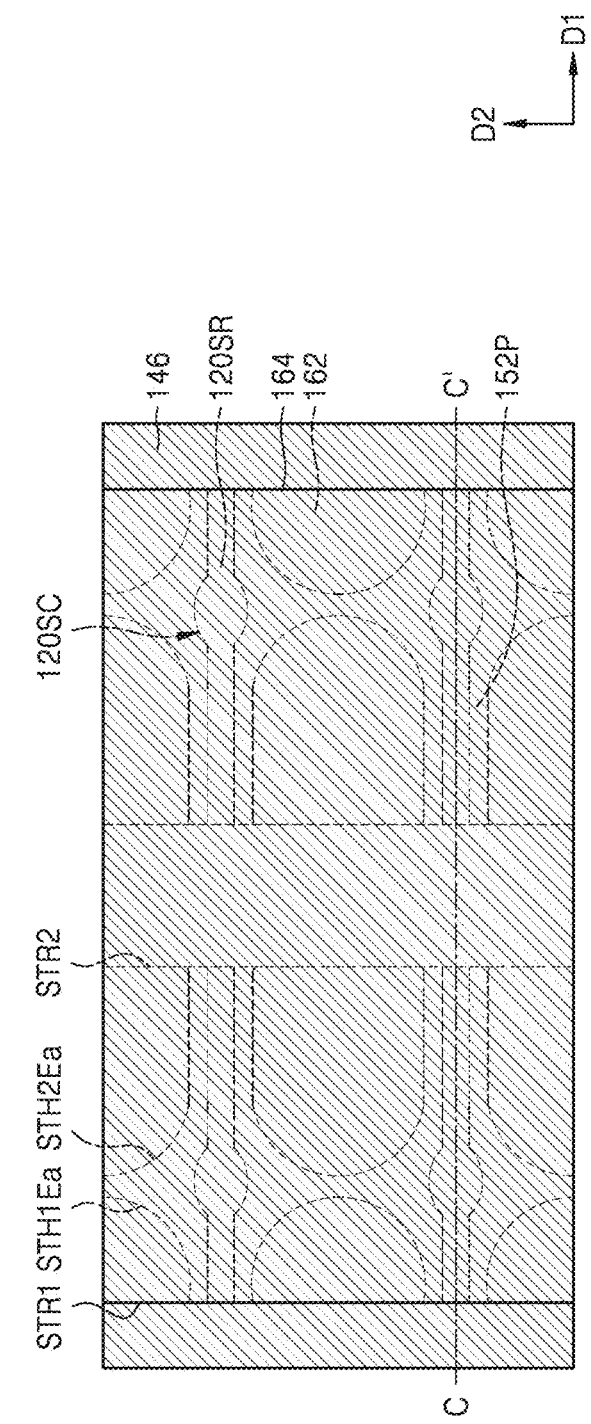
Figure 11B:
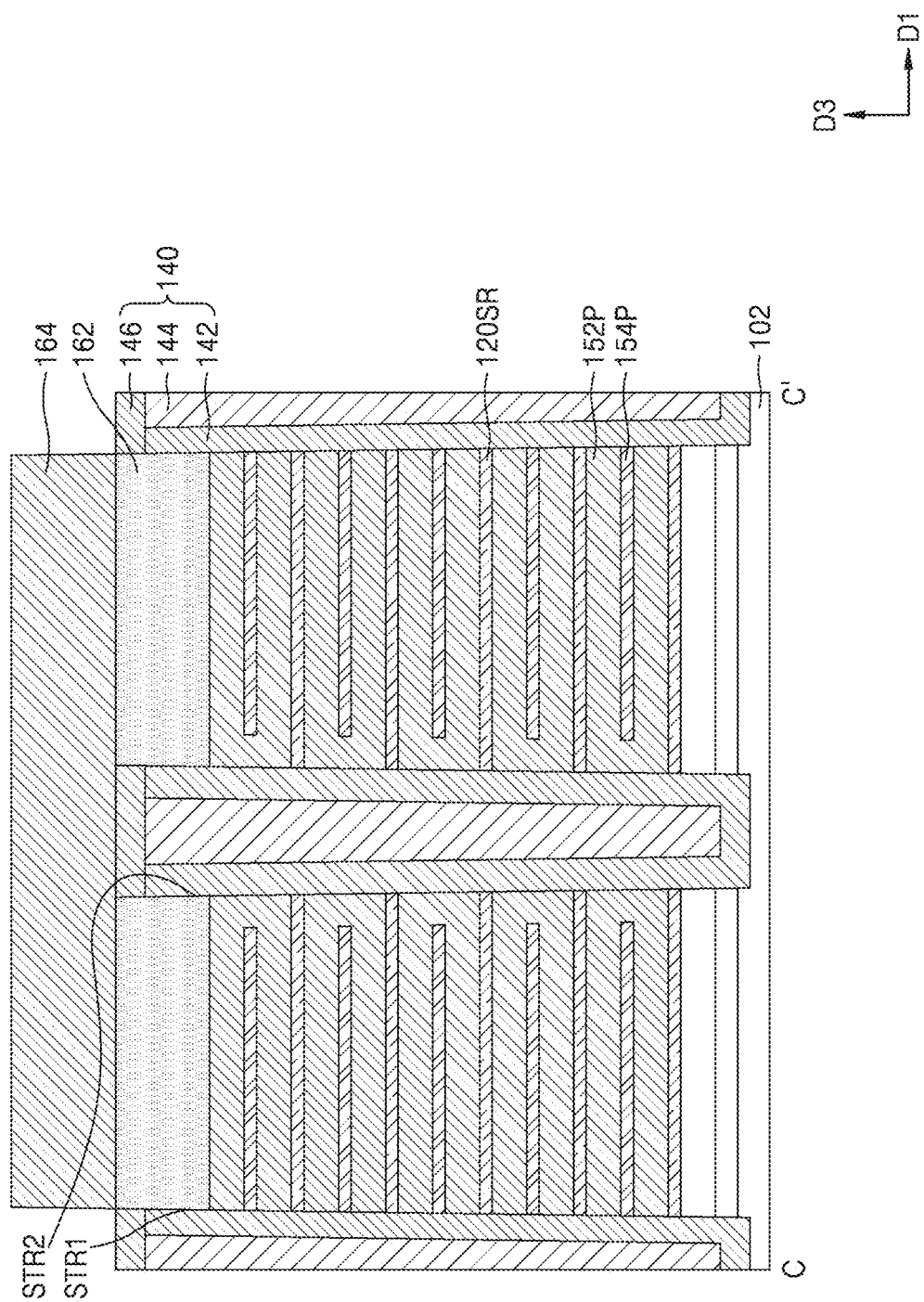

Referring now to FIGS. 11A and 11B, second buried insulating layers 162 covering a multi-layer structure of the plurality of monocrystalline bars 120SR, the plurality of support patterns 152P, and the plurality of separation insulating patterns 154P and filling the plurality of first stacked through holes STH1Ea, the plurality of second stacked through holes STH2Ea, and a plurality of second gaps 120G are formed, and then a third mask layer 164, which covers the second buried insulating layers 162 and exposes at least a portion of an upper surface of the buried structure 140, is formed. In some example embodiments, the second buried insulating layers 162 may include any one of or at least one of a silicon oxide, a silicon oxynitride layer, a carbon-contained silicon oxide layer, a carbon-contained silicon nitride layer, and a carbon-contained silicon oxynitride layer, and the third mask layer 164 may include a silicon nitride.

Figure 12A:
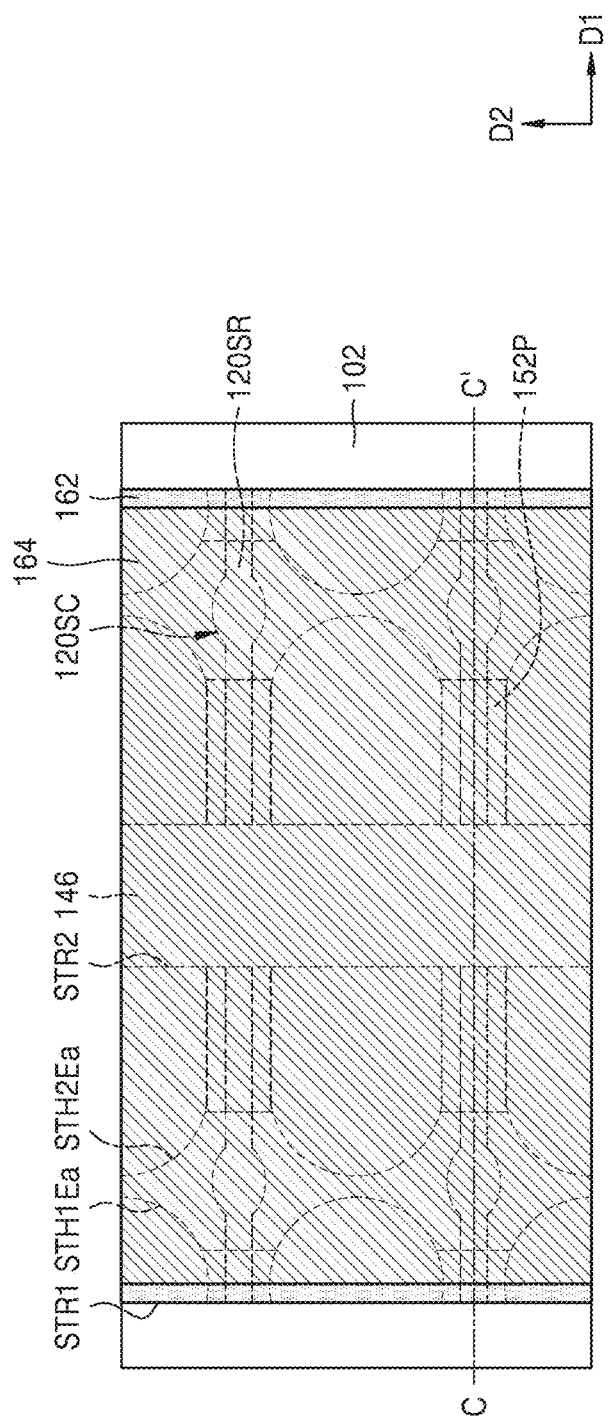
Figure 12B:
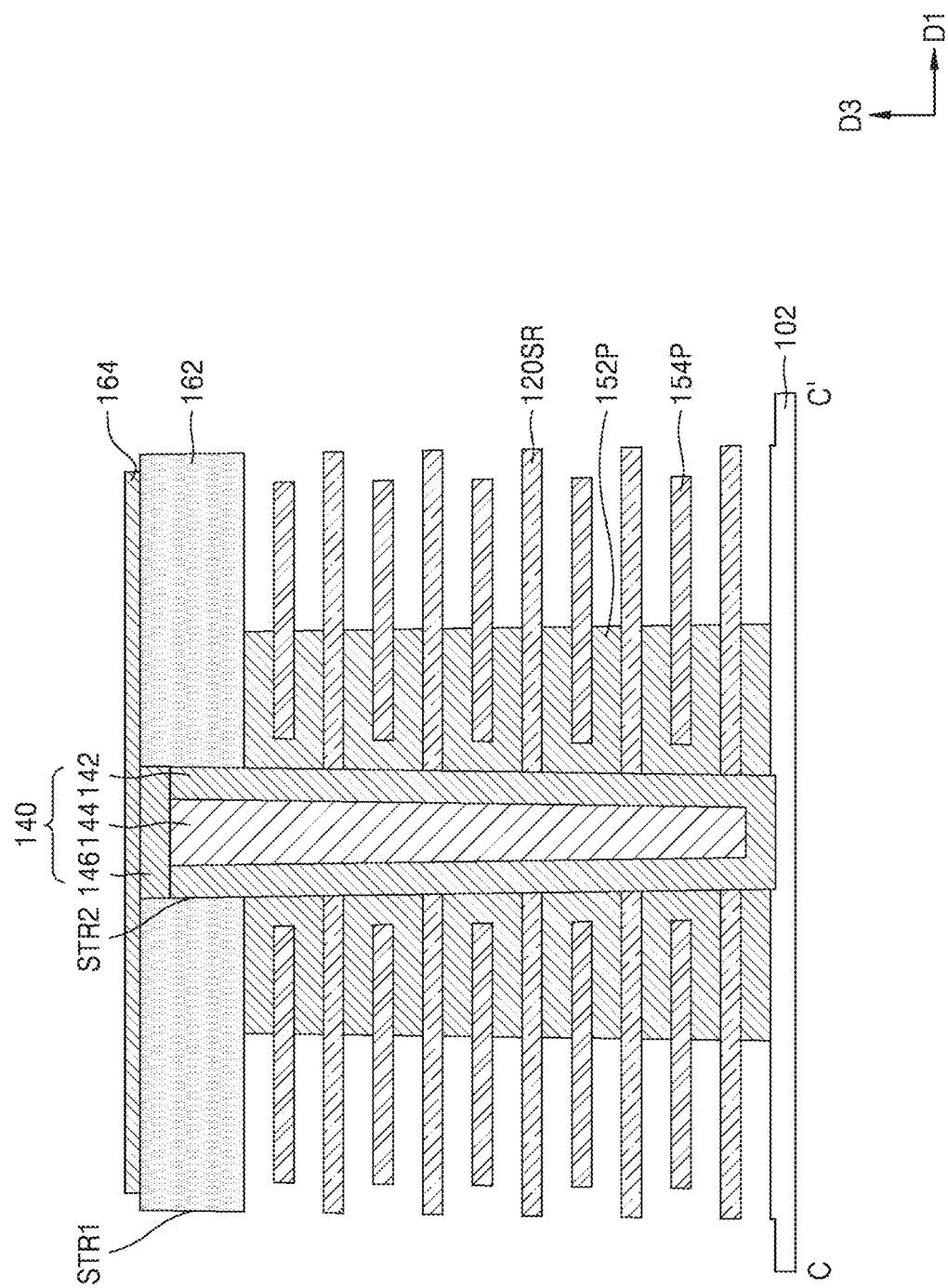

Referring to FIGS. 12A to 12B, the buried structure 140 filling the first recess STR1 is removed, and then a portion of the plurality of support patterns 152P is removed through the first recess STR1.

In a process of removing the portion of the plurality of support patterns 152P, a portion of the plurality of monocrystalline bars 120SR and a portion of the plurality of separation insulating patterns 154P may not be removed and be interposed in a remaining portion of the plurality of support patterns 152P, and a remaining portion of the plurality of monocrystalline bars 120SR and a remaining portion of the plurality of separation insulating patterns 154P may be exposed in a space from which the portion of the plurality of support patterns 152P has been removed.

For example, the portion of the plurality of monocrystalline bars 120SR and the portion of the plurality of separation insulating patterns 154P may be buried in the remaining portion of the plurality of support patterns 152P, and the remaining portion of the plurality of monocrystalline bars 120SR and the remaining portion of the plurality of separation insulating patterns 154P may protrude in the first horizontal direction (the D1 direction) toward the first recess STR1 from the remaining portion of the plurality of support patterns 152P.

In a process of removing the portion of the plurality of support patterns 152P, a portion of the plurality of separation insulating patterns 154P may also be removed. For example, among both ends of each of the plurality of separation insulating patterns 154P in the first horizontal direction (the D1 direction), a portion of one end far from the second recess STR2 may be removed so that an extending length of the plurality of separation insulating patterns 154P protruding in the first horizontal direction (the D1 direction) from the plurality of support patterns 152P is less than an extending length of the plurality of monocrystalline bars 120SR.

In a process of removing the buried structure 140 and the portion of the plurality of support patterns 152P, a portion of the third mask layer 164 may also be removed, thereby reducing a height and a width of the third mask layer 164.

Figure 13A:
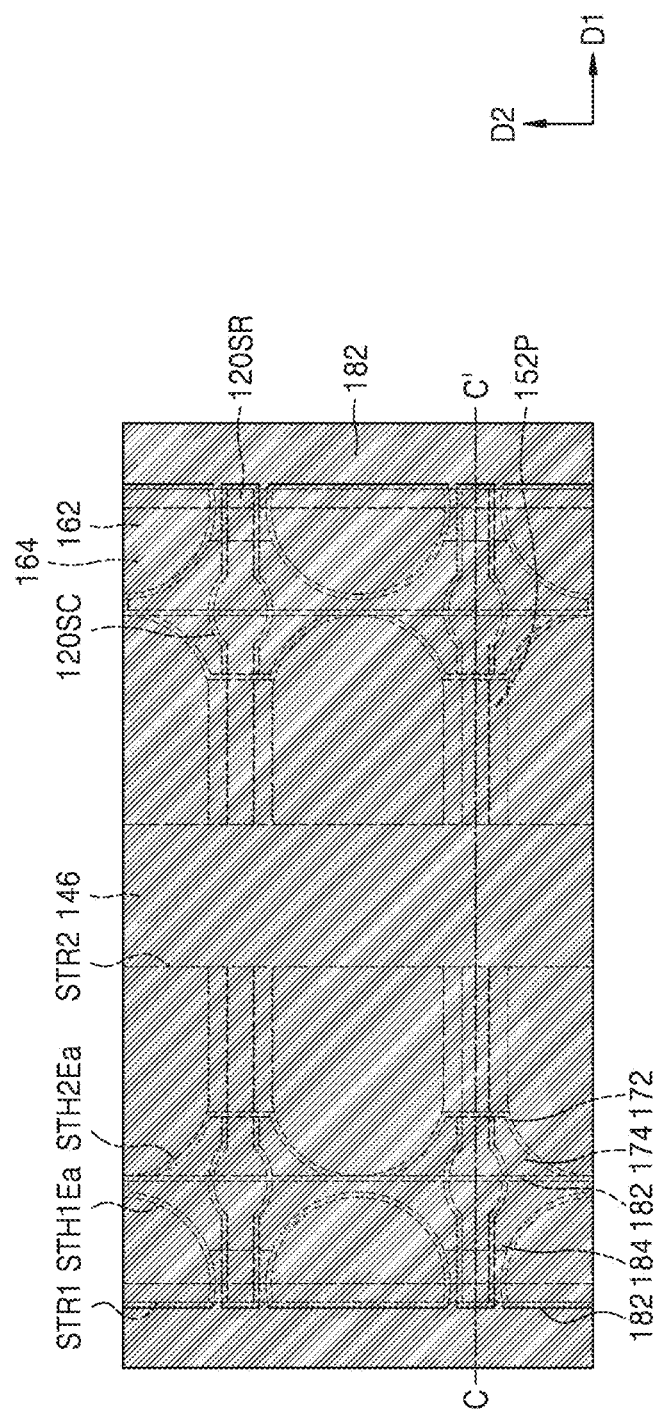
Figure 13B:
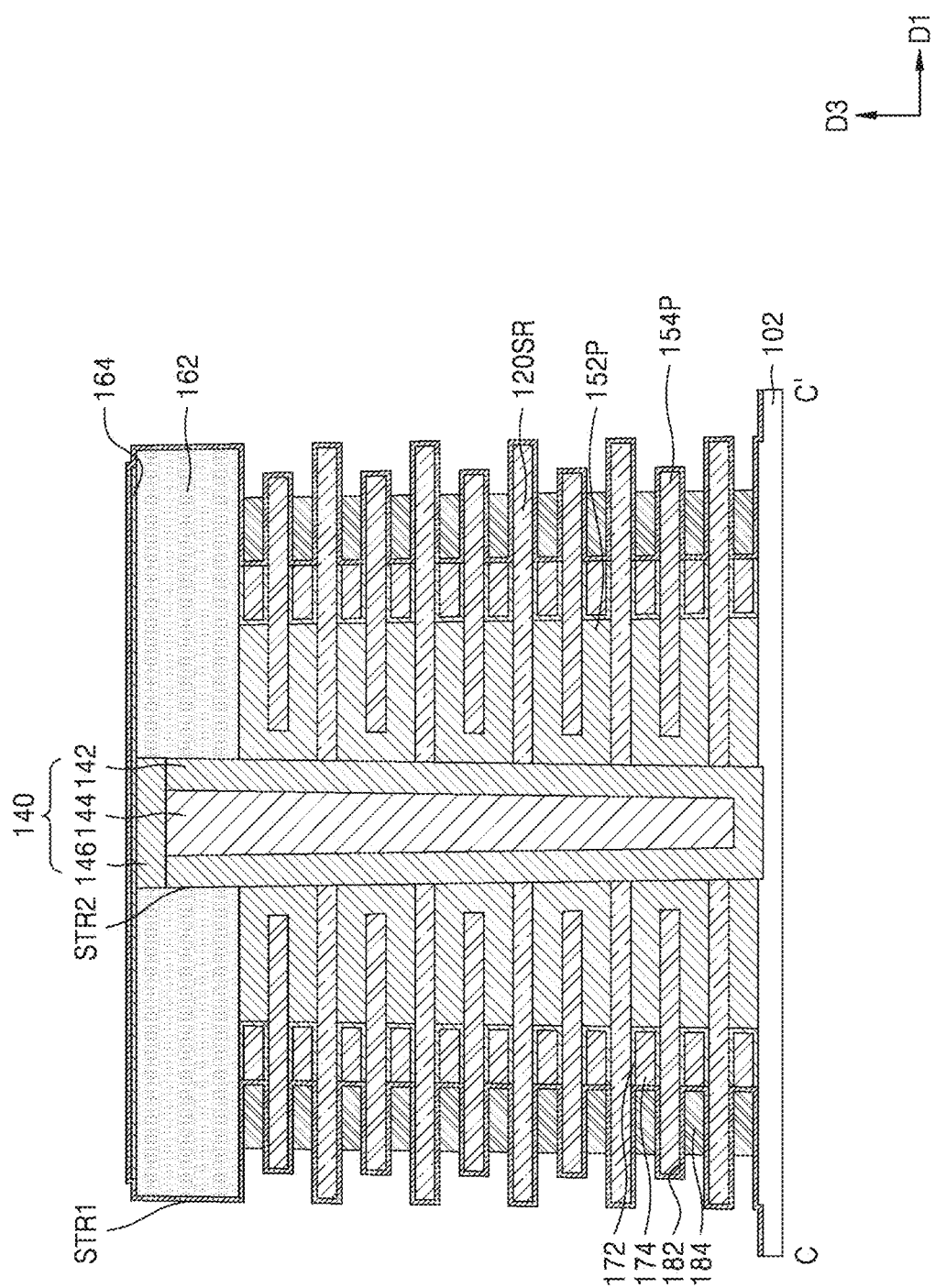

Referring to FIGS. 13A and 13B, a spacer liner material layer is formed on an exposed surface of FIGS. 12A and 12B, a spacer buried material layer covering the spacer liner material layer is formed, and then a portion of the spacer liner material layer and a portion of the spacer buried material layer are removed so that a spacer liner layer 172 covering an inner surface of a portion of a space between the plurality of monocrystalline bars 120SR and the plurality of separation insulating patterns 154P adjacent in the vertical direction (the D3 direction) and a spacer buried layer 174 filling the portion of the space are formed. In some example embodiments, the spacer liner layer 172 may include a silicon nitride, and the spacer buried layer 174 may include any one of a silicon oxide, a silicon oxynitride layer, a carbon-contained silicon oxide layer, a carbon-contained silicon nitride layer, and a carbon-contained silicon oxynitride layer.

After forming the spacer liner layer 172 and the spacer buried layer 174, a gate dielectric layer 182 covering a surface still exposed after forming the spacer liner layer 172 and the spacer buried layer 174, and a gate electrode layer 184 covering the gate dielectric layer 182 and filling a portion in an inner side of a remaining portion of the space between the plurality of monocrystalline bars 120SR and the plurality of separation insulating patterns 154P are formed. The gate electrode layer 184 may be formed by forming a gate electrode material layer, which covers the gate dielectric layer 182 and fills the first recess STR1, and then removing a portion of the gate electrode material layer so that a remaining portion of the gate electrode material layer remains only in the portion in the inner side of the remaining portion of the space between the plurality of monocrystalline bars 120SR and the plurality of separation insulating patterns 154P.

The gate dielectric layer 182 may include at least one selected from among a silicon oxide, and a high-k dielectric material and a ferroelectric material having a higher dielectric constant than the silicon oxide. In some example embodiments, the gate dielectric layer 182 may have a multi-layer structure of a first dielectric layer including a silicon oxide and a second dielectric layer including at least one selected from a high-k dielectric material and a ferroelectric material. For example, the high-k dielectric material and the ferroelectric material may include at least one selected from among a hafnium oxide (HfO), a hafnium silicate (HfSiO), a hafnium oxynitride (HfON), a hafnium silicon oxynitride (HfSiON), a lanthanum oxide (LaO), a lanthanum aluminum oxide (LaAlO), a zirconium oxide (ZrO), a zirconium silicate (ZrSiO), a zirconium oxynitride (ZrON), a zirconium silicon oxynitride (ZrSiON), a tantalum oxide (TaO), a titanium oxide (TiO), a barium strontium titanium oxide (BaSrTiO), a barium titanium oxide (BaTiO), a lead zirconate titanate (PZT), a strontium bismuth tantalate (SBT), a bismuth ferric oxide (BFO), a strontium titanium oxide (SrTiO), an yttrium oxide (YO), an aluminum oxide (AlO), and a lead scandium tantalum oxide (PbScTaO).

In some example embodiments, the gate electrode layer 184 may include a conductive barrier layer covering the gate dielectric layer 182 and a conductive filling layer covering the conductive barrier layer. The conductive barrier layer may include, for example, a metal, a conductive metal nitride, a conductive metal silicide, or a combination thereof. For example, the conductive barrier layer may include titanium nitride (TiN). The conductive filling layer may include, for example, doped silicon, ruthenium (Ru), a ruthenium oxide (RuO), platinum (Pt), a platinum oxide (PtO), iridium (Ir), an iridium oxide (Ir), a strontium ruthenium oxide (SRO), a barium strontium ruthenium oxide (BSRO), a calcium ruthenium oxide (CaRO), a barium ruthenium oxide (BaRuO), a lanthanum strontium cobalt oxide (La(Sr,Co)O), titanium (Ti), TiN, tungsten (W), a tungsten nitride (WN), tantalum (Ta), a tantalum nitride (TaN), a titanium aluminum nitride (TiAlN), a titanium silicon nitride (TiSiN), a tantalum aluminum nitride (TaAlN), a tantalum silicon nitride (TaSiN), or a combination thereof. In some example embodiments, the conductive filling layer may include W.

Although FIGS. 13A and 13B show that the gate dielectric layer 182 covers the surface of each of the substrate 102, the second buried insulating layers 162, and the third mask layer 164, inventive concepts is not limited thereto. In some example embodiments, the gate dielectric layer 182 may not cover at least a portion of the surface of each of the substrate 102, the second buried insulating layers 162, and the third mask layer 164.

Figure 14A:
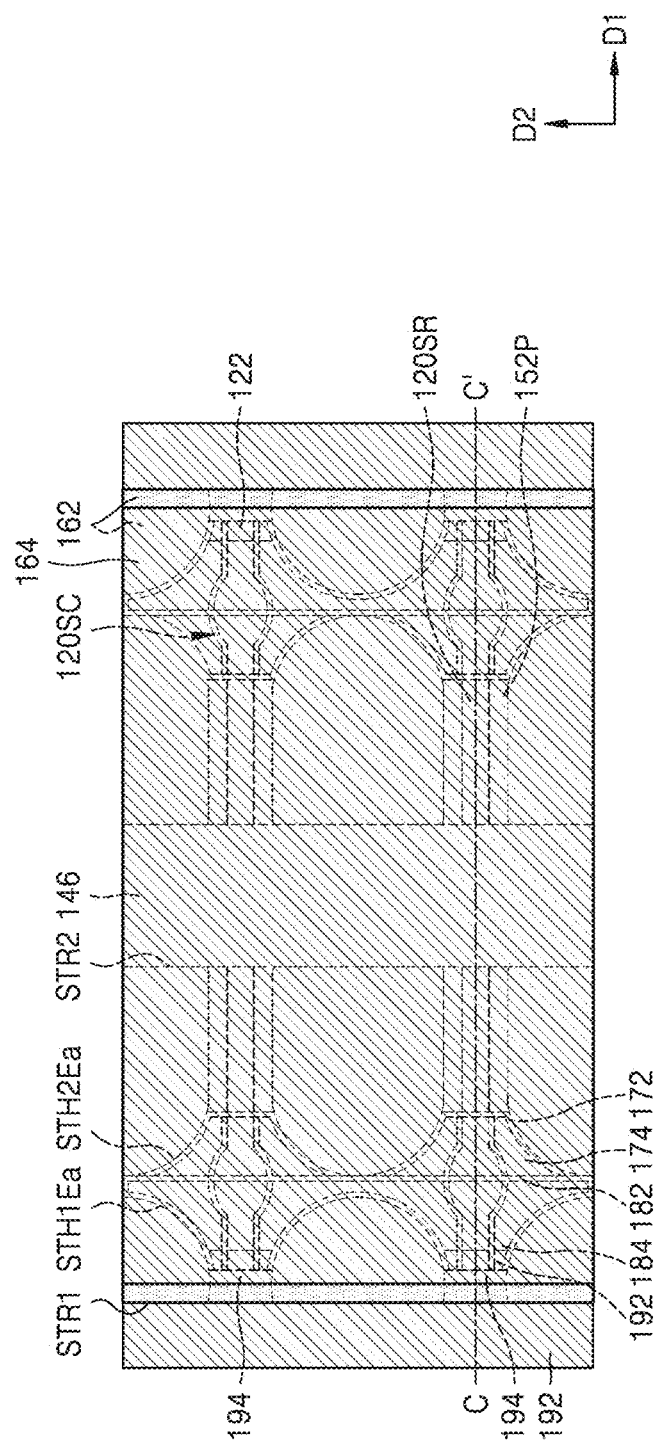
Figure 14B:
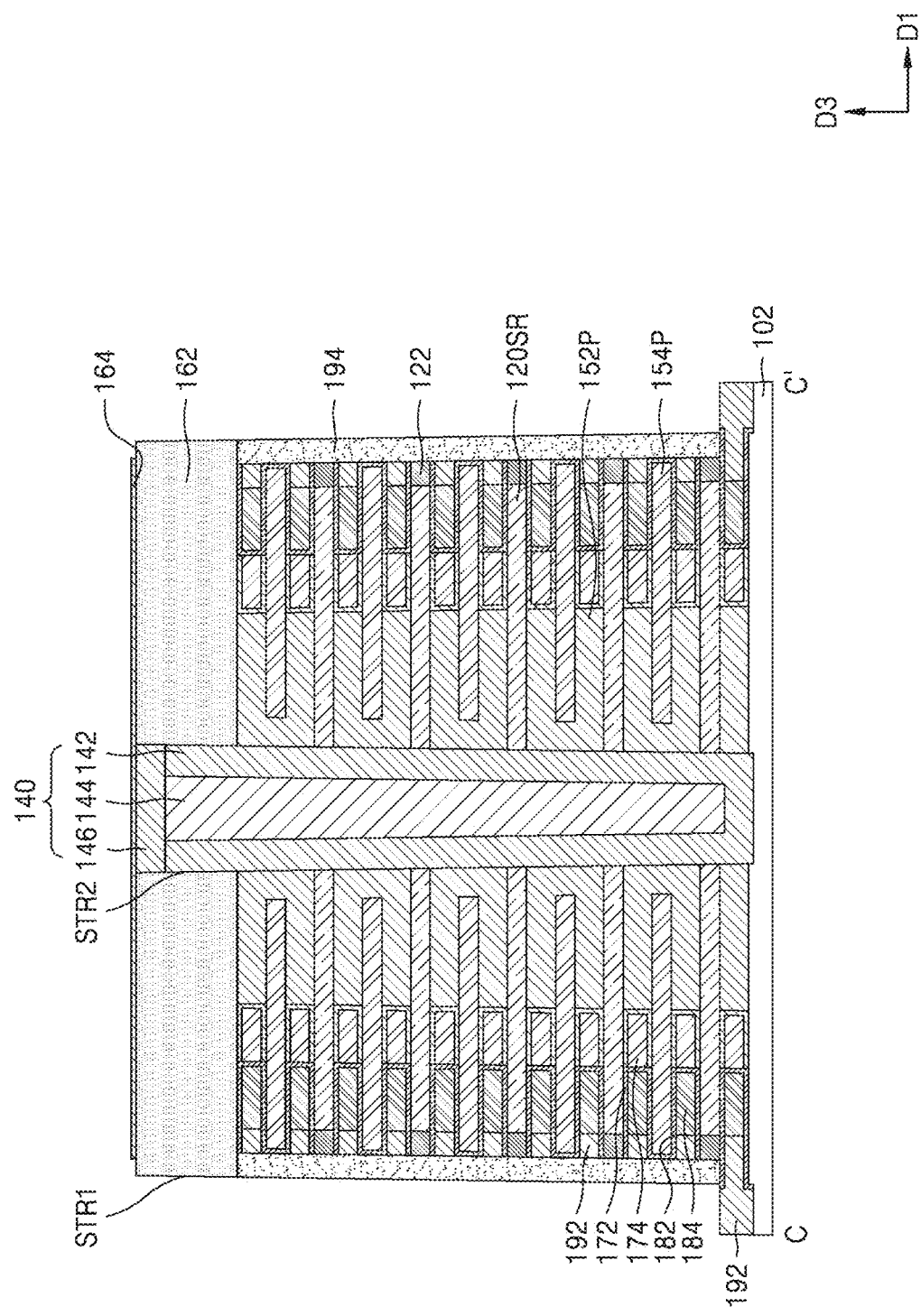
Figure 15A:
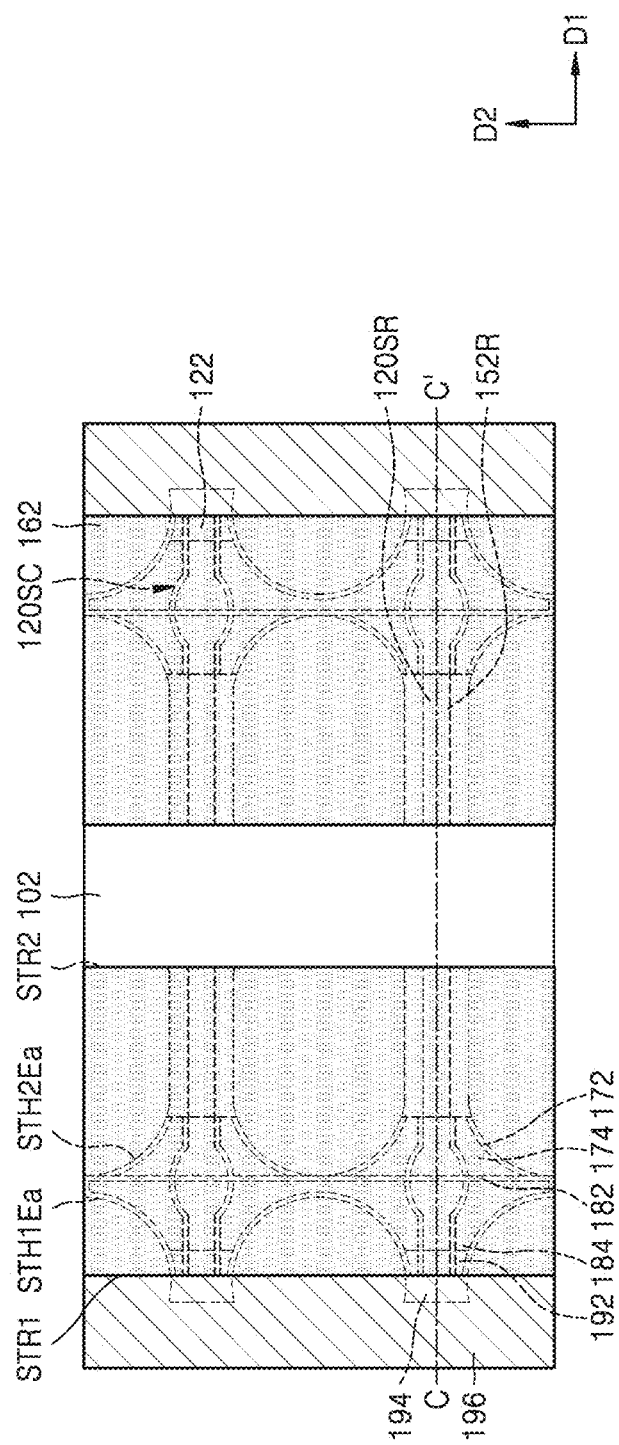
Figure 15B:
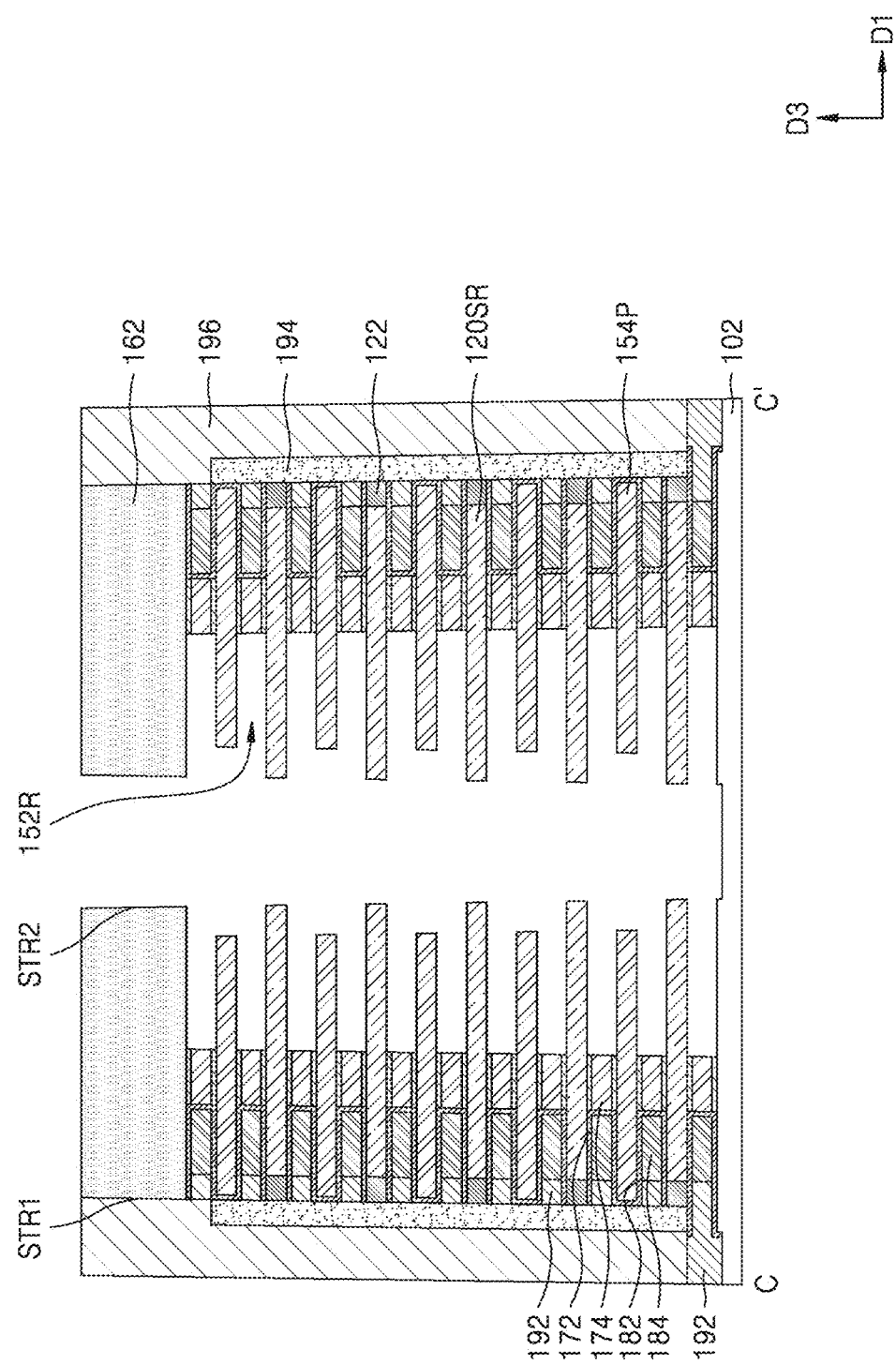

Referring to FIGS. 14A and 14B, a plurality of spacer capping layers 192 filling the space between the plurality of monocrystalline bars 120SR and the plurality of separation insulating patterns 154P in the vertical direction (the D3 direction) are formed, and a portion of the plurality of monocrystalline bars 120SR, which further protrudes than the plurality of separation insulating patterns 154P in the first horizontal direction (the D1 direction) from the plurality of support patterns 152P, and a portion of the gate dielectric layer 182 covering the further protruding portion are removed. Ends of the plurality of monocrystalline bars 120SR facing the first recess STR1 may be exposed. In some example embodiments, each of the plurality of spacer capping layers 192 may include a silicon nitride. In some example embodiments, a portion of the plurality of spacer capping layers 192 may cover the surface of the substrate 102, which is exposed through the bottom surface of the first recess STR1.

In some example embodiments, a plurality of first source-drain regions 122 may be formed by injecting impurities into the ends of the plurality of monocrystalline bars 120SR exposed through the first recess STR1.

Thereafter, a plurality of bit lines 194 coming in contact with the plurality of first source-drain regions 122 and filling spaces between the second buried insulating layers 162 filling the plurality of first stacked through holes STH1Ea are formed. The plurality of bit lines 194 may extend in the vertical direction (the D3 direction) along between the second buried insulating layers 162 filling the plurality of first stacked through holes STH1Ea and come in contact with the plurality of first source-drain regions 122 aligned in the vertical direction (the D3 direction), respectively. For example, each of the plurality of bit lines 194 may include any one of a doped semiconductor material such as impurity-doped silicon or impurity-doped germanium, a conductive metal nitride such as TiN or TaN, a metal such as W, Ti, or Ta, and a metal-semiconductor compound such as a tungsten silicide, a cobalt silicide, or a titanium silicide.

In some example embodiments, each of the plurality of bit lines 194 may include a conductive barrier layer coming in contact with a first source-drain region 122 and a conductive filling layer covering the conductive barrier layer. The conductive barrier layer may include, for example, a metal, a conductive metal nitride, a conductive metal silicide, or a combination thereof. For example, the conductive barrier layer may include TiN. The conductive filling layer may include, for example, doped silicon, Ru, RuO, Pt, PtO, Ir, IrO, SRO(SrRuO), BSRO((Ba,Sr)RuO), CRO(CaRuO), BaRuO, La(Sr,Co)O, Ti, TiN, W, WN, Ta, TaN, TiAlN, TiSiN, TaAlN, TaSiN, or a combination thereof. In some example embodiments, the conductive filling layer may include W.

Referring to FIGS. 14A to 15B, a third buried insulating layer 196 filling the first recess STR1 is formed, the third mask layer 164 is removed, and the buried structure 140 filling the second recess STR2 is removed. In some example embodiments, the third buried insulating layer 196 may include a silicon oxide. After removing the buried structure 140 filling the second recess STR2, a removal space 152R communicating with the second recess STR2 is formed by removing the plurality of support patterns 152P through the second recess STR2.

In a process of forming the removal space 152R, the plurality of monocrystalline bars 120SR and the plurality of separation insulating patterns 154P may not be removed so that a portion of the plurality of monocrystalline bars 120SR and a portion of the plurality of separation insulating patterns 154P are exposed in the removal space 152R.

That is, a portion of the plurality of monocrystalline bars 120SR and a portion of the plurality of separation insulating patterns 154P may be surrounded by the spacer liner layer 172 and the spacer buried layer 174, and a remaining portion of the plurality of monocrystalline bars 120SR and a remaining portion of the plurality of separation insulating patterns 154P may protrude in the first horizontal direction (the D1 direction) toward the second recess STR2 from the spacer liner layer 172 and the spacer buried layer 174.

In a process of removing the plurality of support patterns 152P, a portion of the plurality of separation insulating patterns 154P may also be removed. For example, because a portion of the other end facing the second recess STR2 among both ends of each of the plurality of separation insulating patterns 154P in the first horizontal direction (the D1 direction) is removed, an extending length of the plurality of separation insulating patterns 154P protruding in the first horizontal direction (the D1 direction) toward the second recess STR2 from the spacer liner layer 172 and the spacer buried layer 174 may be less than an extending length of the plurality of monocrystalline bars 120SR.

Figure 16A:
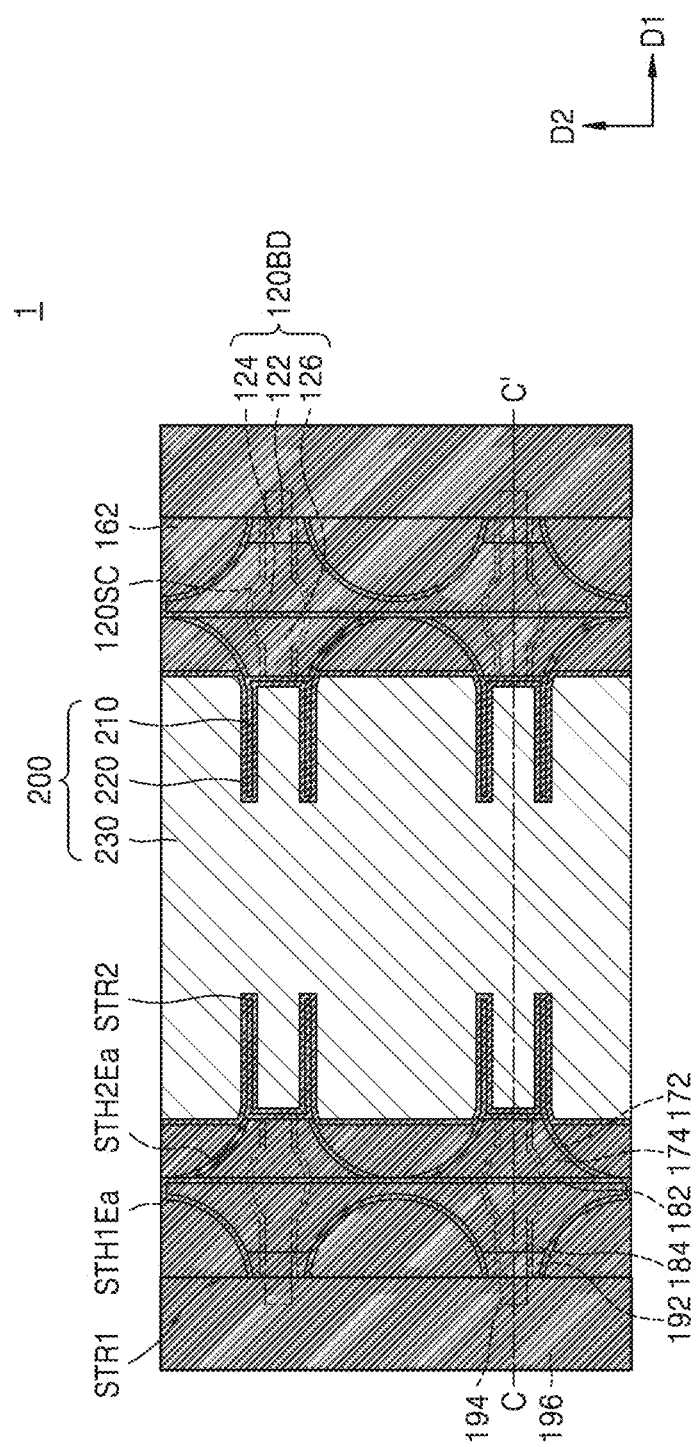
FIGS. 16A and 16B are schematic diagrams of a semiconductor memory device according to some example embodiments of inventive concepts.
Figure 16B:
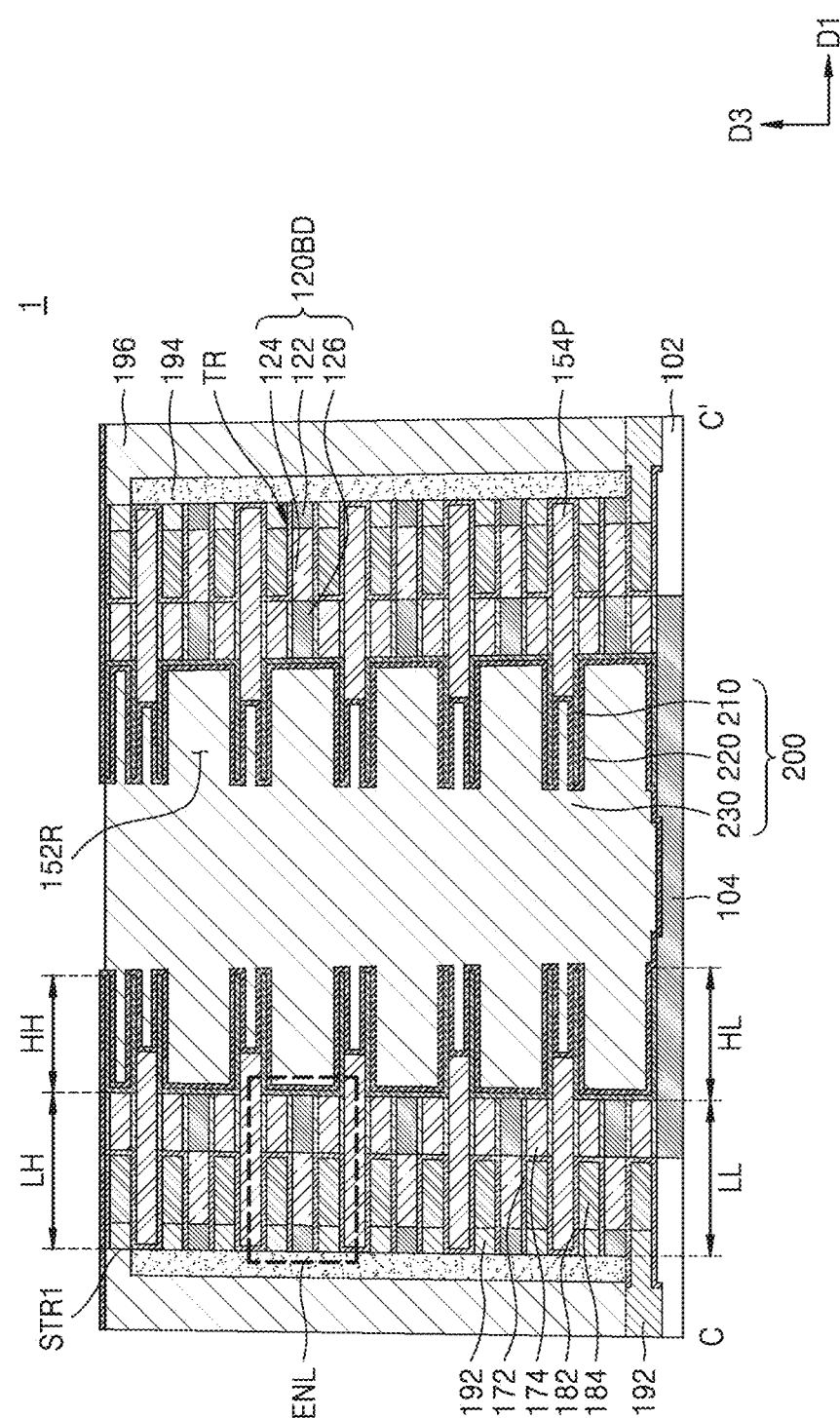

FIGS. 16A and 16B are schematic diagrams of a semiconductor memory device 1 according to some example embodiments of inventive concepts. Particularly, FIG. 16A is a top view of the semiconductor memory device 1, and FIG. 16B is a cross-sectional view taken along line C-C' of FIG. 16A.

Referring to FIGS. 16A to 16B, the portion of the plurality of monocrystalline bars 120SR protruding in the first horizontal direction (the D1 direction) toward the second recess STR2 from the spacer liner layer 172 and the spacer buried layer 174 is removed. In some example embodiments, a plurality of second source-drain regions 126 may be formed by injecting impurities into the other ends of the plurality of monocrystalline bars 120SR, which are exposed through the second recess STR2. A portion of the plurality of monocrystalline bars 120SR, which remains by forming the plurality of second source-drain regions 126, may be called a plurality of monocrystalline channel layers 124. A first source-drain region 122, a monocrystalline channel layer 124, and a second source-drain region 126 may be called a transistor body part 120BD. The transistor body part 120BD may entirely include a monocrystalline semiconductor material. For example, each of the first source-drain region 122, the monocrystalline channel layer 124, and the second source-drain region 126 may include a monocrystalline semiconductor material. The transistor body part 120BD, the gate dielectric layer 182, and the gate electrode layer 184 may form or correspond to a cell transistor TR.

The semiconductor memory device 1 may include an information storage element connected to the second source-drain region 126. The information storage element may be a memory element in which data may be stored. In some example embodiments, the information storage element may be or may include a cell capacitor; however, example embodiments are not limited thereto. For example, the information storage element may be or include a storage element such as a memristor and/or a non-linear storage element having hysteresis properties.

A lower electrode material layer conformally covering an exposed surface in the second recess STR2 is formed The lower electrode material layer may cover, e.g. conformally cover the surfaces of the second source-drain region 126, the spacer liner layer 172, the spacer buried layer 174, and the separation insulating pattern 154P. Thereafter, a plurality of lower electrode layers 210 having a hollow cylindrical shape with an open part facing the second recess STR2 in the first horizontal direction (the D1 direction) and a closed part facing the second source-drain region 126 in the first horizontal direction (the D1 direction) may be formed by removing a portion of the lower electrode material layer, which covers the other ends of the plurality of separation insulating patterns 154P facing the second recess STR2.

In some example embodiments, the surfaces of the other ends of the plurality of separation insulating patterns 154P may be exposed, and then a portion of the other ends of the plurality of separation insulating patterns 154P may be removed. In some example embodiments, a portion of the plurality of separation insulating patterns 154P may not be removed.

A capacitor dielectric layer 220 conformally covering the plurality of lower electrode layers 210 and an upper electrode layer 230 covering the capacitor dielectric layer 220 and filling the second recess STR2 may be formed to form the semiconductor memory device 1 including a cell capacitor 200 including a lower electrode layer 210, the capacitor dielectric layer 220, and the upper electrode layer 230.

In some example embodiments, the information storage element included in the semiconductor memory device 1 may include a memory element using a magnetic tunnel junction pattern or a memory element using a variable resistor including a phase change material. The magnetic tunnel junction pattern may include a fixed layer having a magnetization direction fixed to one direction, a free layer having a magnetization direction changeable in parallel to or in semi-parallel to the magnetization direction of the fixed layer, and a tunnel barrier layer between the fixed layer and the free layer. The variable resistor may include a material of which a reversible phase change between a crystalline structure and an amorphous structure is possible according to temperatures. For example, the variable resistor may include a compound in which at least one of tellurium (Te) and selenium (Se) that are chalcogen elements is combined with at least one of Ge, antimony (Sb), bismuth (Bi), lead (Pb), tin (Sn), silver (Ag), arsenic (As), sulfur (S), Si, indium (In), Ti, gallium (Ga), phosphorus (P), oxygen (O), and carbon (C). In some example embodiments, the variable resistor may include at least one of GeSbTe, GeTeAs, SbTeSe, GeTe, SbTe, SeTeSn, GeTeSe, SbSeBi, GeBiTe, GeTeTi, InSe, GaTeSe, and InSbTe or have a superlattice structure in which a layer including Ge and a layer not including Ge are alternately stacked (e.g., a structure in which a GeTe layer and an SbTe layer are alternately stacked).

The capacitor dielectric layer 220 may cover at least a portion of an inner surface and an outer surface of each of the plurality of cylindrical shaped lower electrode layers 210. In some example embodiments, the capacitor dielectric layer 220 may entirely cover the inner surface of each of the plurality of cylindrical shaped lower electrode layers 210 and cover a portion of the outer surface thereof. In some example embodiments, the capacitor dielectric layer 220 may entirely cover the inner surface and the outer surface of each of the plurality of cylindrical shaped lower electrode layers 210. The upper electrode layer 230 may fill the inside of each of the plurality of cylindrical shaped lower electrode layers 210. For example, each of the plurality of cylindrical shaped lower electrode layers 210 may have a 90-degree rotated U shaped vertical cross-section of which an open part faces a direction that is opposite to the second source-drain region 126, e.g., the open part faces the upper electrode layer 230.

The lower electrode layer 210 may include a metal, a conductive metal nitride, a conductive metal silicide, or a combination thereof. For example, the lower electrode layer 210 may include a high melting point metal layer such as at least one of cobalt (Co), Ti, nickel (Ni), W, or molybdenum (Mo). For example, the lower electrode layer 210 may include a metal nitride layer such as at least one of TiN layer, a TiSiN layer, a TiAlN layer, a TaN layer, a TaSiN layer, a TaAlN layer, or a WN layer.

The capacitor dielectric layer 220 may include at least one selected from among a high-k dielectric material and a ferroelectric material having a higher dielectric constant than a silicon oxide. For example, the capacitor dielectric layer 220 may include at least one of a metal oxide and a perovskite-structured dielectric material. In some example embodiments, the capacitor dielectric layer 220 may include at least one material selected from among HfO, HfSiO, HfON, HfSiON, LaO, LaAlO, ZrO, ZrSiO, ZrON, ZrSiON, TaO, TiO, BaSrTiO, BaTiO, PZT, SBT, BFO, SrTiO, YO, AlO, and PbScTaO.

The upper electrode layer 230 may include, for example, doped silicon, Ru, RuO, Pt, PtO, Ir, IrO, SRO(SrRuO), BSRO((Ba,Sr)RuO), CRO(CaRuO), BaRuO, La(Sr,Co)O, Ti, TiN, W, WN, Ta, TaN, TiAlN, TiSiN, TaAlN, TaSiN, or a combination of any of thereof. In some example embodiments, the upper electrode layer 230 may include W.

Each of the first recess STR1 and the second recess STR2 may have a tapered shape having a width gradually decreasing toward the substrate 102. Therefore, ends of a plurality of transistor body parts apart from each other in the vertical direction (the D3 direction), which face the first recess STR1, may be aligned in an inclined direction other than the vertical direction (the D3 direction). A boundary between each of the plurality of transistor body parts 120BD and each of a plurality of cell capacitors 200 may correspond to one end of each of the plurality of support patterns 152P of which a portion has been removed, the one end facing the first recess STR1 and being described with reference to FIGS. 12A and 12B. Because the plurality of support patterns 152P are removed through the first recess STR1, the boundary between each of the plurality of transistor body parts 120BD and each of the plurality of cell capacitors 200 may also correspond to a slope of an inner wall of the first recess STR1. Therefore, a length between both ends of each of the plurality of transistor body parts 120BD in the first horizontal direction (the D1 direction) may have an almost same value. For example, a length LH of a transistor body part 120BD far from the substrate 102 may be almost the same as a length LL of a transistor body part 120BD close to the substrate 102. Therefore, a plurality of cell transistors TR formed by the plurality of transistor body parts 120BD included in the semiconductor memory device 1 may have an almost uniform operating characteristic.

Because lengths of the plurality of lower electrode layers 210 in the plurality of cell capacitors 200 in the first horizontal direction (the D1 direction), i.e., heights of the plurality of lower electrode layers 210 in the plurality of cell capacitors 200 with reference to the plurality of transistor body parts 120BD, are determined based on the slope of the inner wall of the first recess STR1 and a slope of an inner wall of the second recess STR2, a height HH of a lower electrode layer 210 in a cell capacitor 200 far from the substrate 102 may be less than a height HL of a lower electrode layer 210 in a cell capacitor 200 close to the substrate 102.

The semiconductor memory device 1 may have the plurality of bit lines 194 spaced apart from each other in each of the first horizontal direction (the D1 direction) and the second horizontal direction (the D2 direction) and extending in parallel to each other in the vertical direction (the D3 direction). The plurality of transistor body parts 120BD may be spaced apart from each other in each of the second horizontal direction (the D2 direction) and the vertical direction (the D3 direction) and extend in parallel to each other in the first horizontal direction (the D1 direction). Each of the plurality of transistor body parts 120BD may include a first source-drain region 122, a monocrystalline channel layer 124, and a second source-drain region 126 sequentially arranged in the first horizontal direction (the D1 direction), and the first source-drain region 122 may be connected to any one of the plurality of bit lines 194. Each of the plurality of transistor body parts 120BD may be arranged at a first horizontal direction (the D1 direction) side from the bit line 194 to which the first source-drain region 122 is connected. The plurality of cell capacitors 200 may be connected to the plurality of second source-drain regions 126 in the plurality of transistor body parts 120BD, respectively. A transistor body part 120BD and a cell capacitor 200 connected to each other may be sequentially arranged in the first horizontal direction (the D1 direction) from a bit line 194 to which a first source-drain region 122 in the transistor body part 120BD is connected. For example, a bit line 194 and a cell capacitor 200 may be arranged at opposite sides in the first horizontal direction (the D1 direction) from a transistor body part 120BD connected thereto.

Gate electrode layers 184 may be spaced apart from each other in each of the first horizontal direction (the D1 direction) and the vertical direction (the D3 direction) and extend in parallel to each other in the second horizontal direction (the D2 direction). In some example embodiments, the gate electrode layers 184 may have a double gate shape respectively covering an upper surface and a lower surface of a monocrystalline channel layer 124. In some example embodiments, the gate electrode layers 184 may have a gate all around shape integrally covering the upper surface and the lower surface of the monocrystalline channel layer 124 and both side surfaces of the monocrystalline channel layer 124 in the second horizontal direction (the D2 direction). The gate dielectric layer 182 may be between the gate electrode layer 184 and the monocrystalline channel layer 124. When the gate electrode layers 184 have a double gate shape, the gate dielectric layer 182 may cover the upper surface and the lower surface of the monocrystalline channel layer 124. When the gate electrode layers 184 have a gate all around shape, the gate dielectric layer 182 may integrally cover the upper surface and the lower surface of the monocrystalline channel layer 124 and both side surfaces of the monocrystalline channel layer 124 in the second horizontal direction (the D2 direction).

Each of the plurality of transistor body parts 120BD may have the extension part 120SC having a planar shape convexly protruding in the second horizontal direction (the D2 direction) at an intermediate part thereof in the first horizontal direction (the D1 direction). The extension part 120SC may have a relatively larger width in the second horizontal direction (the D2 direction) than a remaining part of the transistor body part 120BD. A portion of the monocrystalline channel layer 124 may be at least a portion of the extension part 120SC. The extension part 120SC may be at least a portion of the monocrystalline channel layer 124 or be at least a portion of the monocrystalline channel layer 124 and a portion of the second source-drain region 126. By the extension part 120SC having a relatively larger width in the second horizontal direction (the D2 direction), the cell transistor TR including the transistor body part 120BD, the gate dielectric layer 182, and the gate electrode layer 184 may have an effect that a channel width is substantially increased.

Each of the plurality of cell capacitors 200 may include the lower electrode layer 210, the capacitor dielectric layer 220, and the upper electrode layer 230. The lower electrode layer 210 may be connected to the second source-drain region 126. The lower electrode layer 210 may have a hollow cylindrical shape with a closed part facing the second source-drain region 126 and an open part facing a direction that is opposite to the second source-drain region 126. The lower electrode layer 210 may have a 90-degree rotated U shaped vertical cross-section with an open part facing the upper electrode layer 230 and a closed part facing the second source-drain region 126.

The transistor body part 120BD and the cell capacitor 200 may be sequentially arranged in the first horizontal direction (the D1 direction) from the bit line BL. The cell transistor TR including the transistor body part 120BD, the gate dielectric layer 182, and the gate electrode layer 184 and the cell capacitor 200 including the lower electrode layer 210, the capacitor dielectric layer 220, and the upper electrode layer 230 may form one memory cell.

The plurality of monocrystalline channel layers 124 in the plurality of transistor body parts 120BD included in the semiconductor memory device 1 according to inventive concepts are a portion of the plurality of monocrystalline semiconductor layers 120 described with reference to FIGS. 1A and 1B. As described with reference to FIGS. 1A and 1B, because the plurality of monocrystalline semiconductor layers 120 are alternately stacked and formed with the plurality of sacrificial layers 110 including a monocrystalline semiconductor material on the substrate 102 including a monocrystalline semiconductor material, the plurality of monocrystalline semiconductor layers 120 may have a good (e.g. improved) monocrystalline characteristic in a forming operation, and thus, the monocrystalline channel layer 124 may also have a good (e.g. improved) monocrystalline characteristic.

Therefore, a plurality of transistors included in the semiconductor memory device 1 according to inventive concepts may have an improved and/or uniform operating characteristic.

Figure 17A:
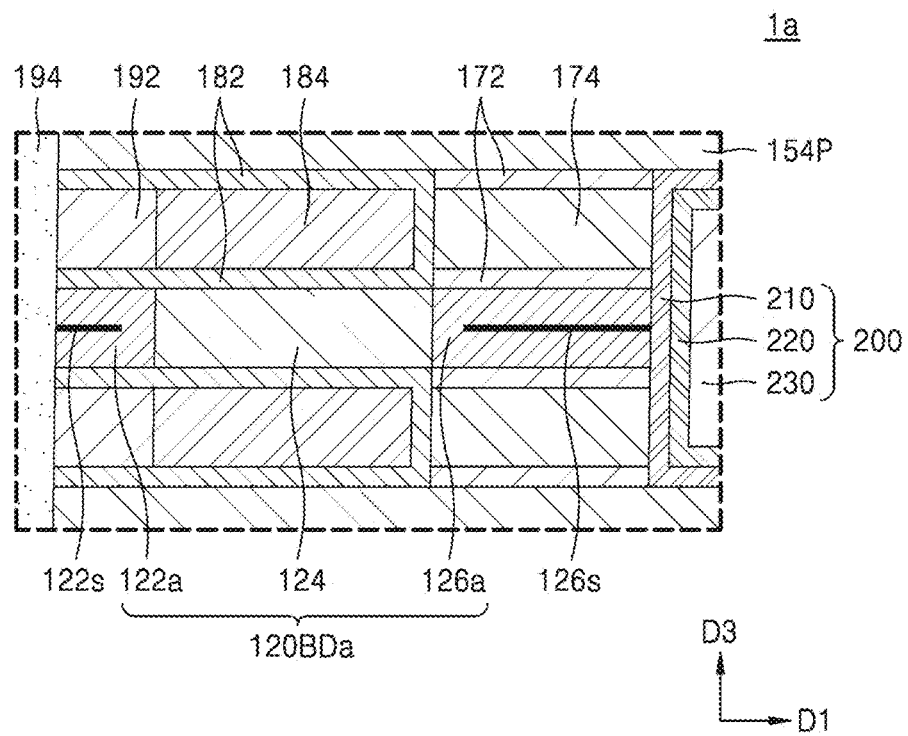
FIGS. 17A to 17C are magnified cross-sectional views of portions of semiconductor memory devices according to some example embodiments of inventive concepts, respectively.
Figure 17B:
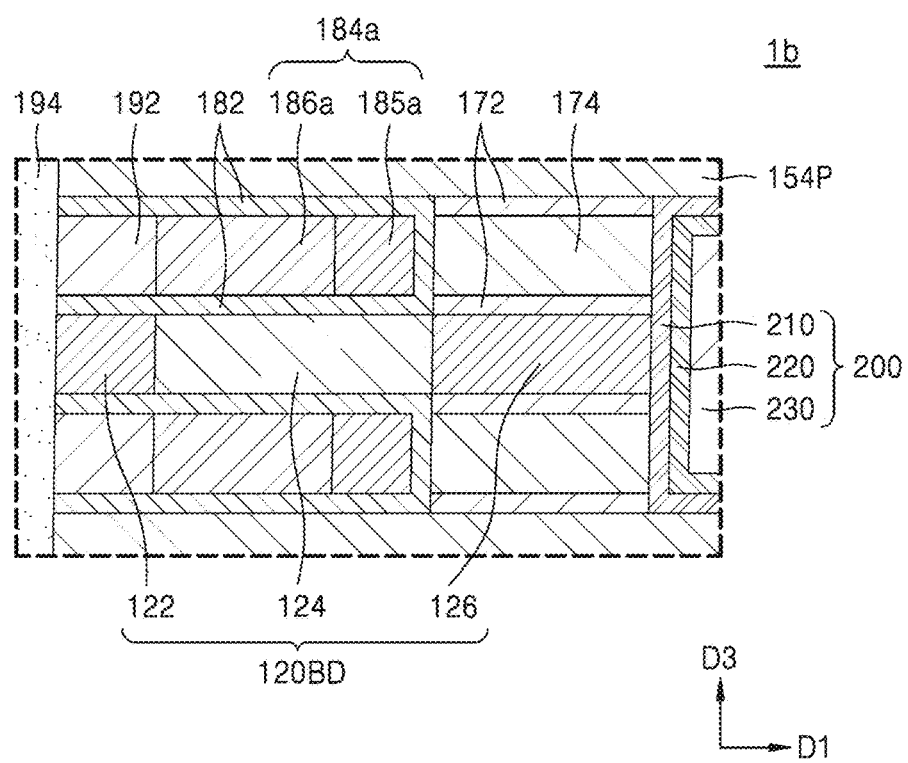
Figure 17C:
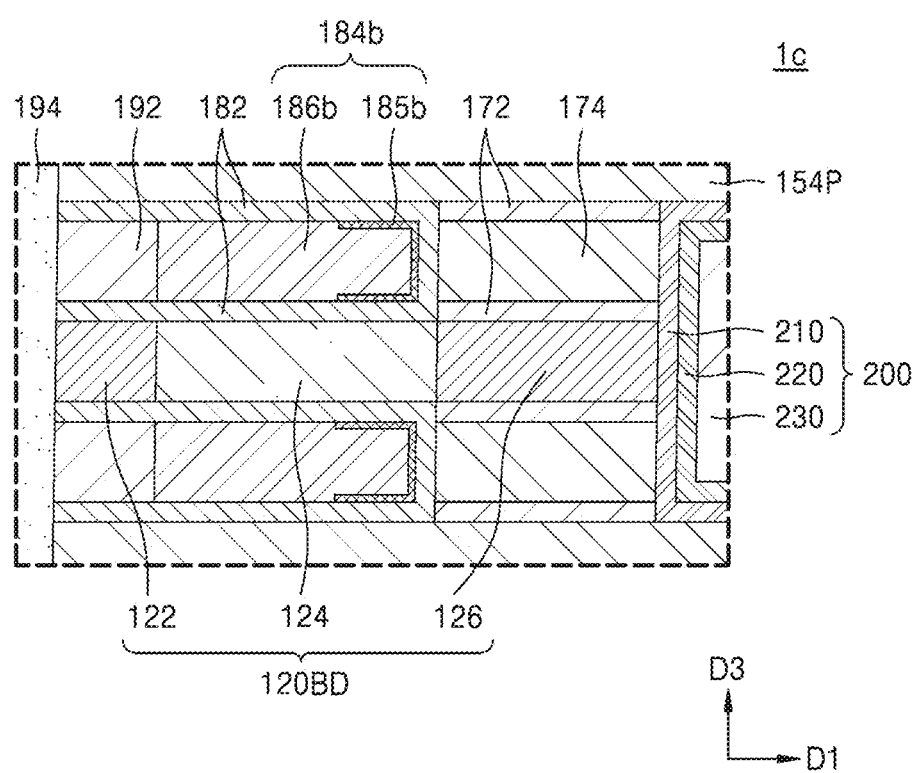

FIGS. 17A to 17C are magnified cross-sectional views of portions of semiconductor memory devices according to some example embodiments of inventive concepts, respectively. Particularly, FIGS. 17A to 17C are magnified cross-sectional views of a region ENL of FIG. 16B.

Referring to FIG. 17A, a semiconductor memory device 1a may have a transistor body part 120BDa instead of the transistor body part 120BD included in the semiconductor memory device 1 of FIGS. 16A and 16B. The transistor body part 120BDa may include a first source-drain region 122a, a monocrystalline channel layer 124, and the second source-drain region 126a. Each of the first source-drain region 122a and the second source-drain region 126a may include an impurity-doped polycrystalline semiconductor material.

The first source-drain region 122a may be formed by removing a portion of one end of each of the plurality of monocrystalline bars 120SR, which is exposed through the first recess STR1 in FIGS. 14A and 14B, and then filling a semiconductor material in the removed space. For example, the first source-drain region 122a may include impurity-doped polysilicon. The first source-drain region 122a may have a first seam 122s extending in the first horizontal direction (the D1 direction) toward the inside of the first source-drain region 122a from the bit line 194.

The second source-drain region 126a may be formed by removing a portion of one end of each of the plurality of monocrystalline bars 120SR, which is exposed through the second recess STR2 in FIGS. 16A and 16B, and then filling a semiconductor material in the removed space. For example, the second source-drain region 126a may include impurity-doped polysilicon. The second source-drain region 126a may have a second seam 126s extending in the first horizontal direction (the D1 direction) toward the inside of the second source-drain region 126a from the lower electrode layer 210.

Referring to FIG. 17B, a semiconductor memory device 1b may have a gate electrode layer 184a instead of the gate electrode layer 184 included in the semiconductor memory device 1 described with reference to FIGS. 16A and 16B. The gate electrode layer 184a may include a work function control layer 185a and a gate body layer 186a. The work function control layer 185a may be arranged to be far from the bit line 194, and the gate body layer 186a may be arranged to be close to the bit line 194.

The gate electrode layer 184a may be formed by sequentially forming the work function control layer 185a and the gate body layer 186a instead of forming the gate electrode layer 184 in FIGS. 13A and 13B. For example, the work function control layer 185a may include impurity-doped polysilicon. For example, the gate body layer 186a may include Ru, RuO, Pt, PtO, Ir, IrO, SRO(SrRuO), BSRO((Ba,Sr)RuO), CRO(CaRuO), BaRuO, La(Sr,Co)O, Ti, TiN, W, WN, Ta, TaN, TiAlN, TiSiN, TaAlN, TaSiN, or a combination thereof. In some example embodiments, the gate body layer 186a may include W.

Referring to FIG. 17C, a semiconductor memory device 1c may have a gate electrode layer 184b instead of the gate electrode layer 184 included in the semiconductor memory device 1 described with reference to FIGS. 16A and 16B. The gate electrode layer 184b may include a work function control layer 185b and a gate body layer 186b. The work function control layer 185b may be arranged to surround a one end part of the gate body layer 186b from a part far from the bit line 194. The one end part of the gate body layer 186b far from the bit line 194 may have a less width and a less height than a remaining part of the gate body layer 186b.

The gate electrode layer 184b may be formed by sequentially forming the work function control layer 185b and the gate body layer 186b instead of forming the gate electrode layer 184 in FIGS. 13A and 13B.

Figure 18A:
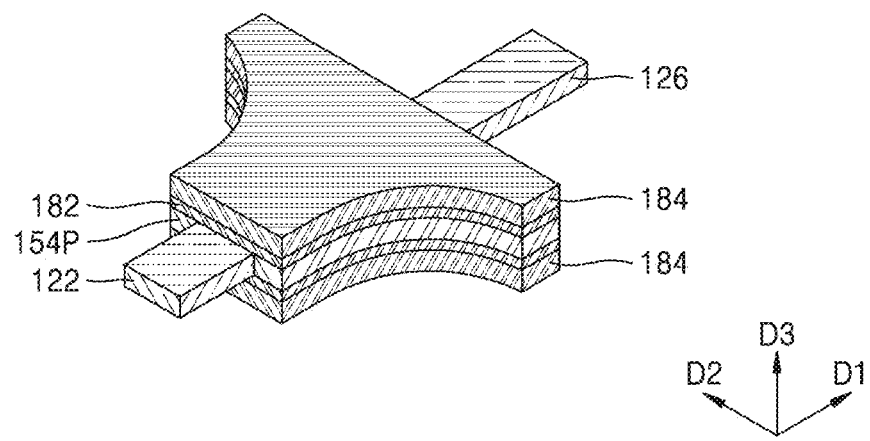
FIGS. 18A to 18C are magnified perspective views and top views of portions of semiconductor memory devices according to some example embodiments of inventive concepts, respectively.
Figure 18A:
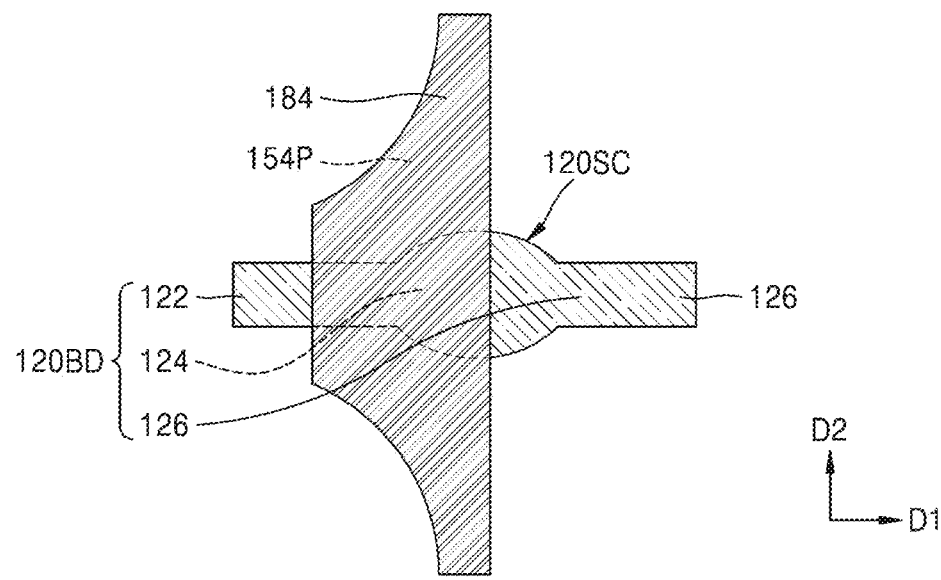
Figure 18B:
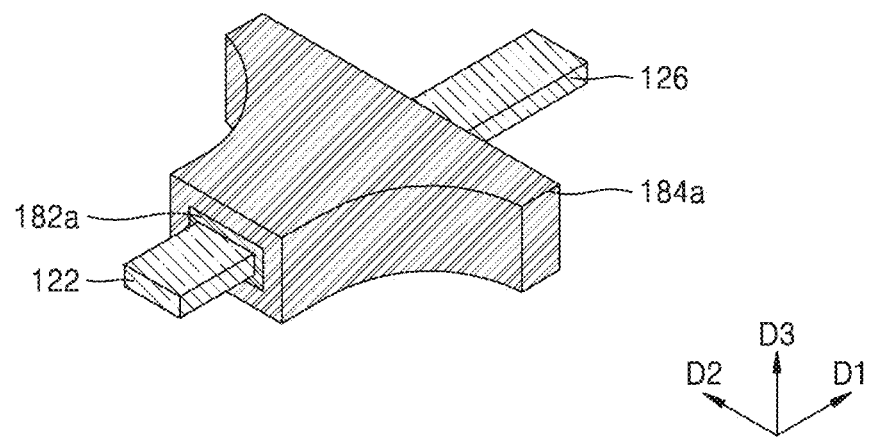
Figure 18B:
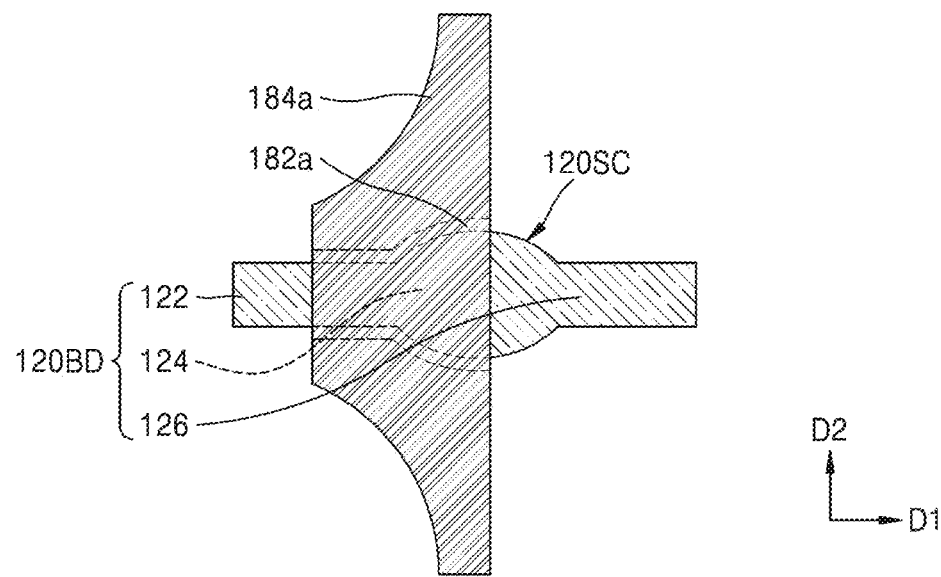
Figure 18C:
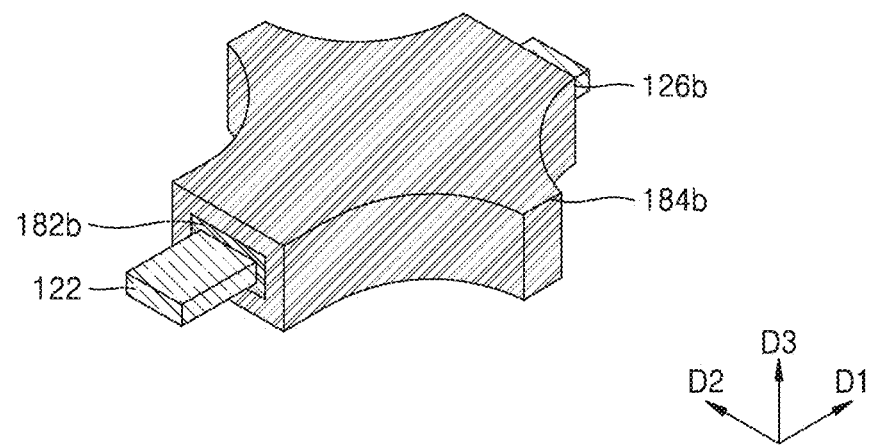
Figure 18C:
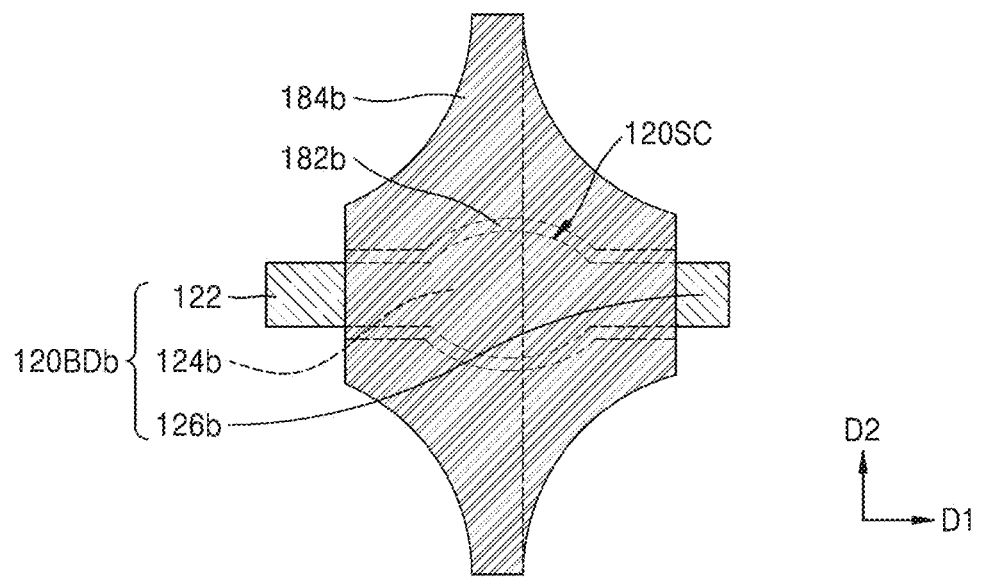

FIGS. 18A to 18C are magnified perspective views and top views of portions of semiconductor memory devices according to some example embodiments of inventive concepts, respectively. Particularly, the cell transistor TR shown in FIG. 16B may be one of cell transistors TRa, TRb, and TRc shown in FIGS. 18A to 18C.

Referring to FIG. 18A, the cell transistor TRa may include a transistor body part 120BD, gate dielectric layers 182, and gate electrode layers 184. Separation insulating patterns 154P may be arranged at both sides of a monocrystalline channel layer 124 in the transistor body part 120BD in the second horizontal direction (the D2 direction), and the gate electrode layers 184 may have a double gate shape covering upper and lower surfaces of the monocrystalline channel layer 124 and covering upper and lower surfaces of the separation insulating patterns 154P at both sides of the monocrystalline channel layer 124. The gate electrode layers 184 may have a T shape in a plan view. For example, the gate electrode layers 184 may have a T shape on a plane in which an upper horizontal line is oriented to the second source-drain region 126, and a vertical line is oriented to the first source-drain region 122. In some example embodiments, the gate electrode layers 184 may have a T shape, in a plan view, concavely round between the upper horizontal line and the vertical line. The gate dielectric layers 182 may be between the monocrystalline channel layer 124 and the gate electrode layers 184 covering the upper and lower surfaces of the monocrystalline channel layer 124.

The transistor body part 120BD may include the first source-drain region 122, the monocrystalline channel layer 124, and the second source-drain region 126. The transistor body part 120BD may have an extension part 120SC having a relatively large width in the second horizontal direction (the D2 direction). The extension part 120SC may include a portion of the monocrystalline channel layer 124 and a portion of the second source-drain region 126.

Referring to FIG. 18B, the cell transistor TRb may include a transistor body part 120BD, a gate dielectric layer 182a, and the gate electrode layer 184a. The gate electrode layer 184a may have a gate all around shape covering the upper and lower surfaces of the monocrystalline channel layer 124 in the transistor body part 120BD and covering both side surfaces of the monocrystalline channel layer 124 in the second horizontal direction (the D2 direction). The gate electrode layer 184a may have a T shape in a plan view. The gate dielectric layer 182a may be between the monocrystalline channel layer 124 and the gate electrode layer 184a covering the upper and lower surfaces of the monocrystalline channel layer 124 and covering both side surfaces of the monocrystalline channel layer 124 in the second horizontal direction (the D2 direction).

The transistor body part 120BD may include the first source-drain region 122, the monocrystalline channel layer 124, and the second source-drain region 126. The transistor body part 120BD may have the extension part 120SC having a relatively large width in the second horizontal direction (the D2 direction). The extension part 120SC may include a portion of the monocrystalline channel layer 124 and a portion of the second source-drain region 126. That is, a portion of the extension part 120SC may be the portion of the monocrystalline channel layer 124, and a remaining portion of the extension part 120SC may be the portion of the second source-drain region 126.

Referring to FIG. 18C, the cell transistor TRc may include the transistor body part 120BDb, a gate dielectric layer 182b, and the gate electrode layer 184b. The gate electrode layer 184b may have a gate all around shape covering the upper and lower surfaces of the monocrystalline channel layer 124b in the transistor body part 120BD and covering both side surfaces of the monocrystalline channel layer 124b in the second horizontal direction (the D2 direction). The gate electrode layer 184b may have a rectangular shape with four concavely depressed corners in a plan view. The gate dielectric layer 182b may be between the monocrystalline channel layer 124b and the gate electrode layer 184b covering the upper and lower surfaces of the monocrystalline channel layer 124b and covering both side surfaces of the monocrystalline channel layer 124b in the second horizontal direction (the D2 direction).

The transistor body part 120BDb may include a first source-drain region 122, the monocrystalline channel layer 124b, and a second source-drain region 126b. The transistor body part 120BDb may have the extension part 120SC having a relatively large width in the second horizontal direction (the D2 direction). The extension part 120SC may be entirely a portion of the monocrystalline channel layer 124b.

Figure 19A:
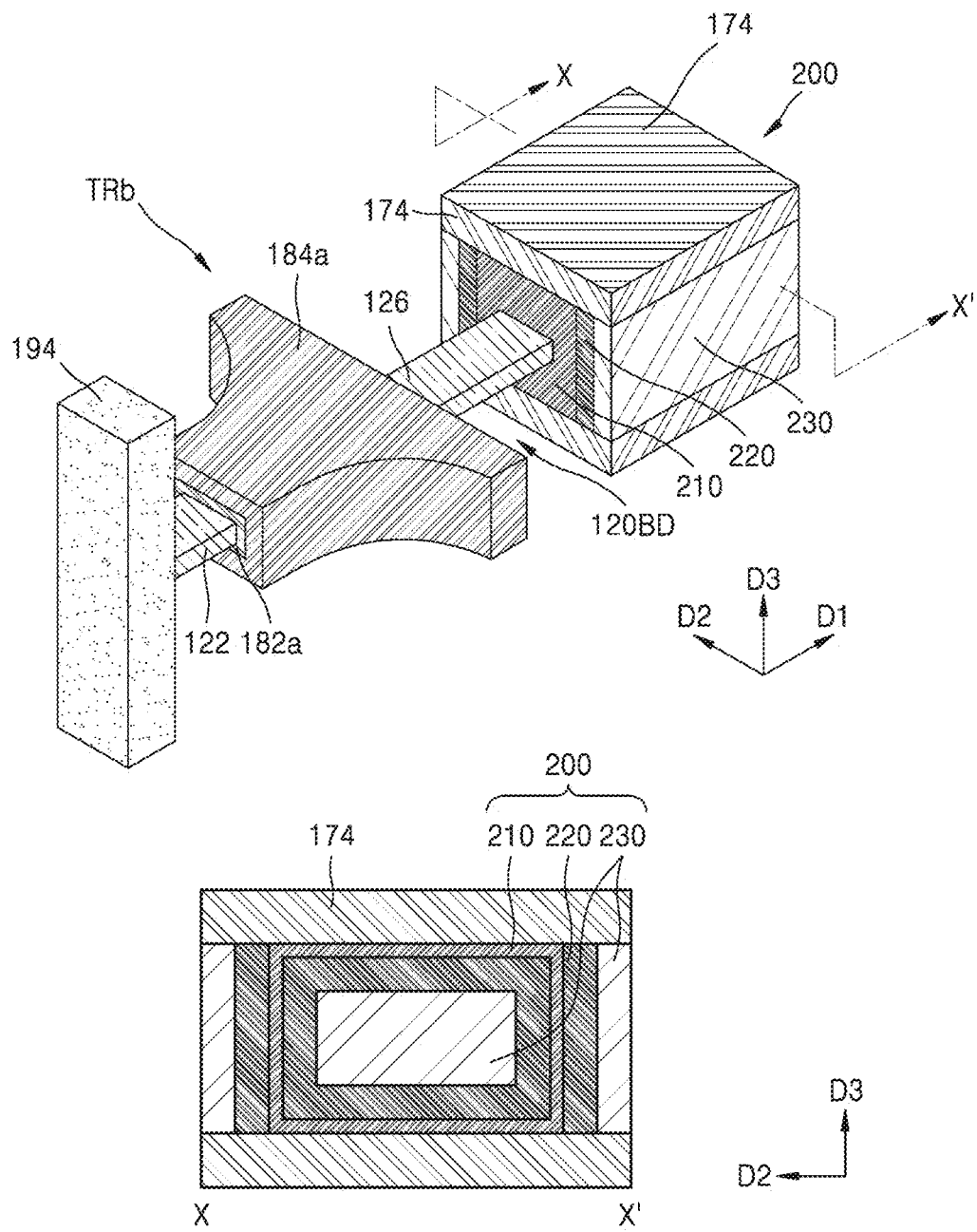
FIGS. 19A and 19B are magnified perspective views and top views of portions of semiconductor memory devices according to some example embodiments of inventive concepts, respectively.
Figure 19B:
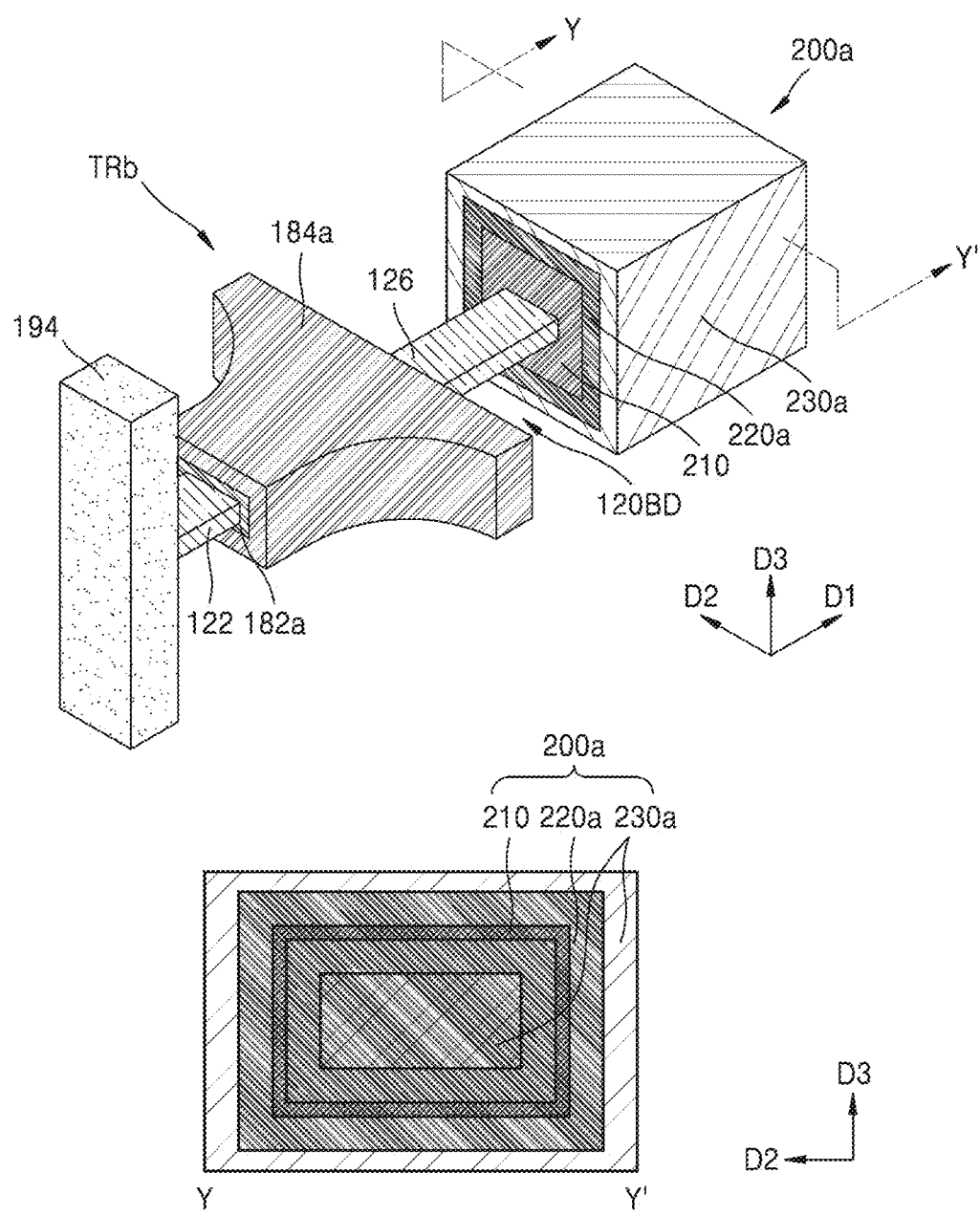

FIGS. 19A and 19B are magnified perspective views and top views of portions of semiconductor memory devices according to some example embodiments of inventive concepts, respectively. FIGS. 19A and 19B show the cell transistor TRb shown in FIG. 18B as an example, but the cell transistor TRa of FIG. 18A or the cell transistor TRc of FIG. 18C may be used instead of the cell transistor TRb, and inventive concepts are not limited thereto.

Referring to FIG. 19A, a memory cell may include the cell transistor TRb and a cell capacitor 200. A cross-sectional view shows the cell capacitor 200 taken along line X-X' in a vertical direction of the first horizontal direction (e.g., the D1 direction) in a perspective view.

The cell transistor TRb may include the transistor body part 120BD, the gate dielectric layer 182a, and the gate electrode layer 184a. A first source-drain region 122 may be connected to a bit line 194, and a second source-drain region 126 may be connected to a lower electrode layer 210.

The cell capacitor 200 may include the lower, or first, electrode layer 210, a capacitor dielectric layer 220, including a first capacitor dielectric layer and a second capacitor dielectric layer, and upper, or second, electrode layers 230. The first capacitor dielectric layer and second capacitor dielectric layer 220 and the upper, or second, electrode layers 230 may cover the entire inner surface, e.g., all of inner side surfaces and an inner bottom surface, and at least a portion of outer side surfaces of the lower, or first, electrode layer 210. The inner bottom surface of the lower, or first, electrode layer 210 may indicate an inner surface of a closed part in a hollow cylindrical shape with one closed side. For example, when the lower, or first, electrode layer 210 has a hollow hexahedral or hexagonal cylindrical shape, the cell capacitor 200 may have a six-sided one cylinder stacked (OCS) shape. For example, the first capacitor dielectric layer and second capacitor dielectric layer 220 may cover four inner side surfaces and the inner bottom surface of the lower, or first, electrode layer 210 and two outer side surfaces thereof opposite to each other in the second horizontal direction (the D2 direction), and the upper, or second, electrode layers 230 may have the first capacitor dielectric layer 220 therebetween and cover the four inner side surfaces and the inner bottom surface of the lower, or first, electrode layer 210 and the two outer side surfaces thereof opposite to each other in the second horizontal direction (the D2 direction). The cell capacitor 200 may have a six-sided OCS shape.

Referring to FIG. 19B, a memory cell may include the cell transistor TRb and a cell capacitor 200a. A cross-sectional view shows the cell capacitor 200a taken along line Y-Y' in a vertical direction of the first horizontal direction (the D1 direction) in a perspective view.

The cell transistor TRb may include the transistor body part 120BD, the gate dielectric layer 182a, and the gate electrode layer 184a. The first source-drain region 122 may be connected to the bit line 194, and the second source-drain region 126 may be connected to the lower electrode layer 210.

The cell capacitor 200a may include the lower electrode layer 210, a capacitor dielectric layer 220a, and upper electrode layers 230a. The capacitor dielectric layer 220a and the upper electrode layers 230a may cover the entire inner surface, e.g., all of inner side surfaces and an inner bottom surface, and all the outer side surfaces of the lower electrode layer 210. For example, when the lower electrode layer 210 has a hollow hexagonal cylindrical shape, the cell capacitor 200a may have an eight-sided OCS shape. For example, the capacitor dielectric layer 220a may cover four inner side surfaces and four outer side surfaces of the lower electrode layer 210, and the upper electrode layers 230a may have the capacitor dielectric layer 220a therebetween and cover the four inner side surfaces and the four outer side surfaces of the lower electrode layer 210.

Figure 20:
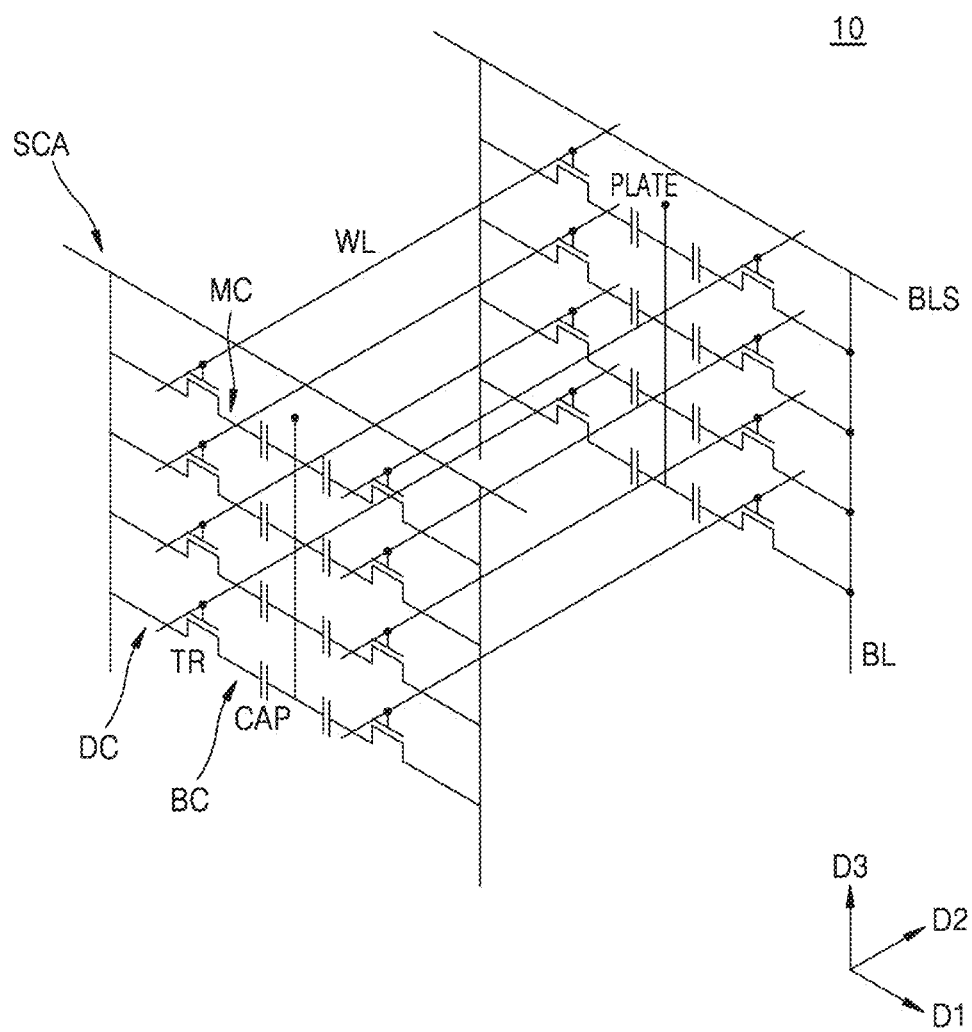
FIG. 20 is an equivalent circuit diagram of a cell array in a semiconductor memory device according to some example embodiments of inventive concepts.

FIG. 20 is an equivalent circuit diagram of a cell array in a semiconductor memory device 10 according to some example embodiments of inventive concepts.

Referring to FIG. 20, the semiconductor memory device 10 may include a plurality of memory cells MC, each including a cell transistor TR (e.g. an access cell transistor) and a cell capacitor CAP connected to each other and arranged in the first horizontal direction (e.g. the D1 direction). The plurality of memory cells MC may form or correspond to a sub-cell array SCA by being arranged on a line and spaced apart from each other in each of the first horizontal direction (the D1 direction) and the vertical direction (the D3 direction). Alternatively or additionally, the semiconductor memory device 10 may include a plurality of sub-cell arrays SCA spaced apart from each other in the second horizontal direction (the D2 direction).

A plurality of rows, e.g. of word lines WL may extend in the second horizontal direction (the D2 direction) and be spaced apart from each other in the first horizontal direction (the D1 direction) and the vertical direction (the D3 direction). A plurality of columns, e.g. bit lines BL may extend in the vertical direction (the D3 direction) and be spaced apart from each other in each of the first horizontal direction (the D1 direction) and the second horizontal direction (the D2 direction).

In some example embodiments, some of the plurality of bit lines BL may be connected to each other by a bit line strapping line BLS extending in the first horizontal direction (the D1 direction). For example, the bit line strapping line BLS may connect, to each other, bit lines BL arranged in the first horizontal direction (the D1 direction) among the plurality of bit lines BL.

A plurality of cell capacitors CAP may be commonly connected to an upper electrode PLATE extending in the second horizontal direction (the D2 direction) and the vertical direction (the D3 direction). Although FIG. 20 shows for convenience of drawing that the upper electrode PLATE extends in the vertical direction (the D3 direction), example embodiments are not limited thereto, and upper electrodes PLATE arranged in the second horizontal direction (the D2 direction) may be formed in one body.

Cell transistors TR and cell capacitors CAP arranged in the first horizontal direction (the D1 direction) may be arranged to be mirror-symmetrical with reference to a plane extending in the second horizontal direction (the D2 direction) and the vertical direction (the D3 direction), on which upper electrodes PLATE are arranged.

A cell transistor TR may be connected to a bit line BL through a digit contact/bit line contact/direct contact DC and connected to a cell capacitor CAP through a cell contact/buried contact BC. The direct contact DC may be or indicate the first source-drain region 122 or an interface between the first source-drain region 122 and the bit line 194, which is shown in FIGS. 16A and 16B. The buried contact BC may indicate the second source-drain region 126 or an interface between the second source-drain region 126 and the lower electrode layer 210, which is shown in FIGS. 16A and 16B.

The semiconductor memory device 10 may be any one of the semiconductor memory device 1 shown in FIGS. 16A and 16B, the semiconductor memory device 1a shown in FIG. 17A, the semiconductor memory device 1b shown in FIG. 17B, and the semiconductor memory device 1c shown in FIG. 17C. The cell transistor TR may be or correspond to any one of the cell transistors TRa, TRb, and TRc shown in FIGS. 18A to 18C. The cell capacitor CAP may be or correspond to any one of the cell capacitors 200 and 200a shown in FIGS. 19A and 19B. The word line WL may be or correspond to the gate electrode layer 184 shown in FIGS. 16A and 16B. The bit line BL may be or correspond to the bit line 194 shown in FIGS. 16A and 16B.

Example embodiments are not limited to the above-described embodiments. Furthermore none of the above embodiments are necessarily mutually exclusive to one another. For example, some embodiments may include features described with reference to one figure, and may also include other features described with reference to another figure.

While inventive concepts has been particularly shown and described with reference to some example embodiments thereof, it will be understood that various changes in form and details may be made therein without departing from the spirit and scope of the following claims.

What is claimed is:

1. A semiconductor memory device comprising:
   a bit line on a substrate, the bit line extending in a vertical direction;
   a transistor body comprising a first source-drain region, a monocrystalline channel layer, and a second source-drain region, the first source-drain region, the monocrystalline channel layer, and the second source-drain region sequentially arranged in a first horizontal direction, the transistor body connected to the bit line;

gate electrode layers extending in a second horizontal direction orthogonal to the first horizontal direction; with a gate dielectric layer between the gate electrode layers and a portion of the transistor body, the gate dielectric layer covering upper surfaces and lower surfaces of the monocrystalline channel layer; and a cell capacitor at a side of the transistor body that is opposite to the bit line in the first horizontal direction, the cell capacitor connected to the second source-drain region, the cell capacitor comprising a first electrode layer, a capacitor dielectric layer, and second electrode layers, the first electrode layer, the dielectric layer, and the second electrode layers extending in the first horizontal direction, the dielectric layer spaced between the first electrode layer and the second electrode layers in the second horizontal direction, the first electrode layer and the second electrode layers configured to generate an electric field extending in the first horizontal direction and the vertical direction.

2. The semiconductor memory device of claim 1, wherein the transistor body has an extension having a planar shape convexly protruding in the second horizontal direction, and a portion of the extension includes a portion of the monocrystalline channel layer.

3. The semiconductor memory device of claim 2, wherein a remaining portion of the extension includes a portion of the second source-drain region.

4. The semiconductor memory device of claim 1, wherein, in the second horizontal direction, the gate electrode layers have a gate all around shape integrally covering the upper surfaces and lower surfaces of the monocrystalline channel layer and side surfaces of the monocrystalline channel layer.

5. The semiconductor memory device of claim 1, wherein the gate electrode layers have a T shape on a plane in which an upper horizontal line is aligned with the second source-drain region, and a vertical line is aligned with the first source-drain region.

6. The semiconductor memory device of claim 1, wherein the gate electrode layers have a rectangular shape in a plan view with four concavely depressed corners.

7. The semiconductor memory device of claim 1, wherein each of the first source-drain region, the monocrystalline channel layer, and the second source-drain region includes a monocrystalline semiconductor material.

8. The semiconductor memory device of claim 1, wherein the monocrystalline channel layer includes a monocrystalline semiconductor material, and
each of the first source-drain region and the second source-drain region includes an impurity-doped polycrystalline semiconductor material.

9. The semiconductor memory device of claim 1, wherein
in the first horizontal direction the first electrode layer has a hollow cylindrical shape with a closed part facing the second source-drain region and an open part facing a direction opposite to the second source-drain region,
the second electrode layer includes a first electrode portion and a second electrode portion, and
the capacitor dielectric layer is between the second electrode layer and the first electrode layer, a first electrode portion of the second electrode layer filling the inside of the cylindrical shape of the first electrode layer.

10. The semiconductor memory device of claim 9, wherein
the capacitor dielectric layer includes a first dielectric portion and a second dielectric portion, the first electrode portion of the second electrode layer and the first dielectric portion of the capacitor dielectric layer cover all of inner side surfaces of the first dielectric layer and an inner bottom surface of the first electrode layer, and the second electrode portion of the second electrode layer and the second dielectric portion of the capacitor dielectric layer cover at least a portion of outer side surfaces of the first electrode layer.

11. A semiconductor memory device comprising:
a plurality of transistor bodies apart from each other on a substrate in a vertical direction, the plurality of transistor bodies extending in parallel to each other in a first horizontal direction, the plurality of transistor bodies comprising a first source-drain region, a monocrystalline channel layer, and a second source-drain region that are sequentially arranged in the first horizontal direction, the plurality of transistor bodies having an extension of a planar shape convexly protruding in a second horizontal direction orthogonal to the first horizontal direction;

a plurality of bit lines apart from each other on the substrate in the second horizontal direction, the plurality of bit lines extending in parallel to each other in the vertical direction, the plurality of bit lines connected to the first source-drain regions of the plurality of transistor bodies;

a plurality of gate electrode layers apart from each other in the vertical direction, extending in parallel to each other in the second horizontal direction, a gate dielectric layer between the plurality of gate electrode layers and the monocrystalline channel layers, the gate dielectric layer covering at least upper and lower surfaces of the monocrystalline channel layers of the plurality of transistor bodies; and a plurality of cell capacitors connected to the second source-drain regions of the plurality of transistor bodies and comprising a first electrode layer, a capacitor dielectric layer, and a second electrode layer, the first electrode layer, the dielectric layer, and the second electrode layers extending in the first horizontal direction, the dielectric layer spaced between the first electrode layer and the second electrode layers in the second horizontal direction, the first electrode layer and the second electrode layers configured to generate an electric field extending in the first horizontal direction and the vertical direction.

12. The semiconductor memory device of claim 11, wherein the extension in each of the plurality of transistor bodies includes a portion of the monocrystalline channel layer and a remaining portion of the second source-drain region.

13. The semiconductor memory device of claim 12, wherein each of the plurality of gate electrode layers has a T shape, in a plan view, concavely round between an upper horizontal line and a vertical line.

14. The semiconductor memory device of claim 11, wherein the entire extension in each of the plurality of transistor bodies includes a portion of the monocrystalline channel layer.

15. The semiconductor memory device of claim 11, wherein, among the plurality of transistor bodies, a length in the first horizontal direction of a first transistor body close to the substrate in the vertical direction is substantially the same as a length in the first horizontal direction of a second transistor body far from the substrate in the vertical direction.

16. The semiconductor memory device of claim 11, wherein, among the first electrode layers in the plurality of cell capacitors, a length in the first horizontal direction of a first lower electrode layer far from the substrate in the vertical direction is less than a length in the first horizontal direction of a second lower electrode layer close to the substrate in the vertical direction.

17. The semiconductor memory device of claim 11, wherein each of the first electrode layers in the plurality of cell capacitors has a 90-degree rotated U shaped vertical cross-section in which an open part faces a direction that is opposite to the second source-drain region.

18. A semiconductor memory device comprising:
a plurality of transistor bodies on a substrate apart from each other in a vertical direction, extending parallel to each other in a first horizontal direction, comprising a first source-drain region, a monocrystalline channel layer including monocrystalline silicon (Si), and a second source-drain region, the first source-drain region, the monocrystalline channel layer, and the second source-drain region sequentially arranged in the first horizontal direction, the plurality of transistor bodies having an extension part which has a planar shape convexly protruding in a second horizontal direction that is orthogonal to the first horizontal direction, a portion of the extension part includes a portion of the monocrystalline channel layer;
a plurality of bit lines apart from each other on the substrate in the second horizontal direction, extending in parallel to each other in the vertical direction, and connected to the first source-drain regions of the plurality of transistor bodies;
a plurality of gate electrode layers apart from each other in the vertical direction, extending in parallel to each other in the second horizontal direction, a gate dielectric layer between the plurality of gate electrode layers and the monocrystalline channel layers, the gate dielectric layer respectively covering at least upper and lower surfaces of the monocrystalline channel layers; and
a plurality of cell capacitors connected to the second source-drain regions of the plurality of transistor bodies, and comprising a plurality of lower electrode layers having a hollow cylindrical shape in the first horizontal direction with a closed part facing the second source-drain region and an open part facing a direction that is opposite to the second source-drain region, upper electrode layers covering the plurality of lower electrode layers, and capacitor dielectric layers between the plurality of lower electrode layers and the upper electrode layers.

19. The semiconductor memory device of claim 18, wherein the upper electrode layer covers all of inner side surfaces of the lower electrode layer, an inner bottom surface of the lower electrode layer, and at least a portion of outer side surfaces of the lower electrode layer, and fills the inside of the hollow cylindrical shape of the lower electrode layer.

20. The semiconductor memory device of claim 18, wherein each of the first source-drain region and the second source-drain region includes impurity-doped polysilicon,
the first source-drain region defines a first seam extending toward the inside of the first source-drain region from the bit line, and the monocrystalline channel layer defines a second seam extending toward the inside of the second source-drain region from the lower electrode layer.

* * * * *